(12) United States Patent
Lin et al.

(10) Patent No.: US 12,376,374 B2
(45) Date of Patent: Jul. 29, 2025

(54) SEMICONDUCTOR DEVICES WITH EDGE DIELECTRIC FIN STRUCTURES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chen-Ping Chen, Toucheng Township (TW); Chieh-Ning Feng, Taichung (TW); Hsiao Wen Lee, Hsinchu (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 288 days.

(21) Appl. No.: 17/460,075

(22) Filed: Aug. 27, 2021

(65) Prior Publication Data
US 2023/0063087 A1    Mar. 2, 2023

(51) Int. Cl.
*H10D 84/85* (2025.01)
*H01L 21/02* (2006.01)
(Continued)

(52) U.S. Cl.
CPC ......... *H10D 84/85* (2025.01); *H01L 21/0259* (2013.01); *H10D 30/031* (2025.01);
(Continued)

(58) Field of Classification Search
CPC ............... H01L 27/092; H01L 21/0259; H01L 21/823807; H01L 21/823814; H01L 21/823878; H01L 29/0665; H01L 29/42392; H01L 29/66545; H01L 29/66742; H01L 29/78618; H01L 29/78696
See application file for complete search history.

(56) References Cited

U.S. PATENT DOCUMENTS

2015/0069328 A1\* 3/2015 Leobandung .......... B82Y 10/00
                                                        438/151
2017/0278842 A1\* 9/2017 Song ............... H01L 21/823431
(Continued)

*Primary Examiner* — Matthew E. Gordon
*Assistant Examiner* — Sean Ayers Winters
(74) *Attorney, Agent, or Firm* — FOLEY & LARDNER LLP

(57) ABSTRACT

A method includes forming a first, second, third, fourth, fifth, and sixth fin structure. The second fin structure is separated from each of the first and third fin structures by a first distance, the fifth fin structure is separated from each of the fourth and sixth fin structures by the first distance, and the third fin structure is separated from the fourth fin structure by a second distance greater than the first distance. The method includes forming a first dummy gate structure overlaying the first through third fin structures, and a second dummy gate structure overlaying the fourth through sixth fin structures; forming a number of source/drain structures that are coupled to the first, second, third, fourth, fifth, and sixth fin structures, respectively; and replacing the third fin structure with a first dielectric structure, and replacing the fourth fin structure with a second dielectric structure.

20 Claims, 49 Drawing Sheets

(51) Int. Cl.
   *H10D 30/01*   (2025.01)
   *H10D 30/67*   (2025.01)
   *H10D 62/10*   (2025.01)
   *H10D 64/01*   (2025.01)
   *H10D 84/01*   (2025.01)
   *H10D 84/03*   (2025.01)

(52) U.S. Cl.
   CPC ..... *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/0188* (2025.01); *H10D 84/038* (2025.01)

(56) References Cited

U.S. PATENT DOCUMENTS

| | | | |
|---|---|---|---|
| 2020/0091152 A1* | 3/2020 | Noh | H01L 29/6681 |
| 2020/0266218 A1* | 8/2020 | Lilak | H01L 21/823437 |
| 2021/0036121 A1* | 2/2021 | Lim | H01L 29/78696 |
| 2021/0057411 A1* | 2/2021 | Kim | H01L 29/78618 |

* cited by examiner

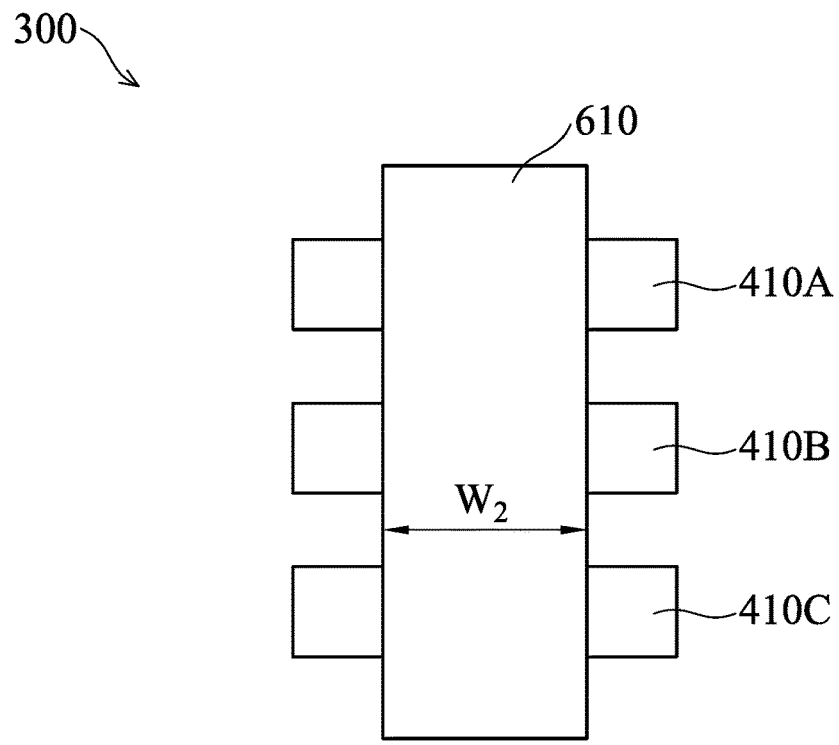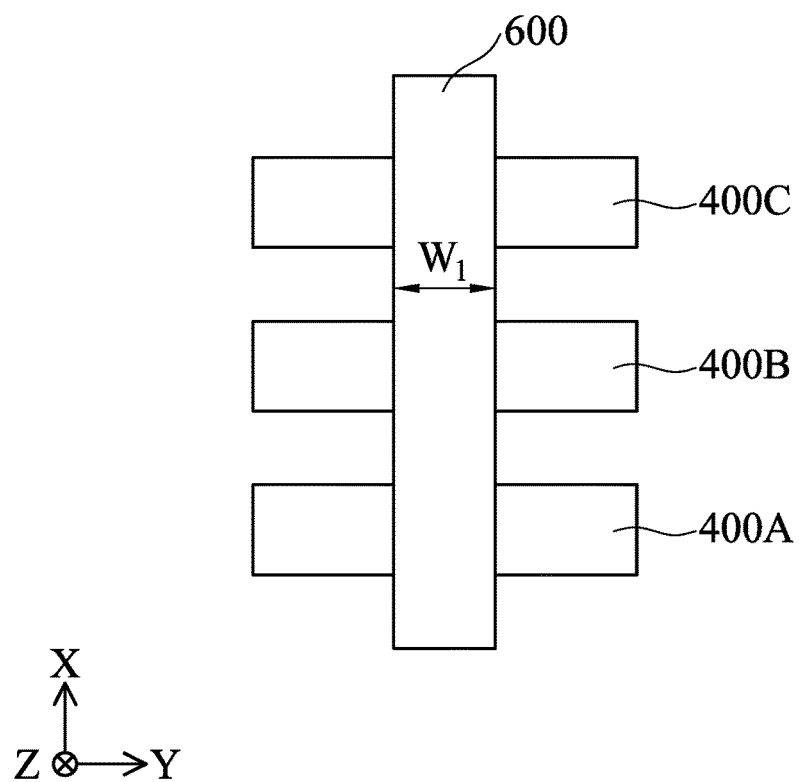
FIG. 6C

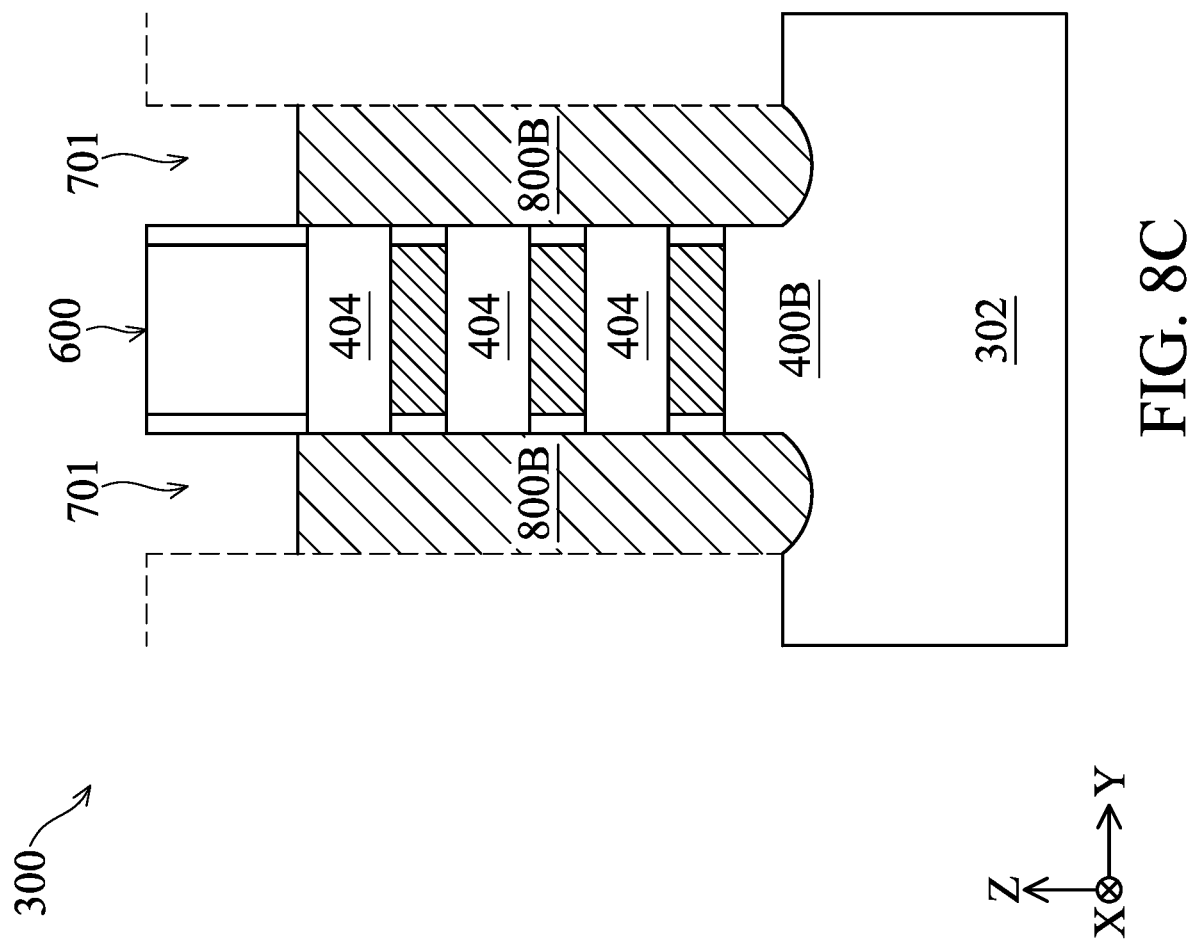

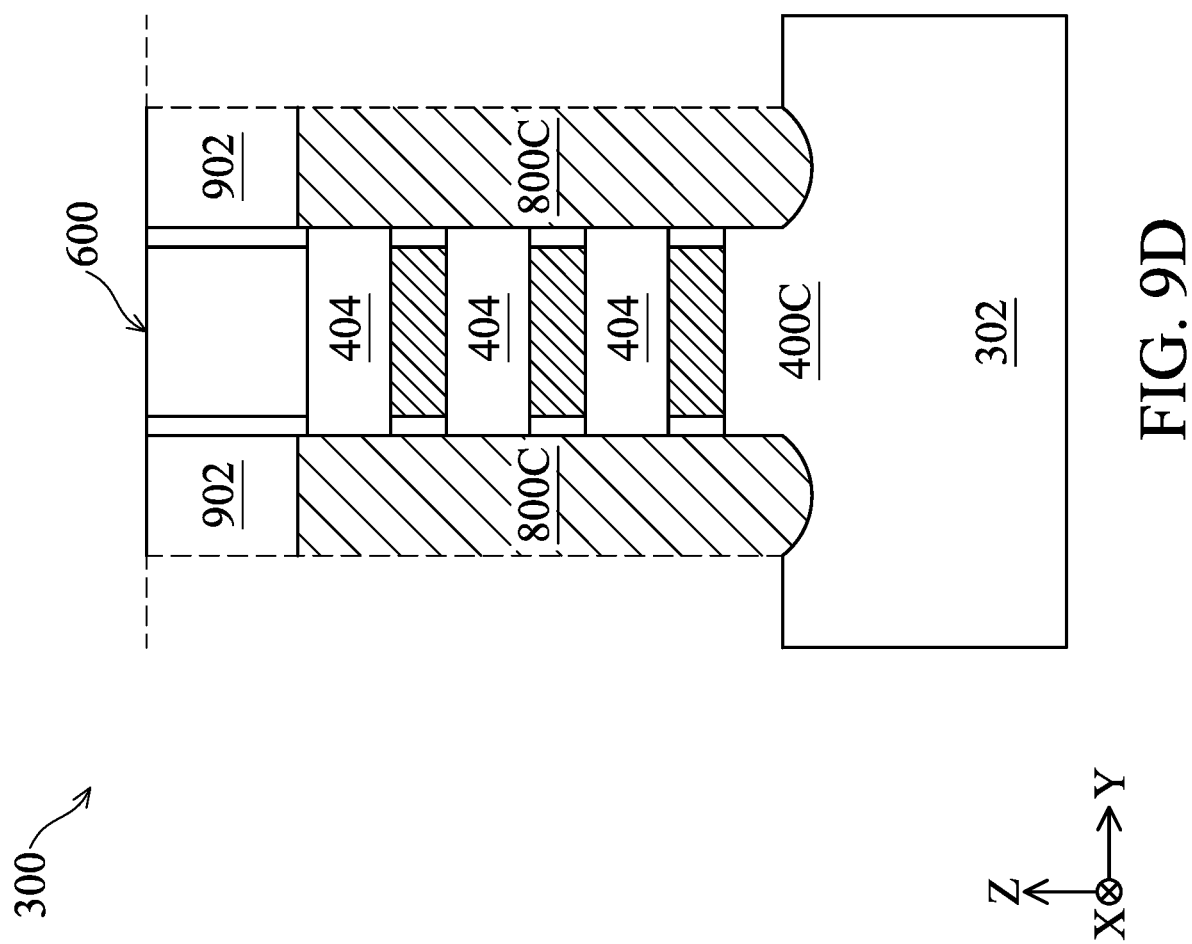

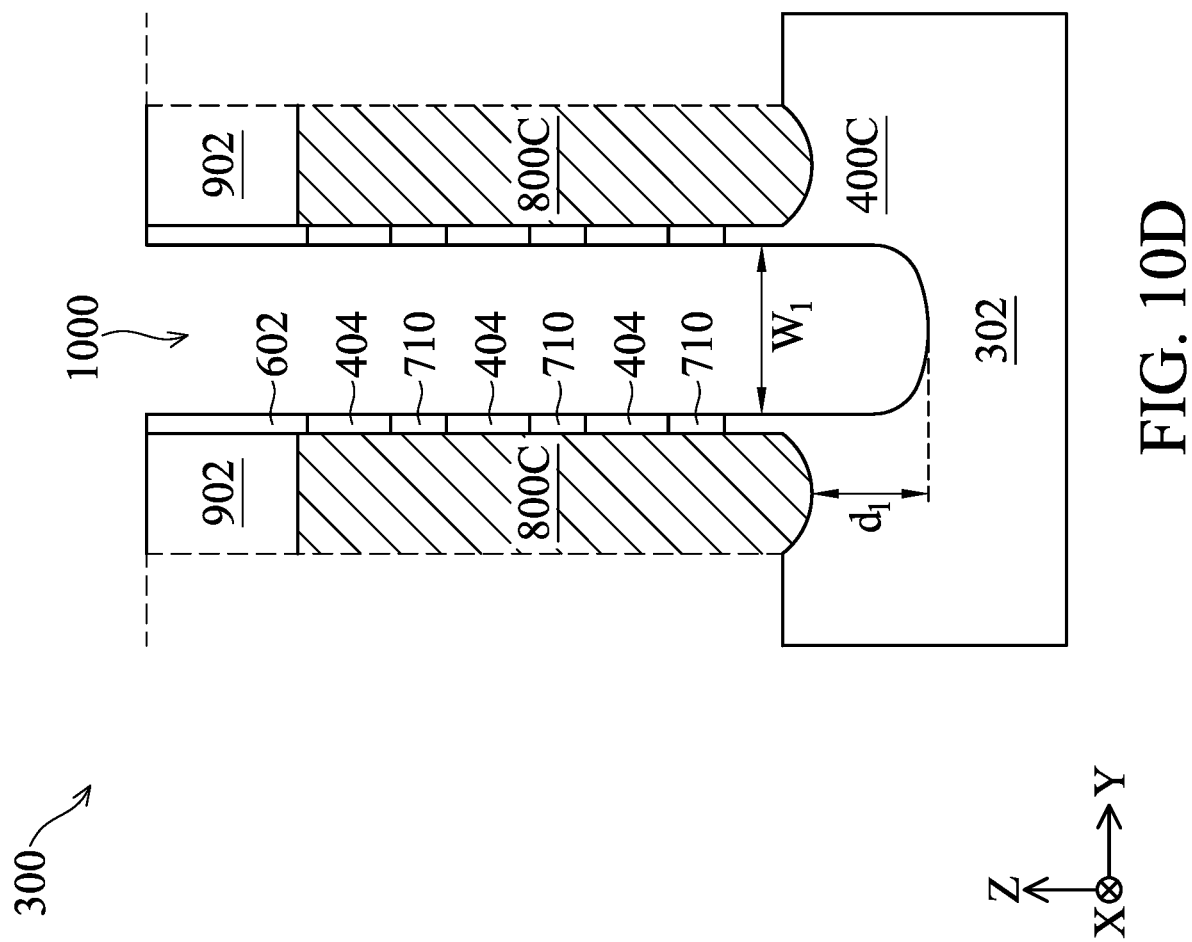

SEMICONDUCTOR DEVICES WITH EDGE DIELECTRIC FIN STRUCTURES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5A, 5B, 5C, 5D, 6A, 6B, 6C, 6D, 6E, 6F, 7A, 7B, 7C, 7D, 8A, 8B, 8C, 8D, 9A, 9B, 9C, 9D, 10A, 10B, 10C, 10D, 10E, 10F, 10G, 11A, 11B, 11C, 11D, 11E, 11F, 11G, 12, 13A, 13B, 13C, 13D, 14A, 14B, 14C, and 14D illustrate cross-sectional or top views of an example GAA FET device (or a portion of the example GAA FET device) during various fabrication stages, made by the method of FIG. 2, in accordance with some embodiments.

DETAILED DESCRIPTION

Figure 1:
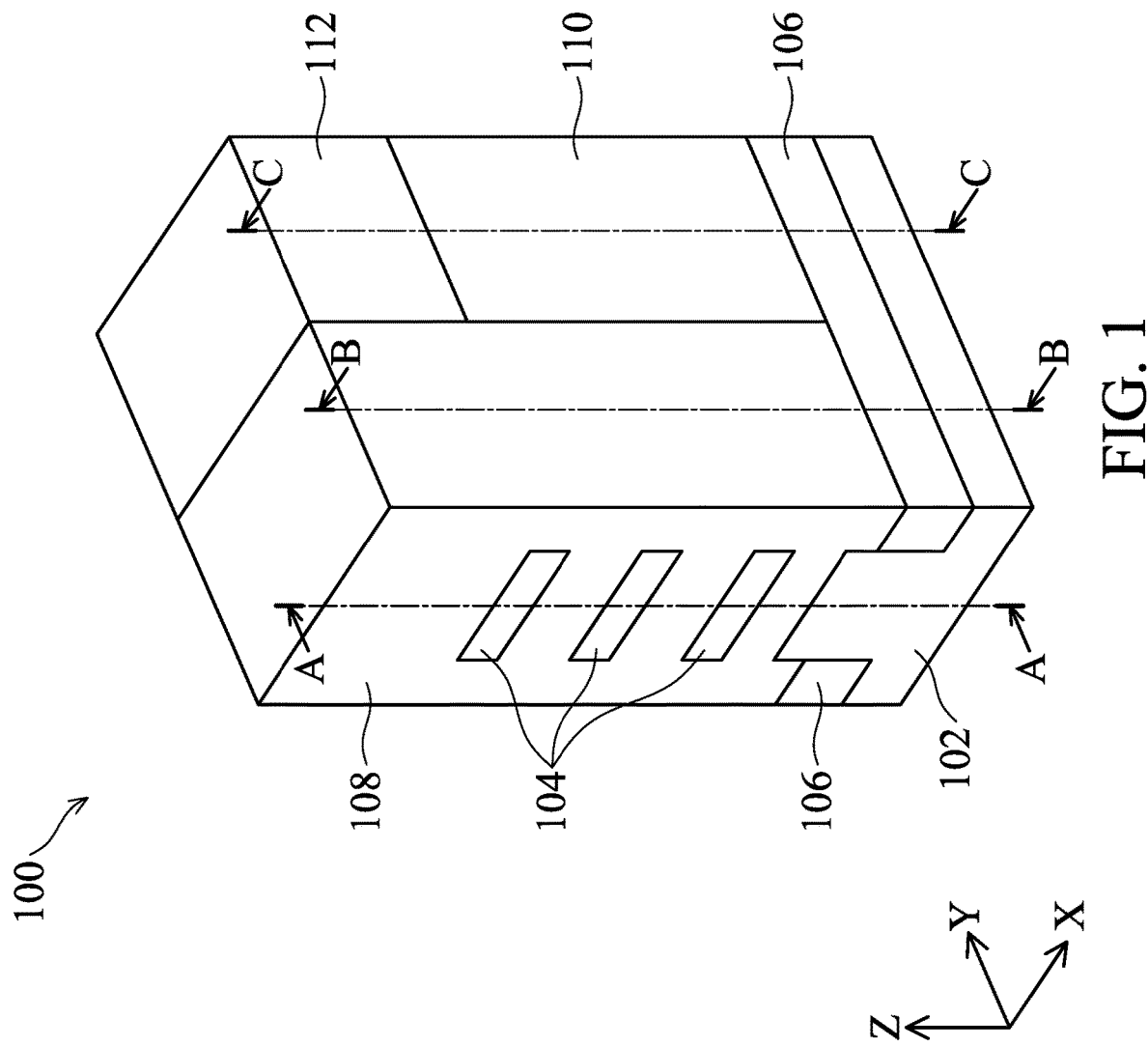
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, to make an integrated circuit on a substrate, a number of fins can be formed over the substrate. The fins may have multiple groups, each of which may provide a respective function in the integrated circuit. In certain cases, the fins in each group are spaced from each other with a first distance and two adjacent groups are spaced from each other with a second distance, wherein the second distance is greater than the first distance. As such, the fins (and corresponding device features) on respective edges of the adjacent groups may experience imbalanced processing conditions (e.g., different etching conditions when compared to the fins away from the edge), which is sometimes referred to as "iso-dense loading effect." This can cause various issues such as, for example, a poorly formed profile of the metal gate structure over the fins on the edges.

The present disclosure provides various embodiments of a semiconductor device and a method for forming the same, which can significantly limit the above-identified issues. For example, the semiconductor device, as disclosed herein, includes one or more inactive fins disposed on the edges of two adjacent fin groups, each of which includes a number of active fins. Such adjacent fin groups may be spaced apart with each other by a distance (hereinafter "inter-fin-group distance") greater than a distance separating the fins in each group (hereinafter "intra-fin-group distance"). In some embodiments, the active fin may be adopted as an active (e.g., electrically functional) fin or channel in a completed GAA FET device; and the inactive fin may not be adopted as an active (e.g., electrically functional) fin or channel in a completed GAA FET device. Further, in some embodiments, each of the fins (including the active and inactive fins) may include a number of semiconductor layers (e.g., nanosheets, nanowires, or otherwise nanostructures) vertically spaced apart from each other, in which each active fin is coupled with source/drain structures (e.g., epitaxially grown semiconductor structures) and each inactive fin is coupled with dielectric trenches.

By inserting the inactive fins on the edges of adjacent fin groups, the active fins in each of the fin groups can suffer significantly less iso-dense loading effect. This is because the inactive fins, which will not be functional, may protect the active fins from experiencing the effect. Further, the fins on the edges can be "inactivated" by replacing their respective channels with dielectric trenches. As such, various advantages can be provided especially in advanced processing nodes. For example, the dielectric trench may not be formed until a dummy gate structure, which will be replaced with a metal gate structure, is defined and formed. Even forming an inactive fin, the existing technologies typically forms such an inactive fin in a relatively early processing stage (e.g., prior to STI recessing, prior to forming a dummy gate structure). By "delaying" a timing to inactive the fins, a profile of the dummy gate structure, which is accordingly inherited by the metal gate structure, can be well defined and reserved. Thus, overall performance of the disclosed semiconductor device can be significantly enhanced.

FIG. 1 illustrates a perspective view of an example GAA FET device 100, in accordance with various embodiments. The GAA FET device 100 includes a substrate 102 and a number of semiconductor layers (e.g., nanosheets, nanowires, or otherwise nanostructures) 104 above the substrate 102. The semiconductor layers 104 are vertically separated from one another. Isolation regions 106 are formed on opposing sides of a protruded portion of the substrate 102, with the semiconductor layers 104 disposed above the protruded portion. A gate structure 108 wraps around each of the semiconductor layers 104 (e.g., a full perimeter of each of the semiconductor layers 104). Source/drain structures are disposed on opposing sides of the gate structure 108, e.g., source/drain structure 110 shown in FIG. 1. An interlayer dielectric (ILD) 112 is disposed over the source/drain structure 110.

FIG. 1 depicts a simplified GAA FET device, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A extends along a longitudinal axis of the semiconductor layers 104 and in a direction of a current flow between the source/drain structures (e.g., in the Y direction); cross-section B-B, which is perpendicular to the cross-section A-A, extends along a longitudinal axis of the gate structure 108 (e.g., in the X direction); and cross-section C-C, which is also perpendicular to the cross-section A-A, extends in parallel with a longitudinal axis of the gate structure 108 (e.g., in the X direction) and across the source/drain structure 110. Subsequent figures sometimes refer to these reference cross-sections for clarity.

Figure 2:
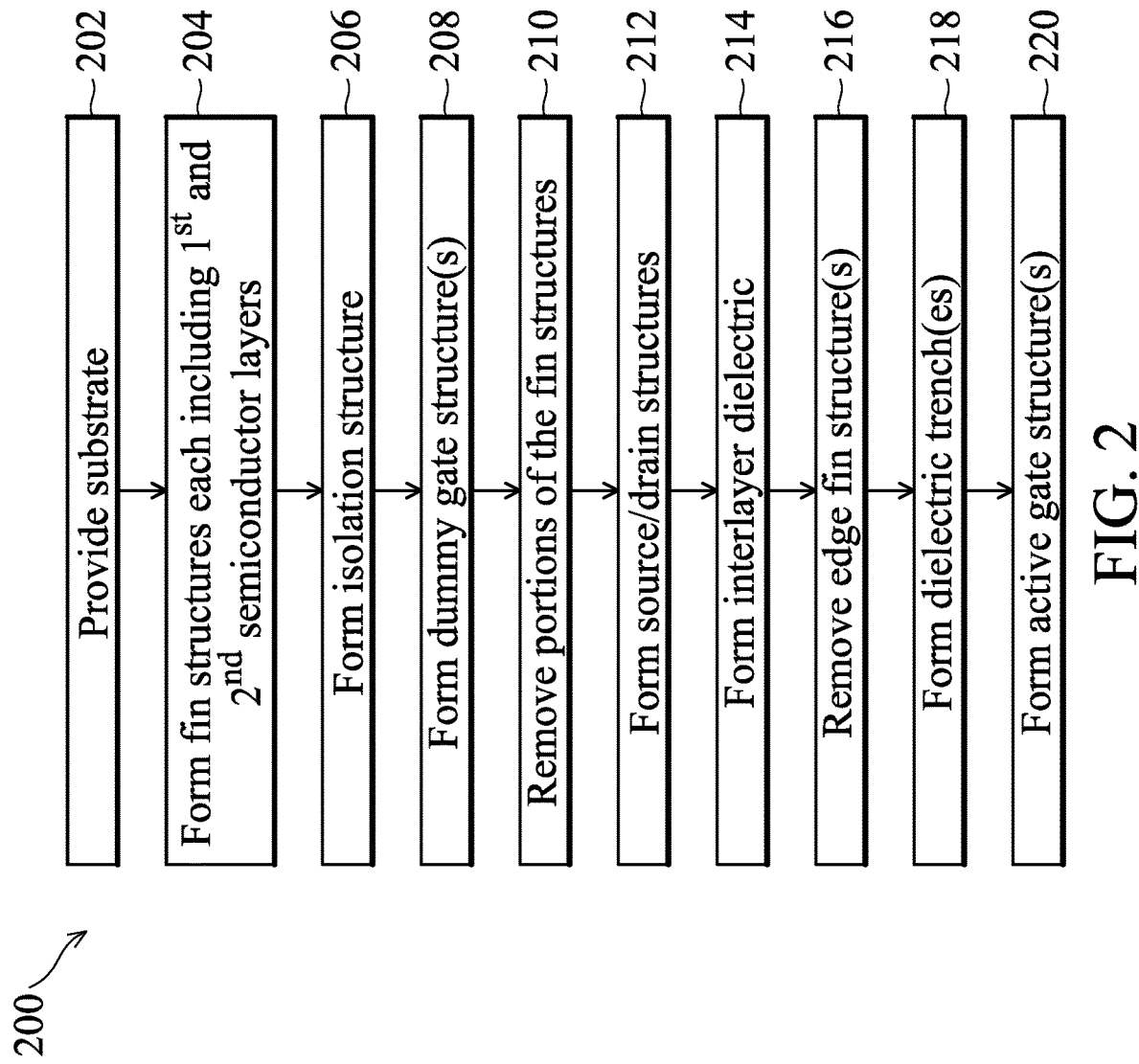
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of an example GAA FET device at various fabrication stages as shown in FIGS. 3, 4, 5A, 5B, 5C, 5D, 6A, 6B, 6C, 6D, 6E, 6F, 7A, 7B, 7C, 7D, 8A, 8B, 8C, 8D, 9A, 9B, 9C, 9D, 10A, 10B, 10C, 10D, 10E, 10F, 10G, 11A, 11B, 11C, 11D, 11E, 11F, 11G, 12, 13A, 13B, 13C, 13D, 14A, 14B, 14C, and 14D, respectively, which will be discussed in further detail below.

In brief overview, the method 200 starts with operation 202 of providing a substrate. The method 200 continues to operation 204 of forming a number of fin structures over the substrate. Each fin structure includes a number of first semiconductor layers and a number of second semiconductor layers. The method 200 continues to operation 206 of forming an isolation structure. The method 200 continues to operation 208 of forming one or more dummy gate structures. The method 200 continues to operation 210 of removing respective portions of the each of the fin structures. The method 200 continues to operation 212 of forming source/drain structures. The method 200 continues to operation 214 of forming an interlayer dielectric. The method 200 continues to operation 216 of removing edge fin structures. The method 200 continues to operation 218 of forming one or more dielectric trenches. The method 200 continues to operation 220 of forming one or more active gate structures by removing the one or more dummy gate structures and the first semiconductor layers.

As mentioned above, FIGS. 3-14D each illustrate, in a cross-sectional or top view, a portion of a GAA FET device 300 at various fabrication stages of the method 200 of FIG. 2. The GAA FET device 300 is similar to the GAA FET device 100 shown in FIG. 1, but with multiple gate structures. Although FIGS. 3-14D illustrate the GAA FET device 300, it is understood the GAA FET device 300 may include a number of other devices such as inductors, fuses, capacitors, coils, etc., which are not shown in FIGS. 3-14D, for purposes of clarity of illustration.

Figure 3:
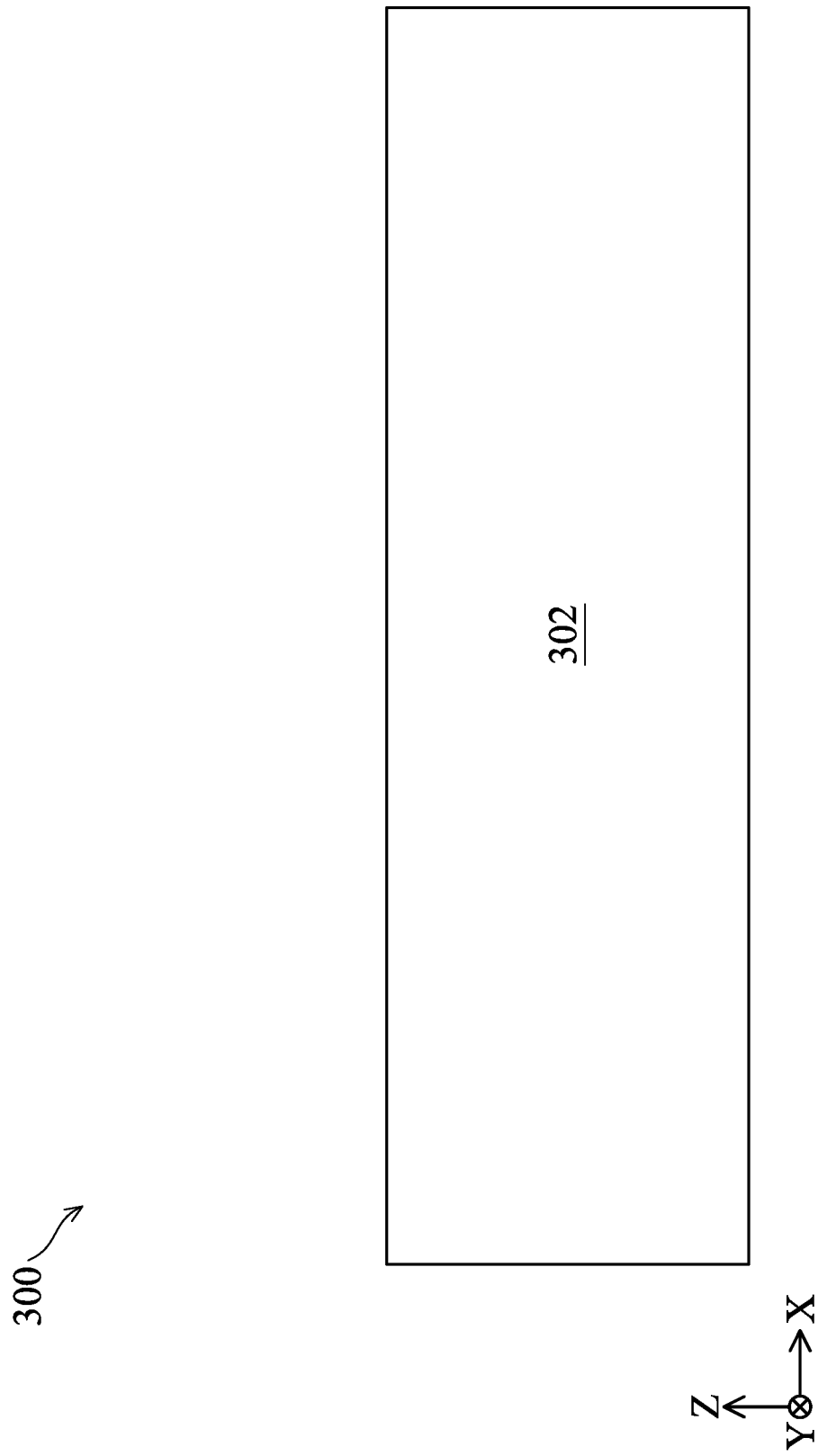

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
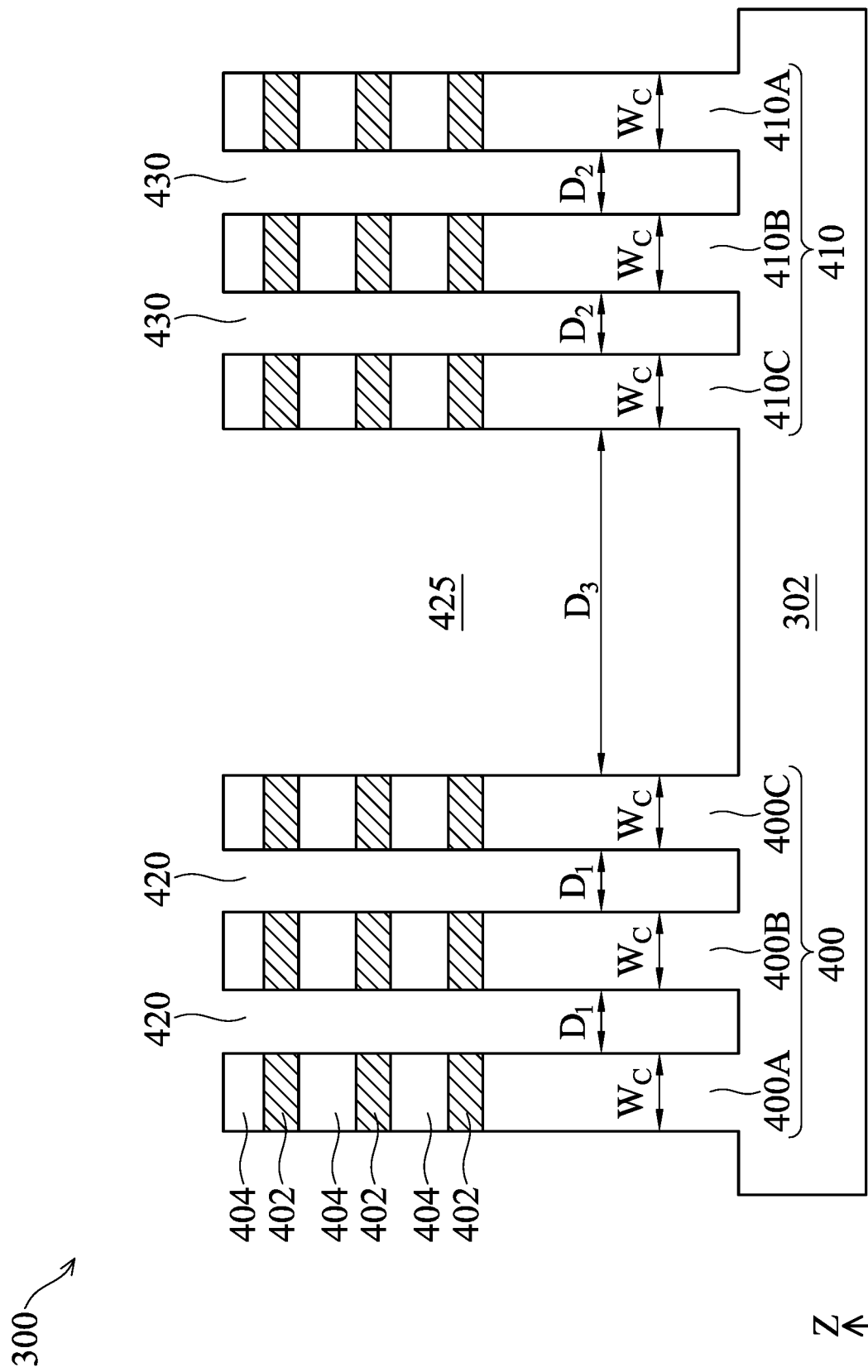

Corresponding to operation 204 of FIG. 2, FIG. 4 is a cross-sectional view of the GAA FET device 300 including a number of fin structures 400A, 400B, 400C, 410A, 410B, and 410C, at one of the various stages of fabrication. The cross-sectional views of FIG. 4 is cut in a direction parallel to the lengthwise direction of an active/dummy gate structure of the GAA FET device 300 (e.g., cross-section B-B indicated in FIG. 1).

As shown, the fin structures 400A-C may be formed as a first fin group 400 in a first area of the substrate 302; and the fin structures 410A-C may be formed as a second fin group 410 in a second area of the substrate 302. Although three fin structures are included in each fin group, it should be understood that each fin group can include any number of fin structures, while remaining within the scope of the present disclosure. Each of the fin structures 400A-C (in the first fin group 400) may be laterally spaced from one another (e.g., in the X direction) by a first (intra-fin-group) distance, $D_1$; and each of the fin structures 410A-C (in the second fin group 410) may be laterally spaced from one another (e.g., in the X direction) by a second (intra-fin-group) distance, $D_2$. Further, the first and second fin groups 400 and 410 are laterally spaced by a third (inter-fin-group) distance, $D_3$, different from $D_1$ and $D_2$.

For example, the fin structures 400B and 400C in the same first fin group 400 are spaced from each other by $D_1$ (similarly, the fin structures 410B and 410C in the same second fin group 410 are spaced from each other by $D_2$), and the fin structure 400C on an "edge" of the first fin group and the fin structure 410C on an "edge" of the second fin group are spaced from each other by $D_3$. In some embodiments, the fin structures 400C and 410C may sometimes be referred to as edge fin structures. The term "edge fin structure," as used herein, may refer to a fin structure that is disposed as a last one in a first fin group, and next to a second fin group. In other words, the edge fin structure is disposed on one of the edges of the first and second fin groups. Accordingly, a fin structure that is not disposed on the edge of a fin group (e.g., with one or more edge fin structures disposed next to it) may sometimes be referred to as a "non-edge fin structure." In various embodiments, $D_3$ is greater than any of $D_1$ or $D_2$. As a non-limiting example, $D_3$ can range from about 10 nanometers (nm) to about 3000 nm, and $D_1$ and $D_2$ can each range from about 5 nm to about 300 nm.

Each of the fin structures 400A-C and 410A-C includes a number of first semiconductor layers and a number of second semiconductor layers alternately disposed on top of one another. Using the fin structure 400A (shown in FIG. 4) as a representative example, the fin structure 400A includes first semiconductor layers 402 and second semiconductor layers 404. The first semiconductor layers 402 and the second semiconductor layers 404 are alternatingly disposed on top of one another (e.g., along the Z direction). For example, one of the second semiconductor layers 404 is disposed over one of the first semiconductor layers 402 then another one of the first semiconductor layers 402 is disposed over the second semiconductor layer 404, so on and so forth.

Each of the fin structures 400A-C and 410A-C may include any number of alternately disposed first and second semiconductor layers 402 and 404. For example in FIG. 4, the fin structure 400A includes 3 first semiconductor layers 402, with 3 second semiconductor layers 404 alternatingly disposed therebetween and with one of the second semiconductor layers 404 being the topmost semiconductor layer. It should be understood that the fin structure of the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 402 and 404 may have respective different thicknesses. Further, the first semiconductor layers 402 may have different thicknesses from one layer to another layer. The second semiconductor layers 404 may have different thicknesses from one layer to another layer. The thickness of each of the semiconductor layers 402 and 404 may range from few nanometers to few tens of nanometers. The bottommost layer of the fin structure may be thicker than other semiconductor layers 402 and 404. In an embodiment, each of the first semiconductor layers 410 has a thickness ranging from about 5 nanometers (nm) to about 20 nm.

The two semiconductor layers 402 and 404 have different compositions. In various embodiments, the two semiconductor layers 402 and 404 have compositions that provide for different oxidation rates and/or different etch selectivity between the layers. In an embodiment, the first semiconductor layers 402 include silicon germanium ($Si_{1-x}Ge_x$), and the second semiconductor layers 404 include silicon (Si). In an embodiment, each of the second semiconductor layers 404 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 404 (e.g., of silicon).

In various embodiments, the semiconductor layers 404 may be intentionally doped. For example, when the GAA FET device 300 is configured in n-type (and operates in an enhancement mode), each of the semiconductor layers 404 may be silicon that is doped with a p-type dopant such as boron (B), aluminum (Al), indium (In), and gallium (Ga); and when the GAA FET device 300 is configured in p-type (and operates in an enhancement mode), each of the semiconductor layers 404 may be silicon that is doped with an n-type dopant such as phosphorus (P), arsenic (As), antimony (Sb). In another example, when the GAA FET device 300 is configured in n-type (and operates in a depletion mode), each of the semiconductor layers 404 may be silicon that is doped with an n-type dopant instead; and when the GAA FET device 300 is configured in p-type (and operates in a depletion mode), each of the semiconductor layers 404 may be silicon that is doped with a p-type dopant instead. In some embodiments, each of the semiconductor layers 402 is $Si_{1-x}Ge_x$ that includes less than 50% (x<0.5) Ge in molar ratio. For example, Ge may comprise about 15% to 35% of the semiconductor layers 402 of $Si_{1-x}Ge_x$ in molar ratio. Furthermore, the first semiconductor layers 402 may include different compositions among them, and the second semiconductor layers 404 may include different compositions among them.

Either of the semiconductor layers 402 and 404 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 402 and 404 may be chosen based on providing differing oxidation rates and/or etch selectivity.

The semiconductor layers 402 and 404 can be epitaxially grown from the semiconductor substrate 302 as blanket layers, respectively. For example, a number of blanket semiconductor layers 402 and a number of blanket semiconductor layers 404 may be grown on the substrate 302 by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the blanket semiconductor layers 402 and 404 having the same crystal orientation with the semiconductor substrate 302. Upon growing the blanket semiconductor layers 402 and 404 on the semiconductor substrate 302 (as a stack), the stack may be patterned to form the fin structures (e.g., 400A-C, 410A-C).

The fin structures are formed by patterning the blanket semiconductor layers 402-404 and the semiconductor substrate 302 using, for example, photolithography and etching techniques. For example, a mask layer (which can include multiple layers such as, for example, a pad oxide layer and an overlying pad nitride layer) is formed over the topmost semiconductor layer. The pad oxide layer may be a thin film comprising silicon oxide formed, for example, using a thermal oxidation process. The pad oxide layer may act as an adhesion layer between the topmost semiconductor layer and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the blanket semiconductor layers 402-404 and the substrate 302 to form trenches (or openings) 420, 425, and 430, thereby defining the fin structures 400A-C and 410A-C between adjacent trenches. For example, the trench 420 may be formed to define adjacent fin structures 400A and 400B, and/or 400B and 400C; the trench 425 may be formed to define adjacent fin structures 400C and 410C; and the trench 430 may be formed to define adjacent fin structures 410A and 410B, and/or 410B and 410C. Accordingly, respective widths (along the X direction) of the trenches 420, 425, and 430 can be characterized with the distances, $D_1$, $D_3$, and $D_2$, respectively. Each of the fin structures 400A-C and 410A-C can have a width, $W_C$, extending along the X direction that is in the range of about 3 nm to about 100 nm. In some embodiments, the fin structures 400A-C and 410A-C are formed by etching the blanket semiconductor layers 402-404 and substrate 302 using, for example, reactive ion etch (RIE), neutral beam etch (NBE), the like, or combinations thereof. The etching may be anisotropic. In some embodiments, the trenches 420-430 may be strips (when viewed from the top) parallel to each other, and closely spaced with respect to each other. In some embodiments, the trenches 420-430 may be continuous and surround corresponding fin structure(s).

Figure 5A:
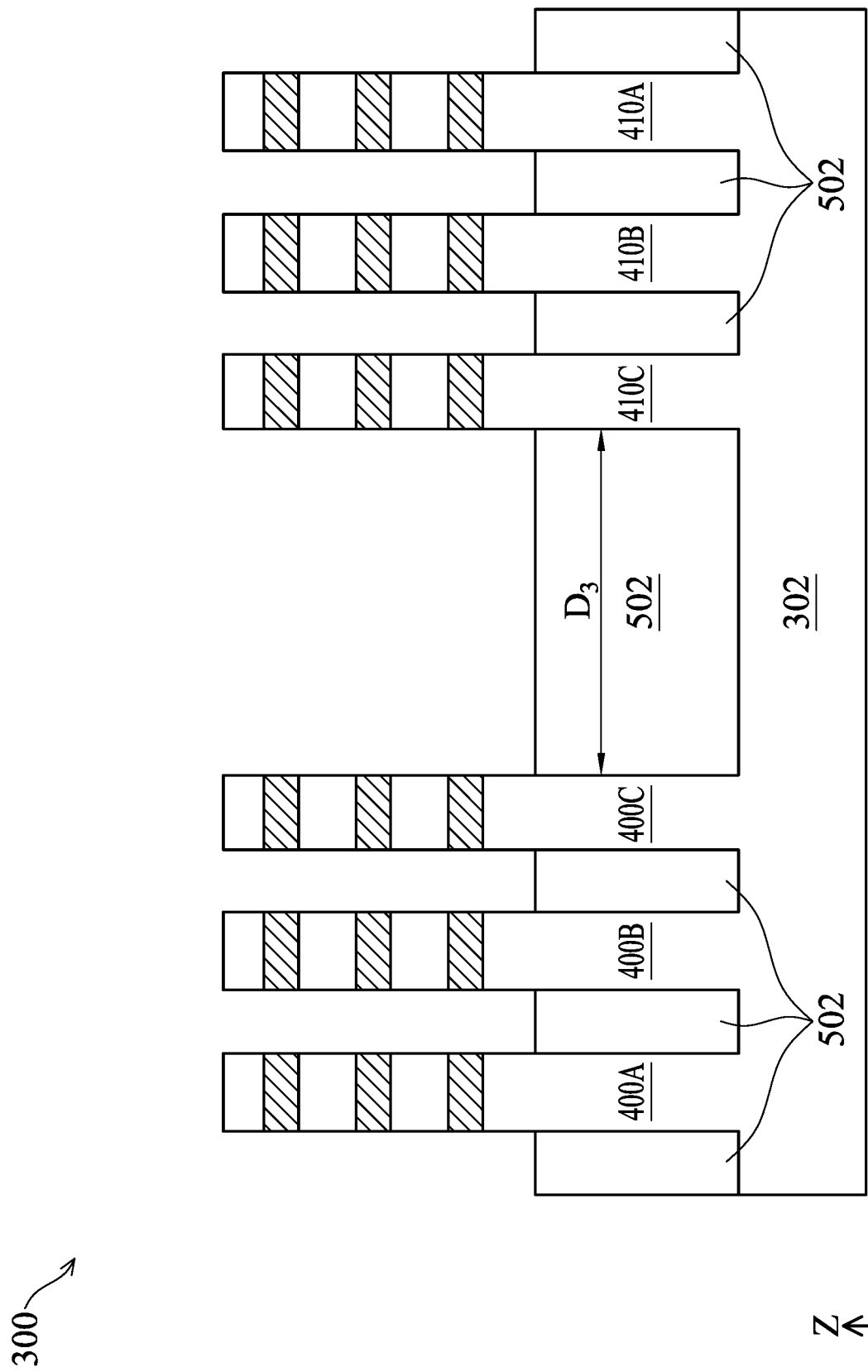

Corresponding to operation 206 of FIG. 2, FIG. 5A is a cross-sectional view of the GAA FET device 300 including an isolation structure 502, at one of the various stages of fabrication. The cross-sectional views of FIG. 5A is cut in a direction parallel to the lengthwise direction of an active/dummy gate structure of the GAA FET device 300 (e.g., cross-section B-B indicated in FIG. 1).

The isolation structure 502, which is formed of an insulation material, includes one or more portions to electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form a top surface of the isolation structure 502 and a top surface of the fin structures 400A-C and 410A-C that are coplanar (not shown). The patterned mask used to define the fin structures 400A-C and 410A-C may also be removed by the planarization process.

In some embodiments, the isolation structure 502 includes a liner, e.g., a liner oxide (not shown), at the interface between each portion of the isolation structure 502 and the substrate 302. In some embodiments, the liner oxide is formed to reduce crystalline defects at the interface between the substrate 302 and the isolation structure 502. Similarly, the liner oxide may also be used to reduce crystalline defects at the interface between the fin structures 400A-C and 410A-C and the isolation structure 502. The liner oxide (e.g., silicon oxide) may be a thermal oxide formed through a thermal oxidation of a surface layer of the substrate 302, although other suitable method may also be used to form the liner oxide.

Next, the isolation structure 502 is recessed to form a shallow trench isolation (STI) structure 502, as shown in FIG. 5A. The isolation structure 502 is recessed such that respective upper portions of the fin structures 400A-C an 410A-C protrude from between neighboring portions of the STI structure 502. A top surface of the STI structure 502 may have a flat surface (as illustrated), a convex surface, a concave surface (such as dishing), or combinations thereof. The top surface of the STI structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

In various embodiments, between adjacent fin structures, the GAA FET device 300 may include a dummy fin structure. For example, between the edge fin structures 400C and 410C, the GAA FET device 300 may include a dummy fin structure, e.g., 510, as illustrated in cross-sectional views of FIGS. 5B, 5C, and 5D, respectively. The dummy fin structure 510 may have a width, $W_D$, extending along the X direction that is greater than the width ($W_C$) of the fin structures 400A-C and 410A-C, and less than or equal to the inter-fin-group distance ($D_3$). The dummy fin structure 510 may be formed higher than, equal to, or lower than the fin structures 400A-C and 410A-C. In another example, the GAA FET device 300 can further include a number of dummy fin structures (not shown), each of which is disposed between either the adjacent non-edge fin structures (e.g., 400A and 400B), or between the edge fin structure and the non-edge fin structure (e.g., 400B and 400C, 410B and 410C). The dummy fin structures, including the dummy fin structure 510, may be formed prior to, concurrently with, or subsequently to the formation of the isolation structure 502.

For example, upon forming the fin structures 400A-C and 410A-C and prior to forming the isolation structure 502, the dummy fin structure 510 may be formed by patterning a dummy channel layer that overlays the fin structures. The dummy channel layer can include a dielectric material. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer may be formed using low-pressure chemical vapor deposition (LPCVD) or plasma enhanced chemical vapor deposition (PECVD), for example.

Figure 5B:
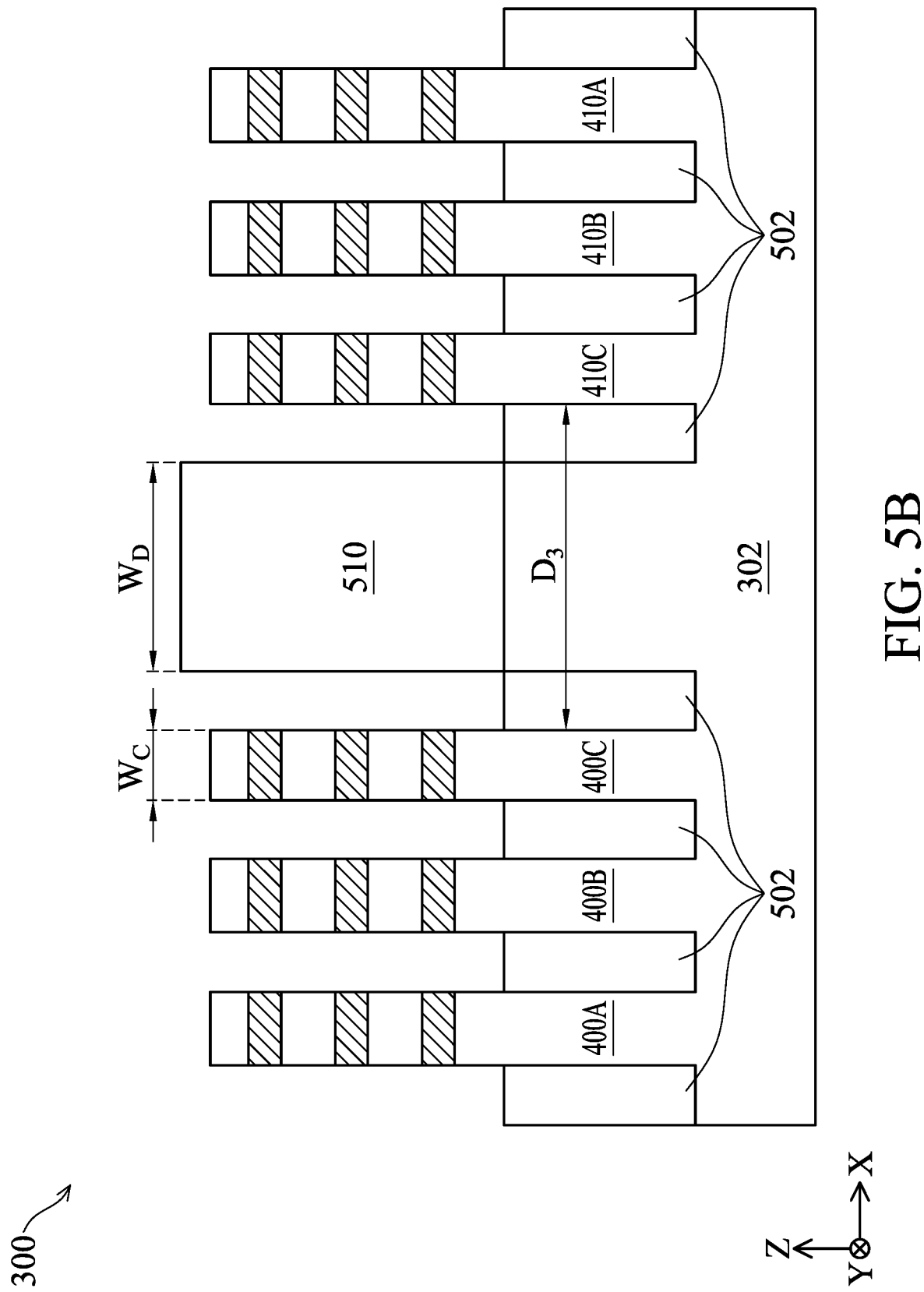

Upon depositing the dummy channel layer over the fin structures 400A-C and 410A-C, a patterned mask (not shown) may be formed over the dummy channel layer to mask portions of the dummy channel layer to form the dummy fin structure 510. Subsequently, unmasked portions of the dummy channel layer may be etched using, for example, reactive ion etch (RIE), neutral beam etch (NBE), the like, or combinations thereof, thereby defining the dummy fin structure 510 between adjacent fin structures (e.g., edge fin structures 400C and 410C), as illustrated in FIG. 5B. The etching may be anisotropic, in some embodiments.

Figure 5C:
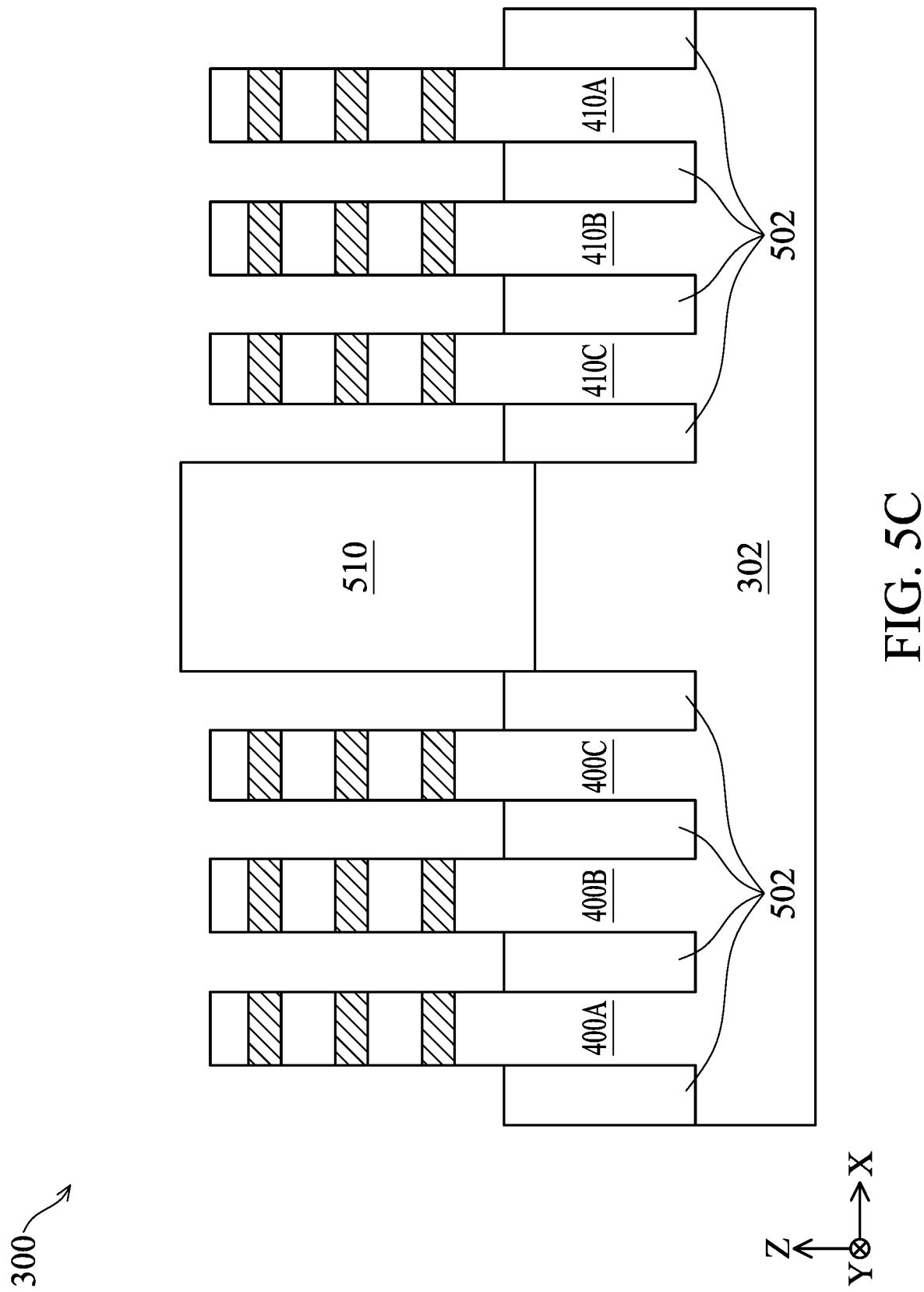
Figure 5D:
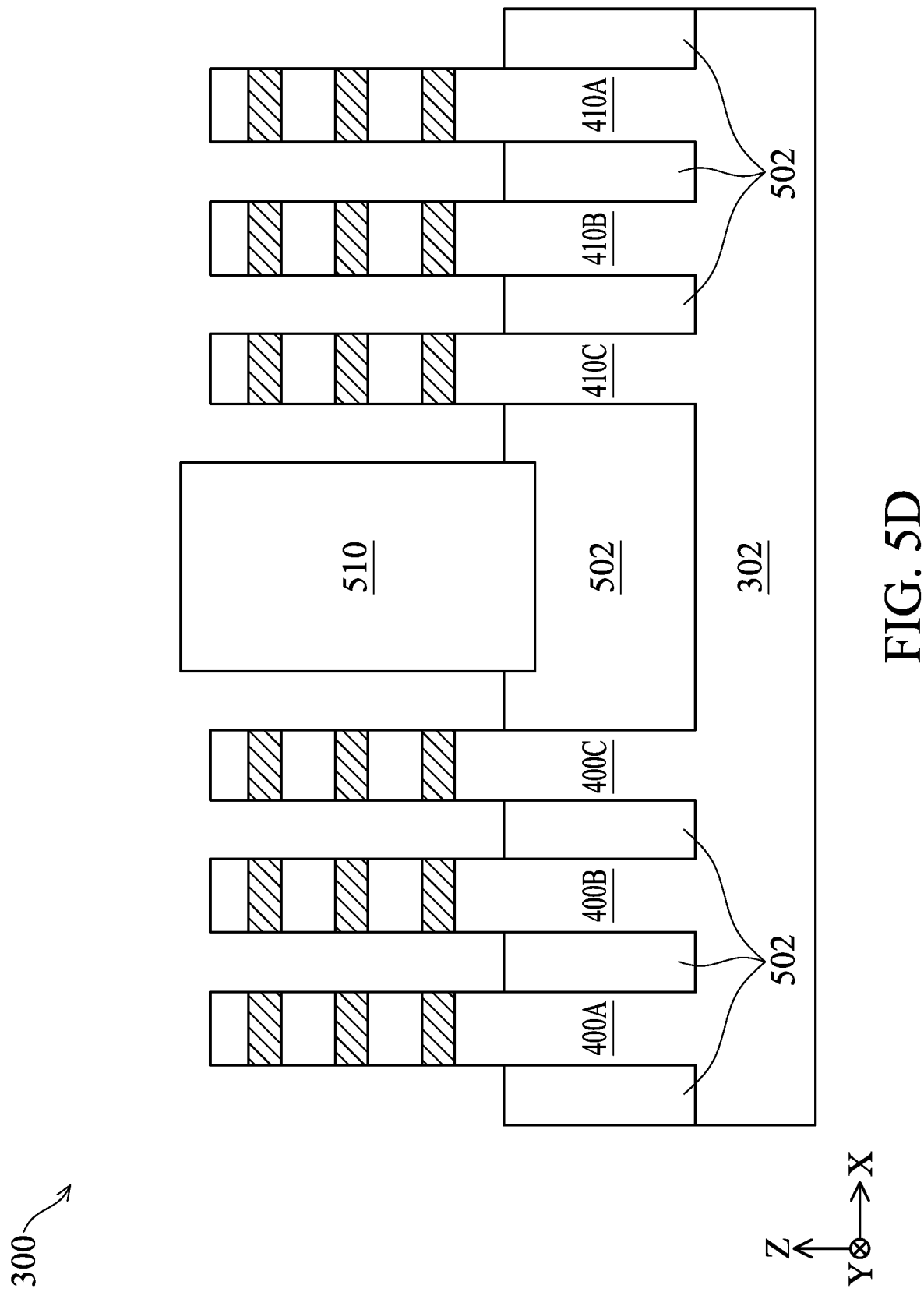

The dummy fin structure 510 may also be formed concurrently with or subsequently to the formation of the isolation structure 502, which will be discussed in the following examples of FIGS. 5C-D. As an example, when forming the fin structures 400A-C and 410A-C (FIG. 4), one or more other similar fin structures may also be formed in the trench 425. The insulation material of the isolation structure 502 may be deposited over the fin structures, followed by a CMP process to planarize the top surfaces of the insulation material and the fin structures, which include the fin structures 400A-C and 410A-C and the fin structure(s) formed in the trench 425. Subsequently, an upper portion of the fin structure(s) formed in the trench 425 may be partially removed to form cavities. The cavities are then filled with the dummy channel layer, followed by another CMP process to form the dummy fin structure 510. The insulation material is then recessed to form the STI 502, as shown in FIG. 5C. Using such a method to form the dummy fin structure 510, the dummy fin structure 510 is formed on the substrate 302 and a bottom surface of the dummy fin structure 510 is below the top surface of the isolation structure 502, as shown in FIG. 5C. Depending on how much of the insulation material is recessed, the bottom surface of the dummy fin structure 510 may be above the top surface of the isolation structure 502, while remaining within the scope of the present disclosure.

As another example, after forming the fin structures 400A-C and 410A-C (FIG. 4), the insulation material of the isolation structure 502 may be deposited over the fin structures 400A-C and 410A-C in a controlled deposition rate, thereby causing cavities to be spontaneously formed in the trench 425. The cavities are then filled with the dummy channel layer, followed by a CMP process to form the dummy fin structure 510. The insulation material is recessed to form the STI 502, as shown in FIG. 5D. Using such a method to form the dummy fin structure 510, the dummy fin structure 510 is formed on the isolation structure 502 and a bottom surface of the dummy fin structure 510 is embedded in the corresponding isolation structure 502, as shown in FIG. 5D. As yet another example, after forming the fin structures 400A-C and 410A0-C (FIG. 4) and depositing the insulation material of the isolation structure 502 over the fin structures 400A-C and 410A-C, a patterned mask may be formed over the insulation material to expose one or more portions of the insulation material to form the dummy fin structure 510 (e.g., in the trench 425). Subsequently, the exposed portion(s) of the insulation material may be etched using, for example, reactive ion etch (RIE), neutral beam etch (NBE), the like, or combinations thereof, thereby defining cavities. The cavities are then filled with the dummy channel layer, followed by a CMP process to form the dummy fin structure 510, which is similar to the illustrated embodiment of FIG. 5D.

Figure 6A:
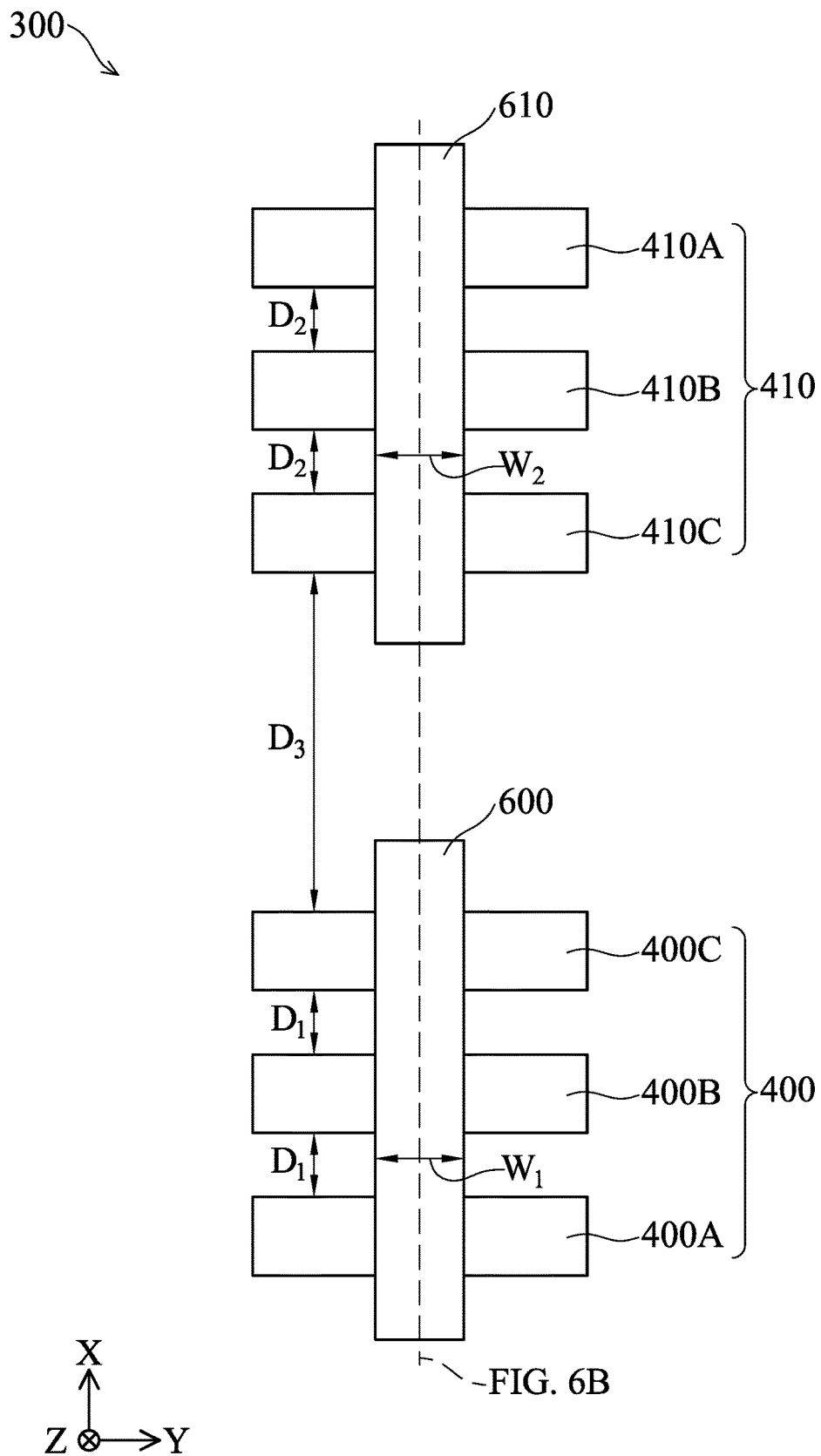
Figure 6B:
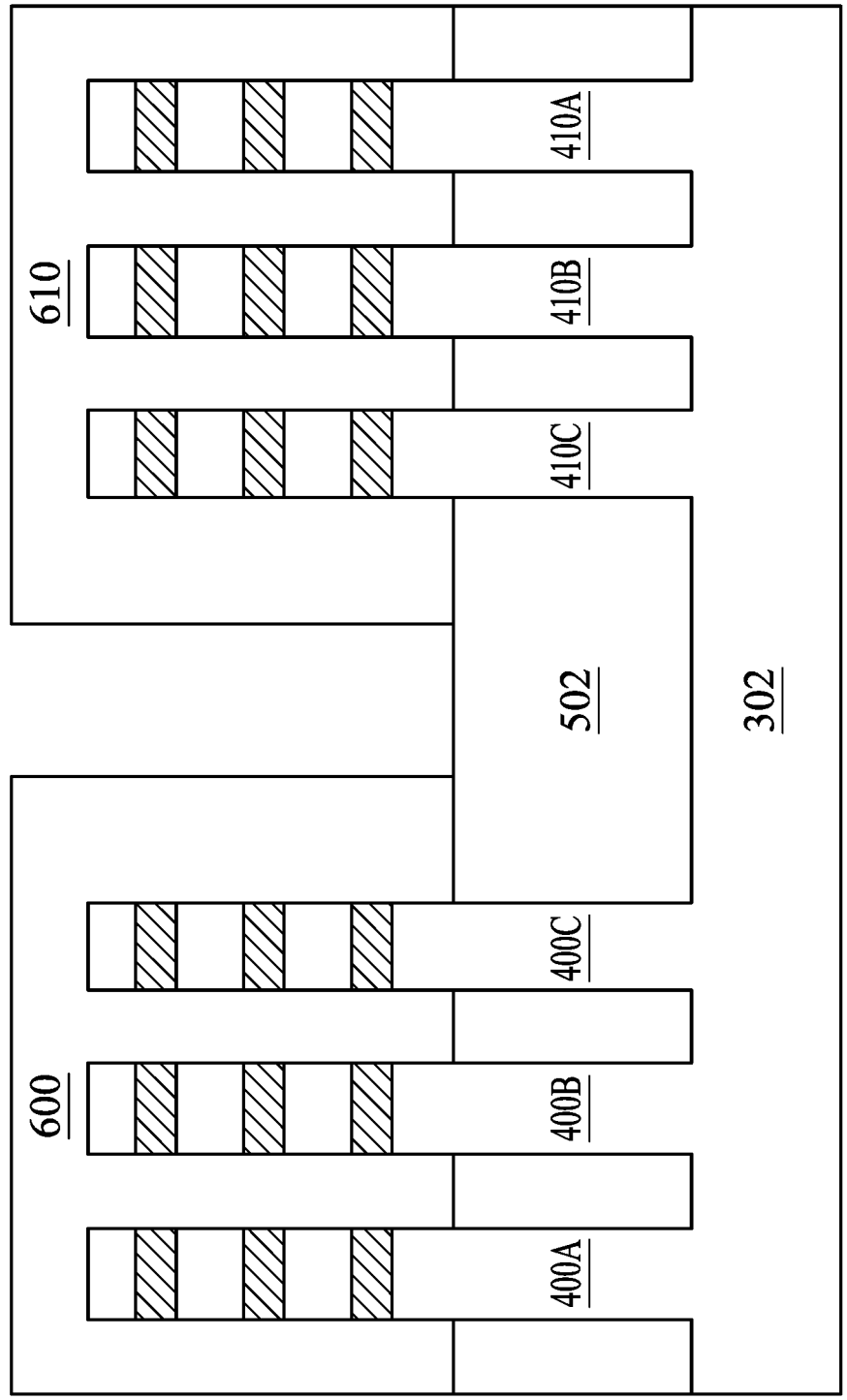

Corresponding to operation 208 of FIG. 2, FIG. 6A is a top view of the GAA FET device 300 including one or more dummy gate structures 600 and 610, at one of the various stages of fabrication; and FIG. 6B is a corresponding cross-sectional view of the GAA FET device 300. The cross-sectional view of FIG. 6B is cut in a direction along the lengthwise direction of an active/dummy gate structure of the GAA FET device 300 (e.g., cross-section B-B indicated in FIG. 1).

As shown in FIG. 6A, the dummy gate structures 600 and 610 are formed over the fin structures 400A-C and 410A-C, respectively, where the fin structures 400A-C are separated from each other by $D_1$, the fin structures 410A-C are separated from each other by $D_2$, and the fin groups 400 and 410 (e.g., their respective edge fin structures 400C and 410C) are separated from each other by $D_3$. The dummy gate structures 600 and 610 can each extend along a lateral direction (e.g., the X direction) perpendicular to the lateral direction along which the fin structures extend. The dummy gate structures 600 and 610 may be placed where respective active (e.g., metal) gate structures are later formed, in various embodiments. For example in FIG. 6A, the dummy gate structure 600 is placed over a respective portion of each of the fin structures 400A-C; and the dummy gate structure 610 is placed over a respective portion of each of the fin structures 410A-C. Such an overlaid portion of the fin structure is later formed as a conduction channel, which includes portions of the second semiconductor layers 404, and the dummy gate structures 600-610 are each replaced with an active gate structure to warp around each of the portions of the second semiconductor layers 404.

The dummy gate structures 600-610 each include a dummy gate dielectric and a dummy gate, in some embodiments. For purposes of clarity of illustration, the dummy gate dielectric and dummy gate are shown as a single piece in the figures of the present disclosure. To form the dummy gate structures 600-610, a dielectric layer is formed on the fin structures 400A-C and 410A-C. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques to form a mask. The pattern of the mask then may be transferred to the gate layer and the dielectric layer by a suitable etching technique to form the dummy gate structures 600-610.

Referring to FIG. 6B, the dummy gate structures 600-610 are formed over the fin structures 400A-C and 410A-C, respectively, and in direct contact with the STI structure 502. It should be appreciated that the GAA FET device 300 can include the dummy gate structures formed in other configurations, while remaining within the scope of the present disclosure. For example, between the adjacent fin structures (along the X direction), a cladding layer (similar as the first semiconductor layer 402) and a dummy fin structure (overlaid or protected by a high-k dielectric layer) can be formed to produce a substantially planar top surface shared by the fin structures, the cladding layer, and the dummy fin structure. As used herein, the term "substantially planar" refers to a structure when the deviation of the structure from a plane is within the statistical atomic level variations inherent within semiconductor processing methods known in the art. In such embodiments, the dummy gate structures 600-610 may be formed over such a substantially planar top surface, with an etch stop layer disposed therebetween. The etch stop layer may include silicon oxide. The etch stop layer may be formed by a deposition process, such as chemical vapor deposition (CVD) (e.g., plasma enhanced chemical vapor deposition (PECVD), high aspect ratio process (HARP), or combinations thereof) process, atomic layer deposition (ALD) process, another applicable process, or combinations thereof.

Figure 6D:
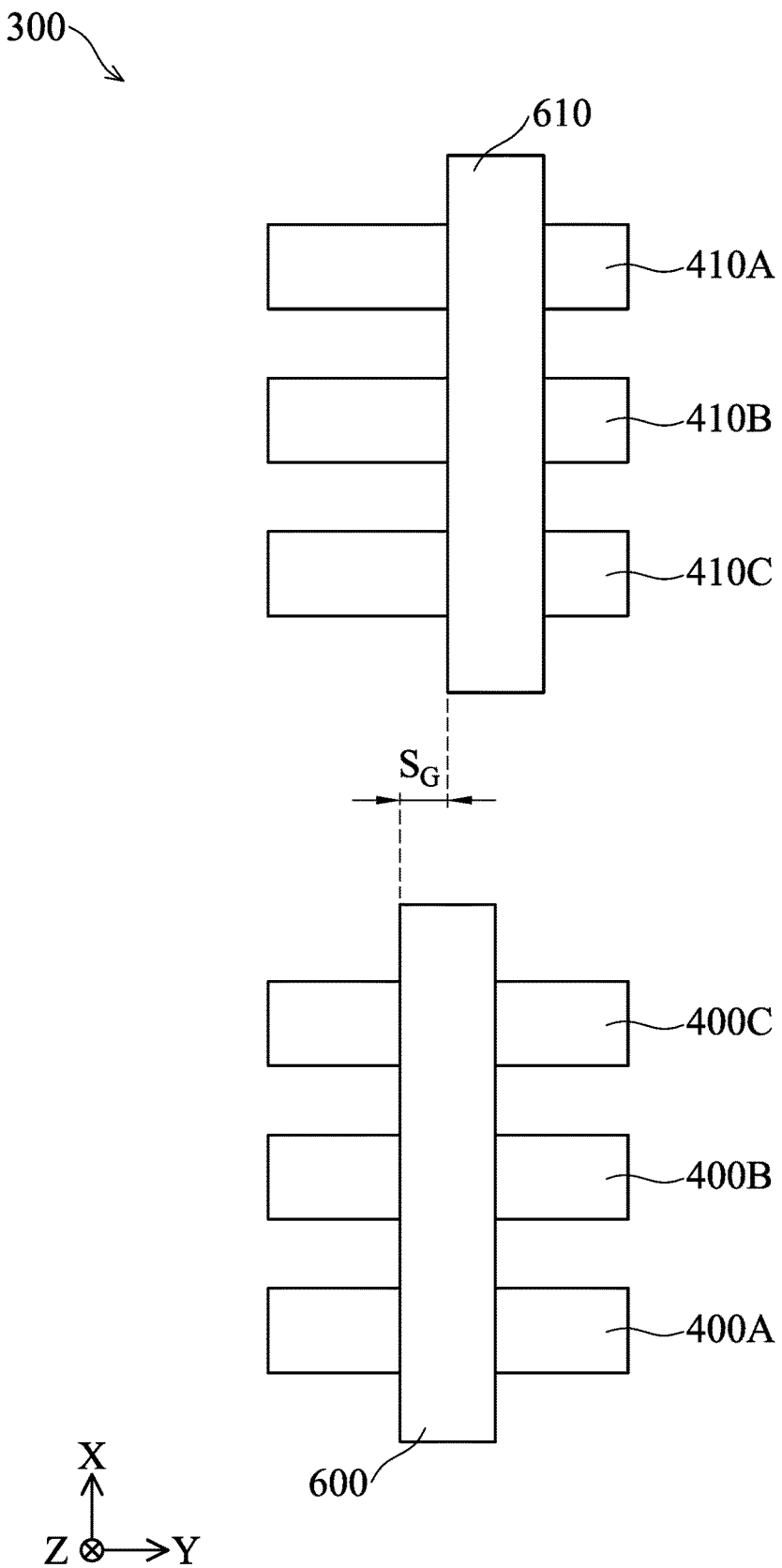
Figure 6E:
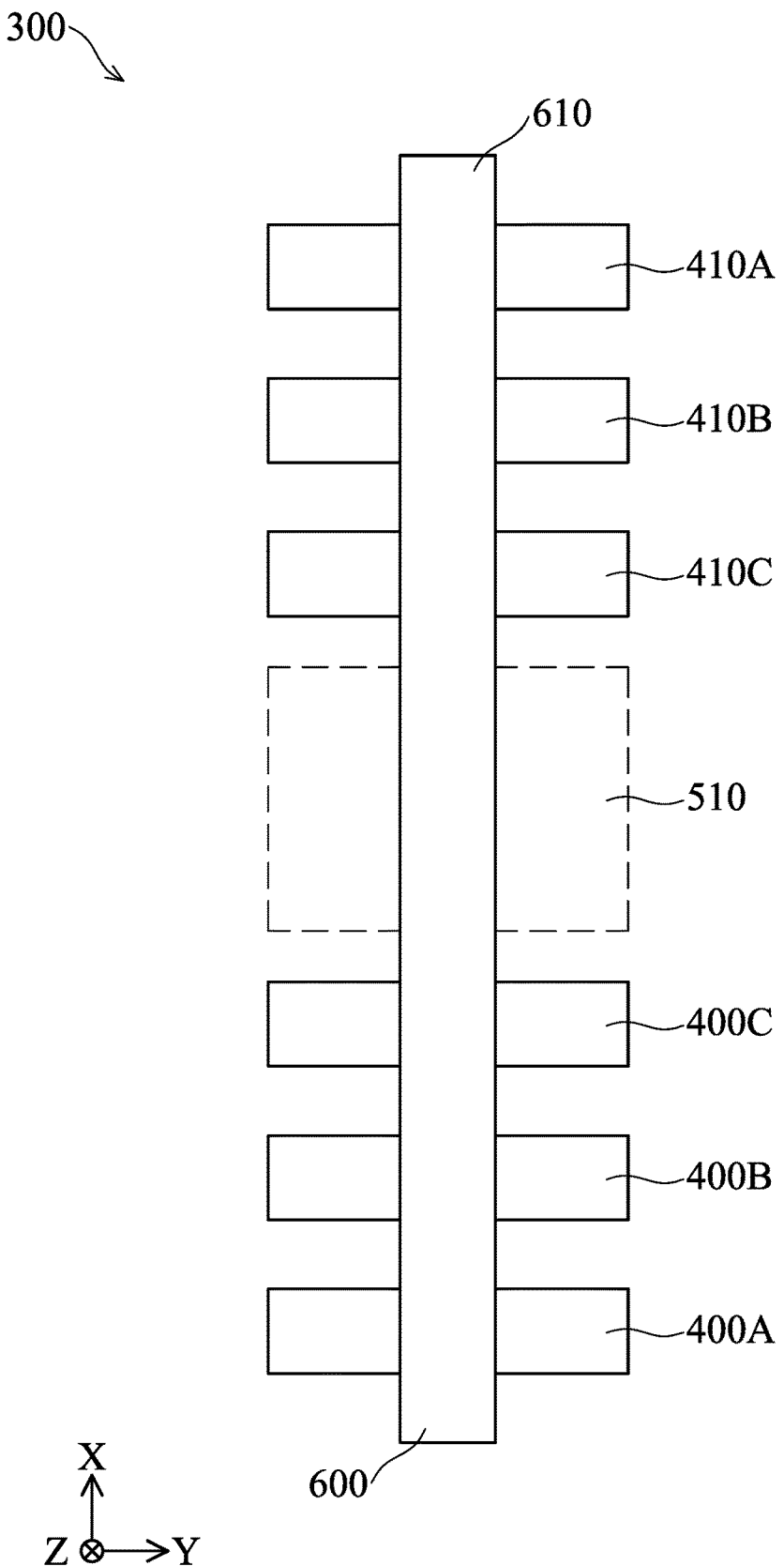
Figure 6F:
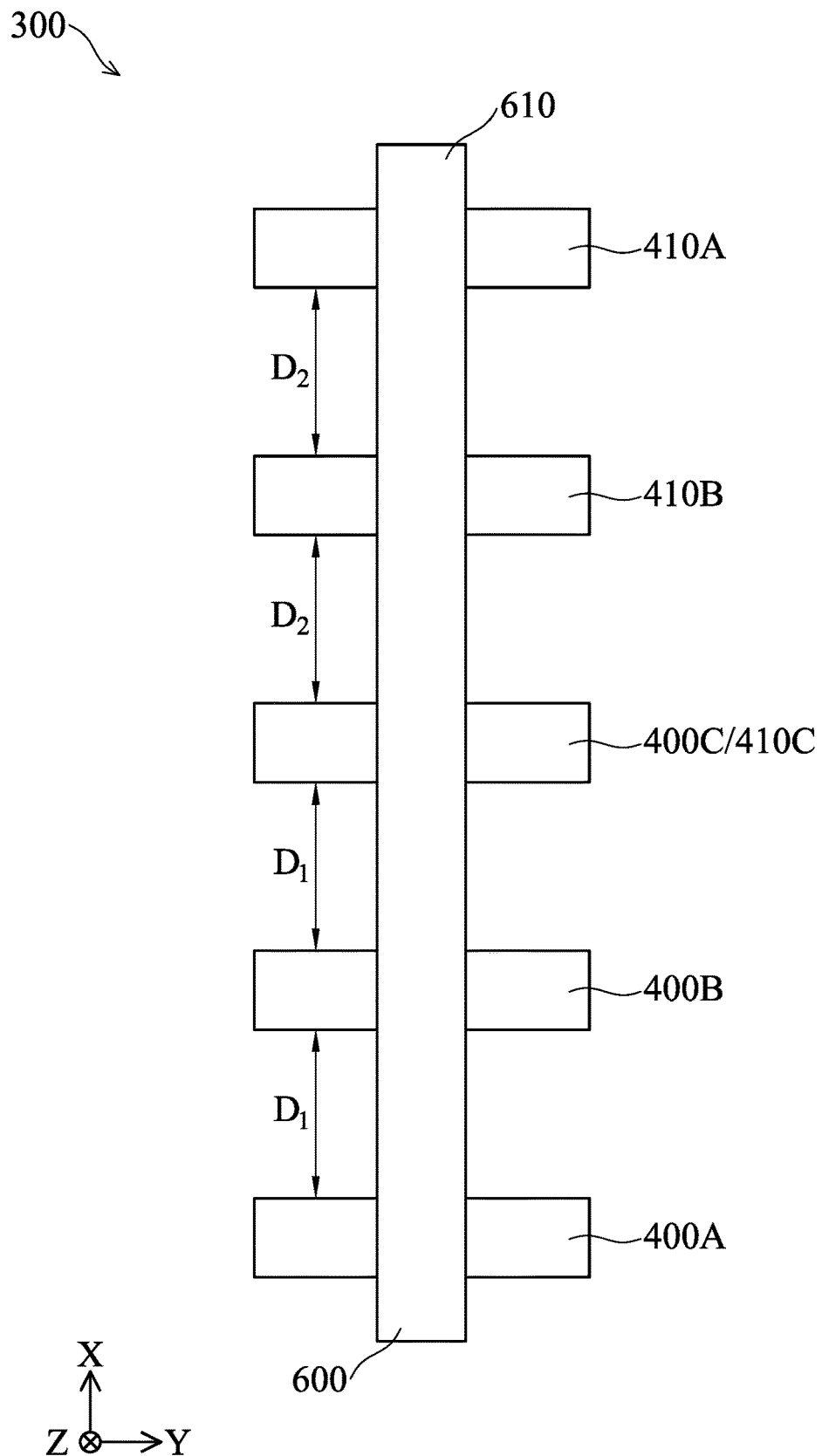

The dummy gate structures 600 and 610 can be formed in various configurations, which will be discussed below with respect to FIGS. 6A, and 6B-6F. Referring again to FIG. 6A, the dummy gate structures 600 and 610 are aligned along the X direction, and have respective widths along the Y direction. For example, the dummy gate structure 600 has a width, $W_1$, and the dummy gate structure 610 has a width, $W_2$. $W_1$ and $W_2$ can each range from about 1 nm to about 500 nm. In the illustrated example of FIG. 6A, $W_1$ is about equal to $W_2$. The aligned dummy gate structures 600 and 610 can have different widths. For example, $W_1$ can be different from $W_2$, as illustrated in FIG. 6C. The dummy gate structures 600 and 610 can be offset (or spaced) from each other along the Y direction with a distance $S_G$, as illustrated in FIG. 6D. The distance may range from about 1 nm to about 500 nm. In some embodiments, the dummy gate structures 600 and 610 may be integrally formed as a single piece (hereinafter referred to as "single dummy gate structure 600/610" or "continuous dummy gate structure 600/610"), as illustrated in FIG. 6E. As mentioned above, the dummy fin structure 510 may be formed between the fin groups. The single dummy gate structure 600/610 may overlay such a dummy fin structure formed between two fin groups, which is shown in dotted lines in FIG. 6E. In some embodiments, the edge fin structures 400C and 410C may be formed as a single edge fin structure between two fin groups, as illustrated in FIG. 6F. As such, $D_3$ may not be present.

Figure 7A:
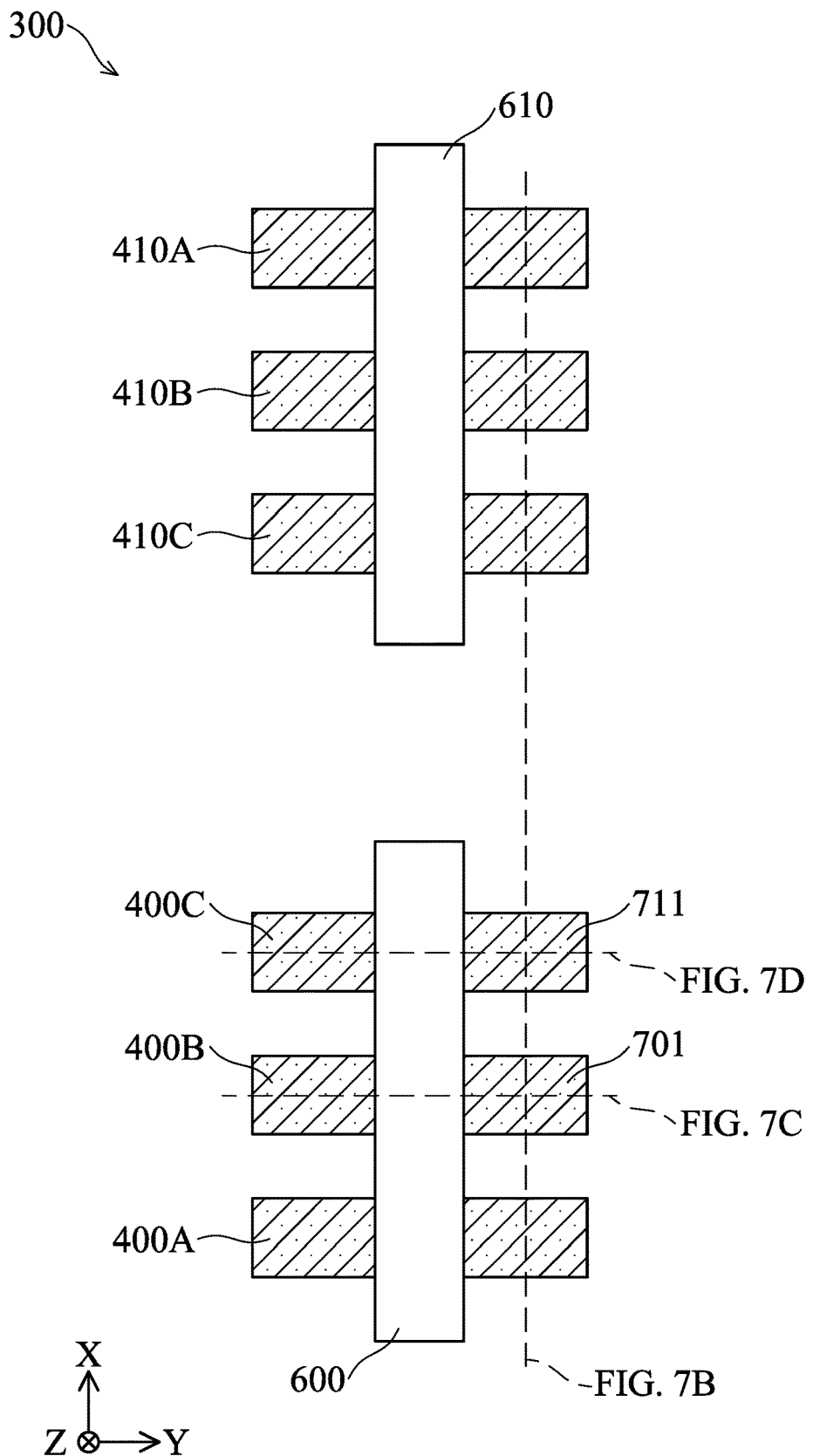
Figure 7B:
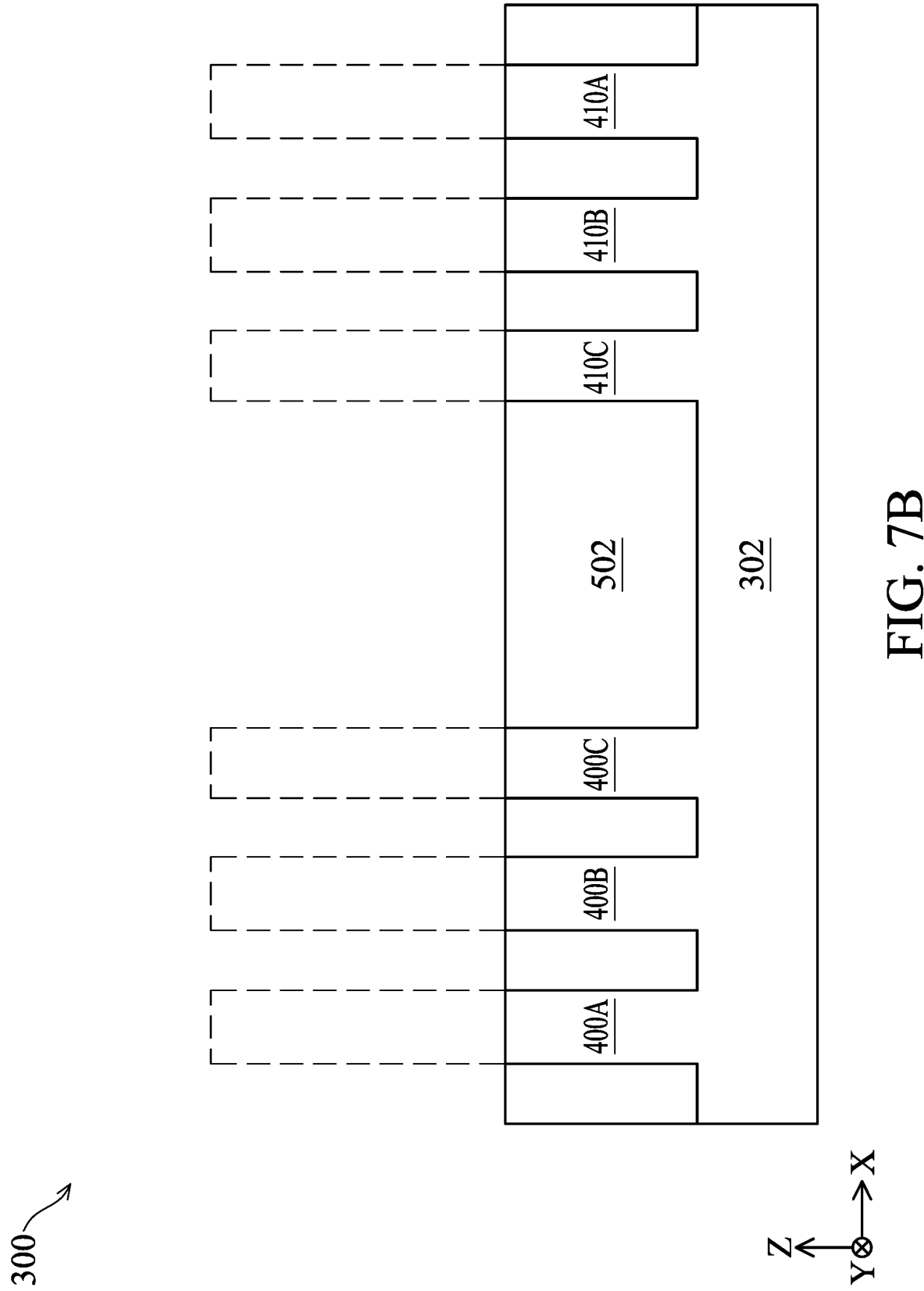
Figure 7C:
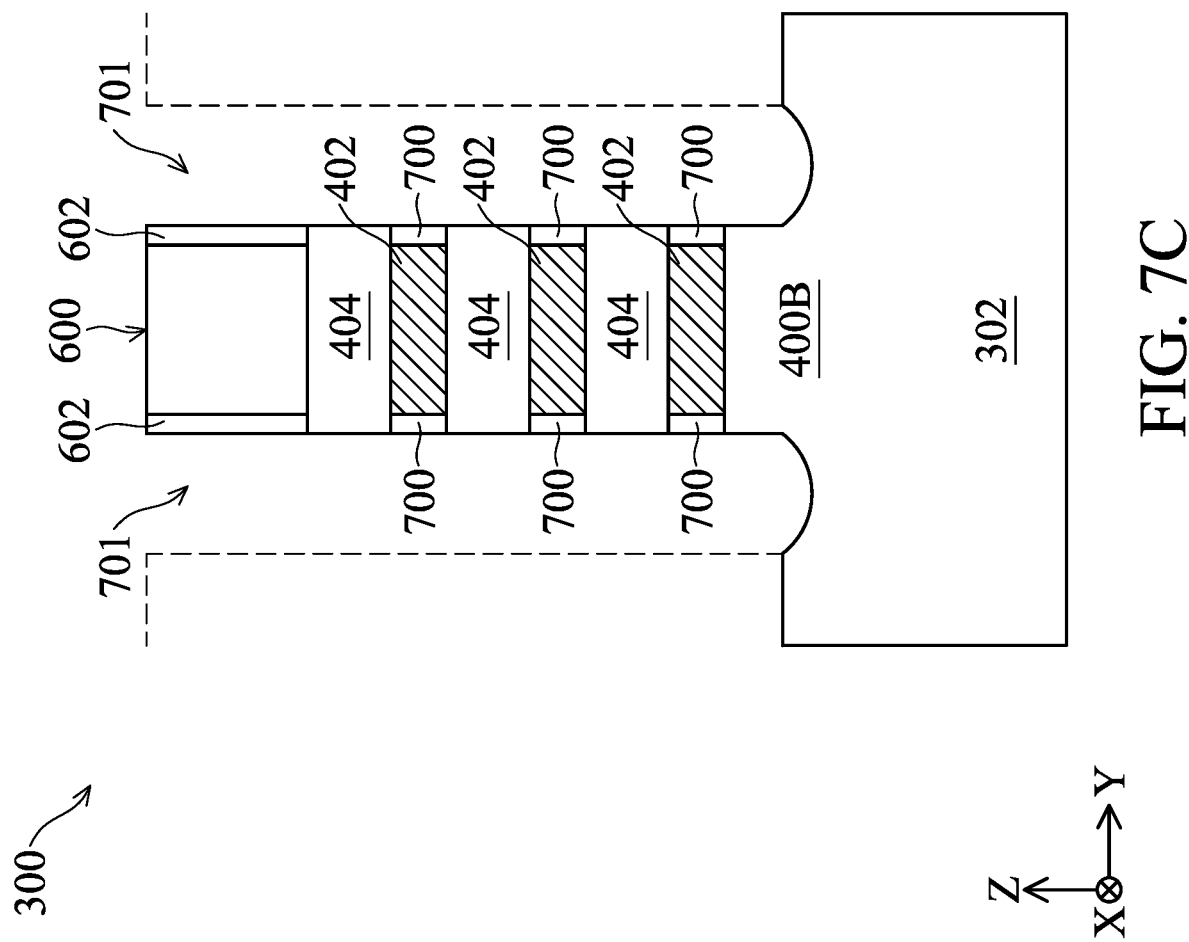
Figure 7D:
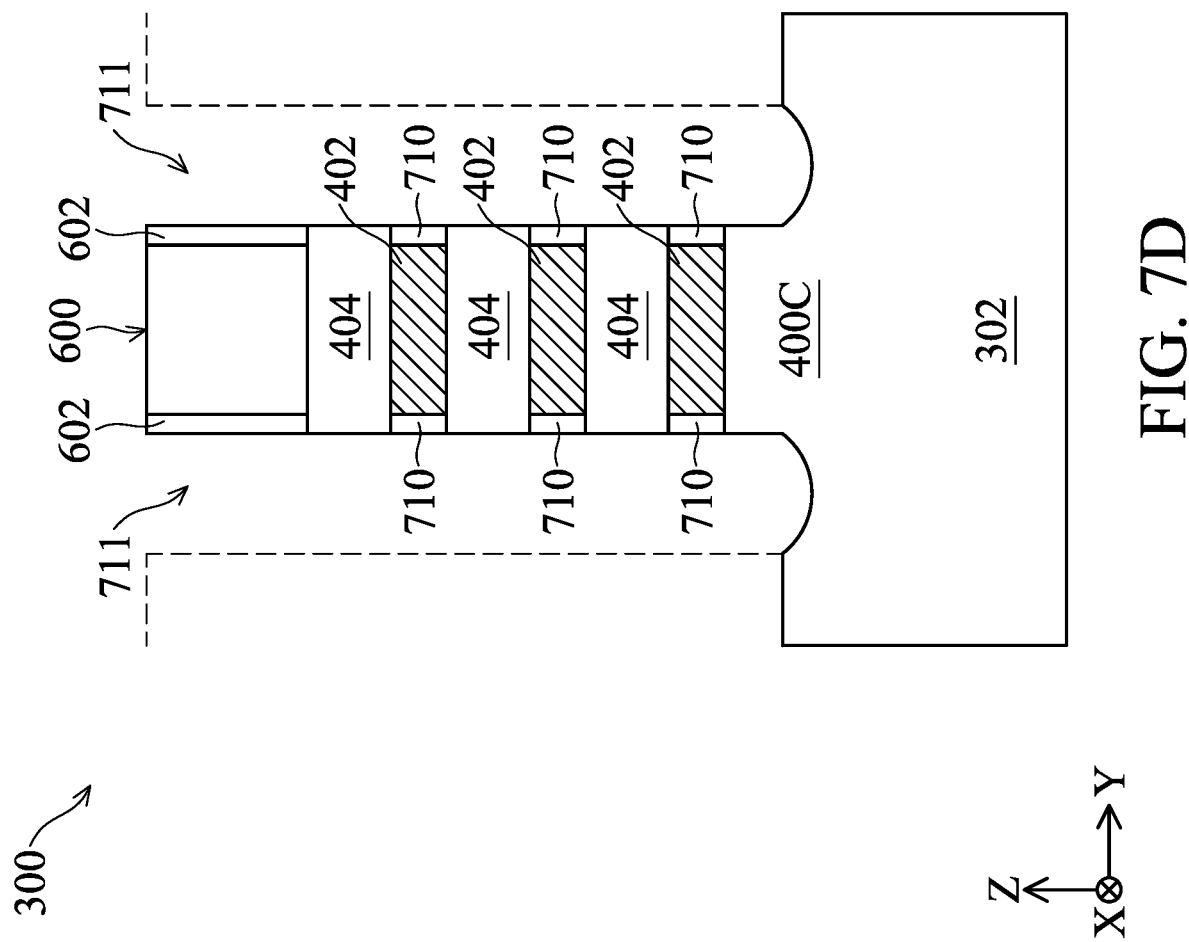

Corresponding to operation 210 of FIG. 2, FIG. 7A is a top view of the GAA FET device 300 in which respective portions of each of the fin structures 400A-C and 410A-C that are not overlaid by the dummy gate structure 600 or 610 are removed, at one of the various stages of fabrication. FIGS. 7B, 7C, and 7D are corresponding cross-sectional view of the GAA FET device 300. The cross-sectional view of FIG. 7B is cut in a direction parallel to the lengthwise direction of an active/dummy gate structure of the GAA FET device 300 (e.g., cross-section C-C indicated in FIG. 1); the cross-sectional view of FIG. 7C is cut in a direction along the lengthwise direction of a non-edge fin structure of the GAA FET device 300 (e.g., cross-section A-A indicated in FIG. 1); and the cross-sectional view of FIG. 7D is cut in a direction along the lengthwise direction of an edge fin structure of the GAA FET device 300 (e.g., cross-section A-A indicated in FIG. 1). As representative examples, FIG. 7C is cut along a lengthwise direction of the fin structure 400B; and FIG. 7D is cut along a lengthwise direction of the fin structure 400C.

The dummy gate structures 600-610 can serve as a mask to etch the non-overlaid portions of the fin structures 400A-C and 410A-C, which results in the fin structures 400A-C and 410A-C each including remaining portions of the semiconductor layers 402 and 404 alternatingly stacked on top of one another. The etched (removed) portions of the fin structures 400A-C and 410A-C are shown in dotted lines in FIG. 7B. Such an etching step may be stopped when an intermediate surface of the fin structures 400A-C and 410A-C is about leveled with the top surface of the isolation structure 502. In the illustrated example of FIG. 7B, the etched intermediate surface of the fin structures and the top surface of the isolation structure 502 share a flat surface. It should be understood that the etched intermediate surface of each of the fin structures may be recessed with respect the top surface of the isolation structure 502 (e.g., curve inwardly toward the substrate 302), in some embodiments.

FIGS. 7C and 7D illustrate the cross-sectional view of the GAA FET device 300 cut across the fin structures 400B and 400C, respectively. Along the Z direction, the fin structures 400B may have newly formed sidewalls that are aligned with sidewalls of the dummy gate structure 600, which can further include gate spacers 602 disposed on its both sides; and the fin structures 400C may have newly formed sidewalls that are also aligned with the sidewalls of the dummy gate structure 600. Although not shown in the top view of FIG. 7A, it should be understood that one or more dummy gate structures (in parallel with the dummy gate structures 600 and 610) can be formed to overlay the fin structures 400A-C and/or 410A-C. For example, each of the fin structures can be overlaid by multiple dummy gate structures that are in parallel with one another. Each of the dummy gate structures can serve as a mask to etch non-overlaid portions of the fin structures. As such, trenches can be formed. The trenches are sandwiched between respective different remaining portions of each of the fin structures.

For example in FIG. 7C, trenches 701 are formed on the sides of the dummy gate structure 600 (and on the sides of the remaining portion of the fin structure 400B that is overlaid by the dummy gate structure 600). Each of the trenches 701 is sandwiched between the remaining portion of the fin structure 400B overlaid by the dummy gate structure 600 and a remaining portion of the fin structure 400B overlaid by another dummy gate structure (shown in dotted lines). For example in FIG. 7D, trenches 711 are formed on the sides of the dummy gate structure 600 (and on the sides of the remaining portion of the fin structure 400C that is overlaid by the dummy gate structure 600). Each of the trenches 711 is sandwiched between the remaining portion of the fin structure 400C overlaid by the dummy gate structure 600 and a remaining portion of the fin structure 400C overlaid by another dummy gate structure (shown in dotted lines).

Upon forming the trenches (e.g., 701, 711), inner spacers are formed along respective etched ends of the semiconductor layers 402. As shown in FIG. 7C, inner spacers 700 extend along respective etched ends of each of the semiconductor layers 402 in the remaining portion of the fin structure 400B; and as shown in FIG. 7D, inner spacers 710 extend along respective etched ends of each of the semiconductor layers 402 in the remaining portion of the fin structure 400C.

To form the inner spacers 700 and 710, respective end portions of each of the semiconductor layers 402 may first be removed. The end portions of the semiconductor layers 402 can be removed (e.g., etched) using a "pull-back" process to pull the semiconductor layers 402 back by an initial pull-back distance. In an example where the semiconductor layers 404 include Si, and the semiconductor layers 402 include $Si_{1-x}Ge_x$, the pull-back process may include a hydrogen chloride (HCl) gas isotropic etch process, which etches SiGe without attacking Si. As such, the Si layers 404 may remain intact during this process.

Next, the inner spacers 700 and 710 can be formed along the etched ends of each of the semiconductor layers 402. Thus, the inner spacers 700 and 710 (e.g., their respective inner sidewalls) may follow the profile of the etched ends of the semiconductor layers 402. In some embodiments, the inner spacers 700 and 710 can be formed conformally by chemical vapor deposition (CVD), or by monolayer doping (MLD) of nitride followed by spacer RIE. The inner spacers 700 and 710 can be deposited using, e.g., a conformal deposition process and subsequent isotropic or anisotropic etching back to remove excess spacer material on the sidewalls of each of the remaining portions of the fin structures (e.g., 400B, 400C shown in FIGS. 7C-D) and on a surface of the semiconductor substrate 302. For example, the inner spacers 700 and 710 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 8A:
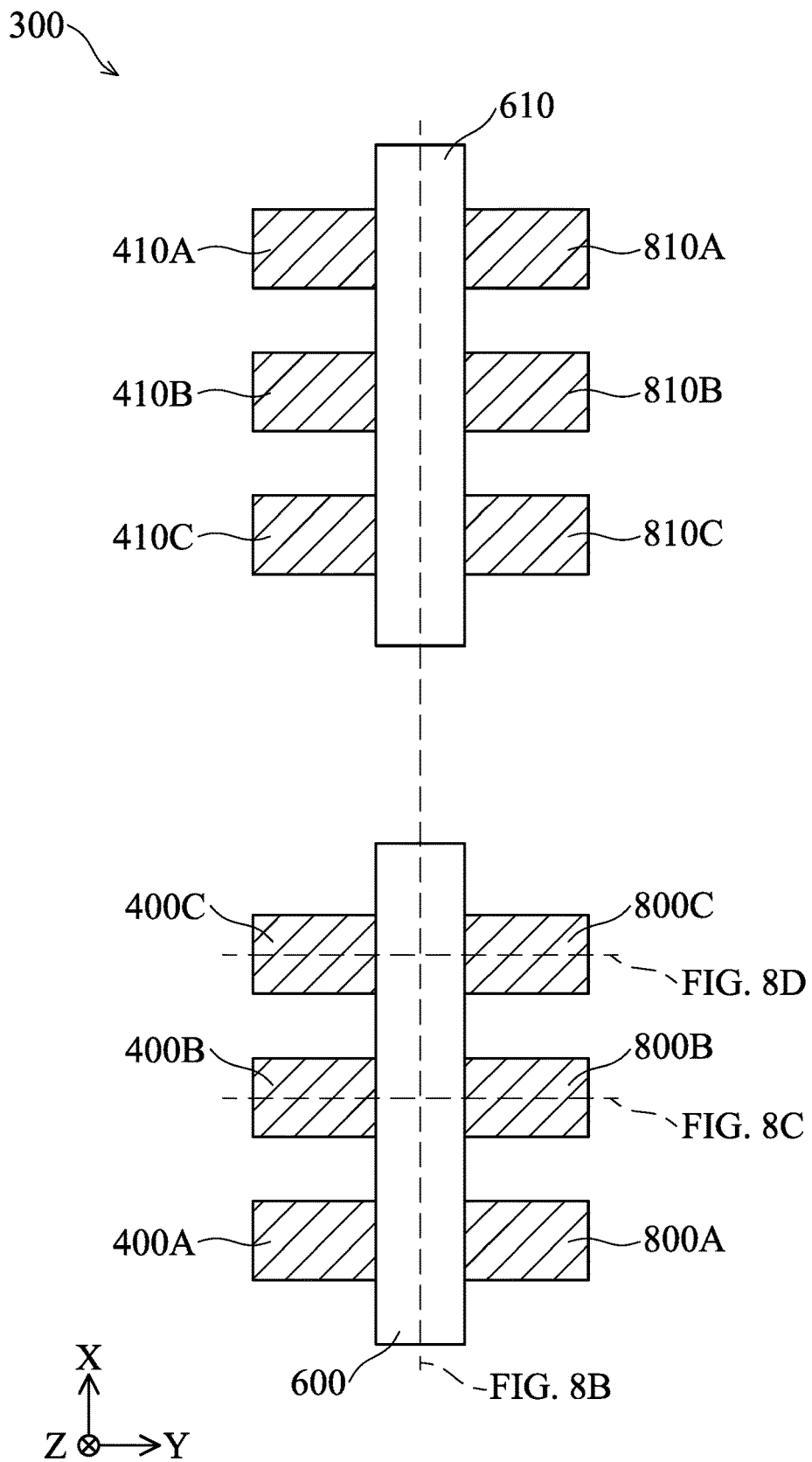
Figure 8B:
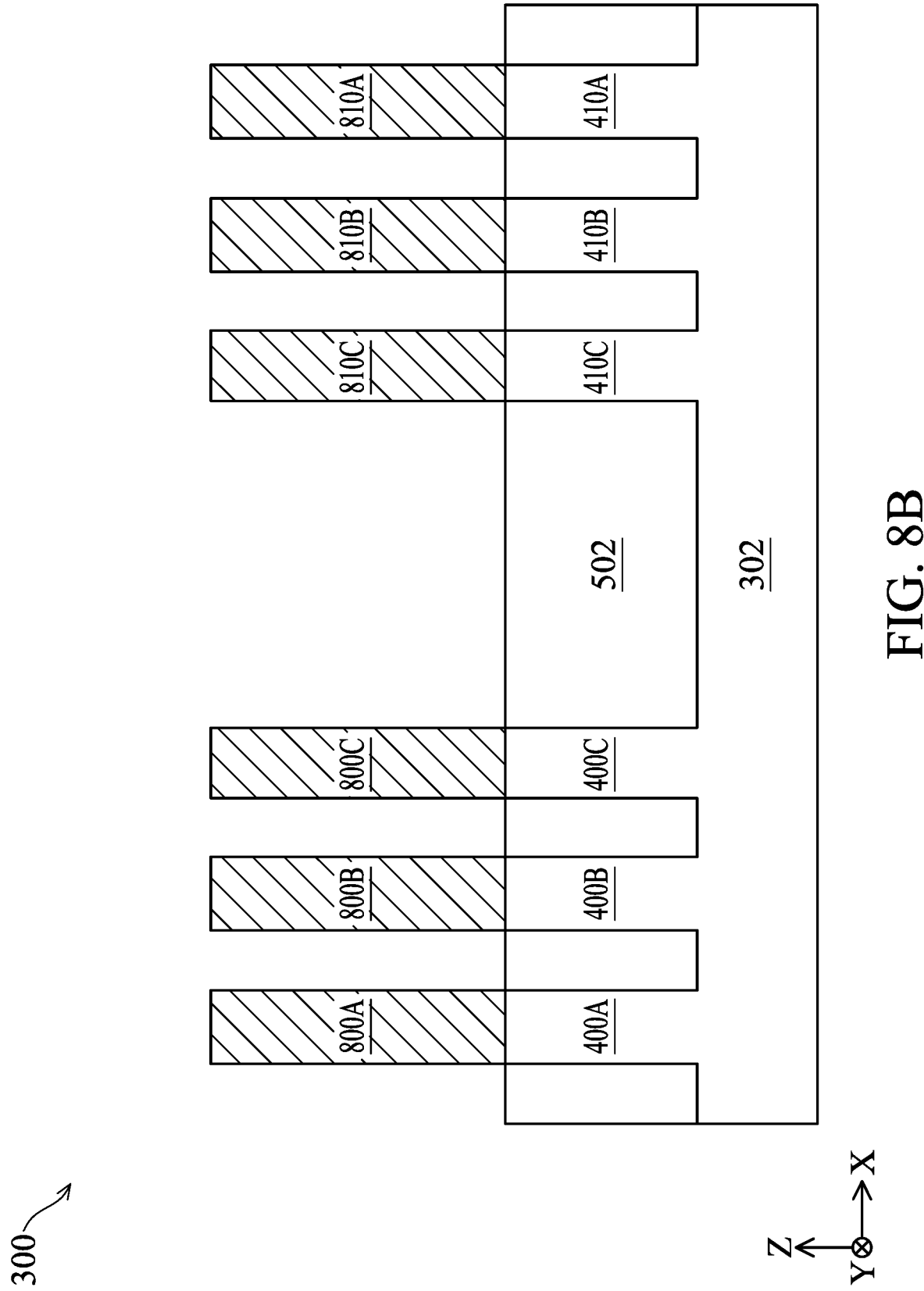
Figure 8D:
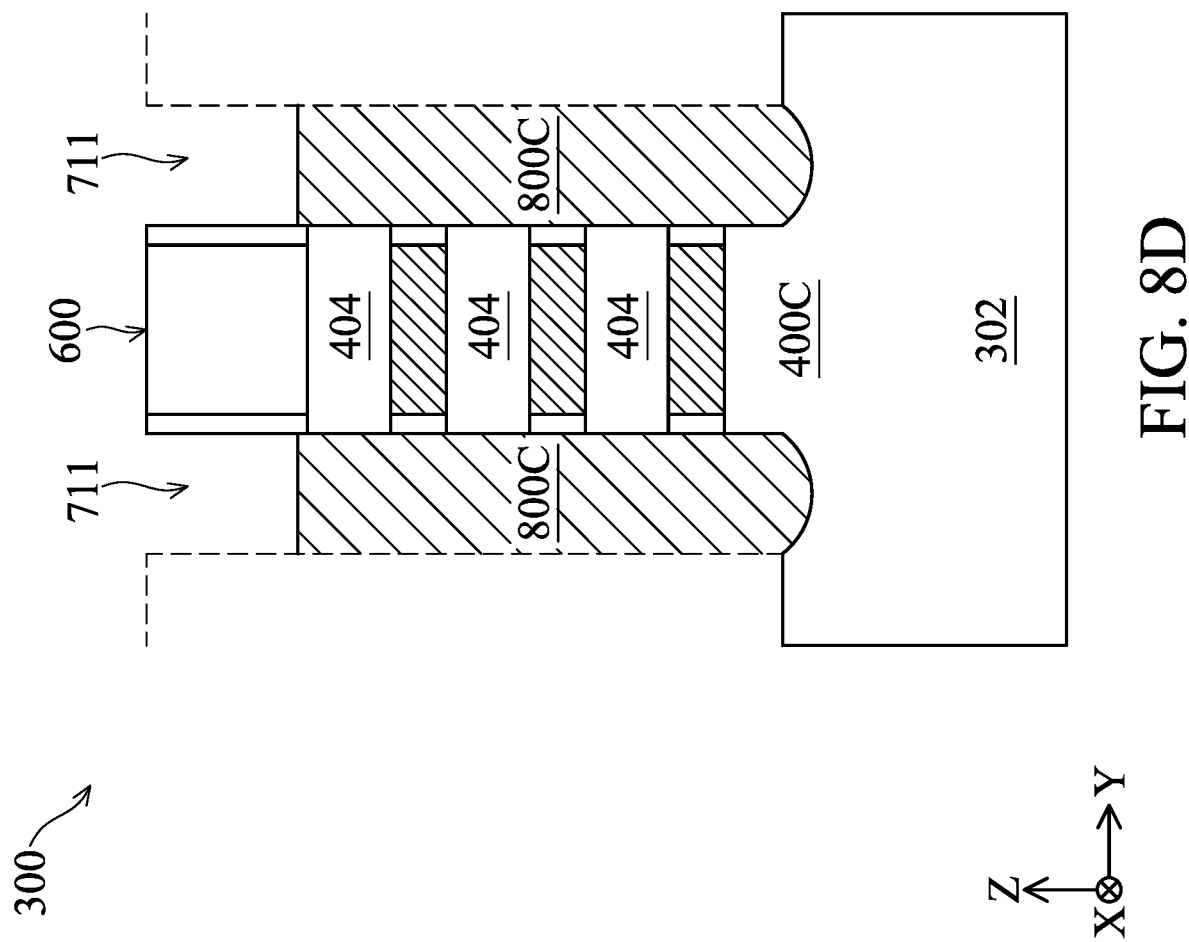

Corresponding to operation 212 of FIG. 2, FIG. 8A is a top view of the GAA FET device 300 including source/drain structures 800A, 800B, 800C, 810A, 810B, and 810C formed in the fin structures 400A, 400B, 400C, 410A, 410B, and 410C, respectively, at one of the various stages of fabrication. FIGS. 8B, 8C, and 8D are corresponding cross-sectional view of the GAA FET device 300. The cross-sectional view of FIG. 8B is cut in a direction parallel to the lengthwise direction of an active/dummy gate structure of the GAA FET device 300 (e.g., cross-section C-C indicated in FIG. 1); the cross-sectional view of FIG. 8C is cut in a direction along the lengthwise direction of a non-edge fin structure of the GAA FET device 300 (e.g., cross-section A-A indicated in FIG. 1); and the cross-sectional view of FIG. 8D is cut in a direction along the lengthwise direction of an edge fin structure of the GAA FET device 300 (e.g., cross-section A-A indicated in FIG. 1). As representative examples, FIG. 8C is cut along a lengthwise direction of the fin structure 400B; and FIG. 8D is cut along a lengthwise direction of the fin structure 400C.

The source/drain structures 800A-C and 810A-C may be formed using an epitaxial layer growth process on exposed ends (sidewalls) of each of the semiconductor layers 404 in the fin structures 400A-C and 410A-C, respectively. In some embodiments, a bottom surface of the source/drain structures 800A-C and 810A-C may be leveled with the top surface of the isolation structure 502, as shown in FIG. 8B. In some other embodiments, the bottom surface of the source/drain structures 800A-C and 810A-C may be lower than the top surface of the isolation structure 502. The source/drain structures (e.g., 800A and 800B, 810A and 810B) in the adjacent fin structures may merge with each other. On the other hand, in some embodiments, a top surface of the source/drain structures 800A-C and 810A-C may be higher than a top surface of the topmost semiconductor layers 404 in the fin structures 400A-C and 410A-C, for example, as shown in FIGS. 8C and 8D. In some other embodiments, the top surface of the source/drain structures 800A-C and 810A-C may be leveled with or lower than the top surface of the topmost semiconductor layers 404.

The source/drain structures 800A-C and 810A-C are electrically coupled to the respective semiconductor layers 404 of the fin structures 400A-C and 410A-C. As such, the semiconductor layers 404 of each of the fin structures 400A-C and 410A-C can collectively function as the "active" channel of a GAA transistor, that conducts current flowing between its respective source/drain structures. However, it should be noted that at this stage of fabrication, those active GAA transistors are not finished yet. In accordance with various embodiments, the semiconductor layers 404 of the edge fin structures 400C and 410C may be later replaced with respective dielectric trenches, while the semiconductor layers 404 of the non-edge fin structures 400A-B and 410A-B remain. As such, the source/drain structures 800C and 810C may be coupled to such dielectric trenches, which can cause those GAA transistors corresponding to the edge fin structures 400C and 410C to be "inactivated." The inactivated GAA transistors may not conduct current, in some embodiments.

In-situ doping (ISD) may be applied to form doped source/drain structures 800A-C and 810A-C, thereby creating the junctions for the GAA transistors. N-type and p-type FETs are formed by implanting different types of dopants to selected regions (e.g., the source/drain structures 800A-C and 810A-C) of the device to form the junction(s). N-type devices can be formed by implanting arsenic (As) or phosphorous (P), and p-type devices can be formed by implanting boron (B).

Figure 9A:
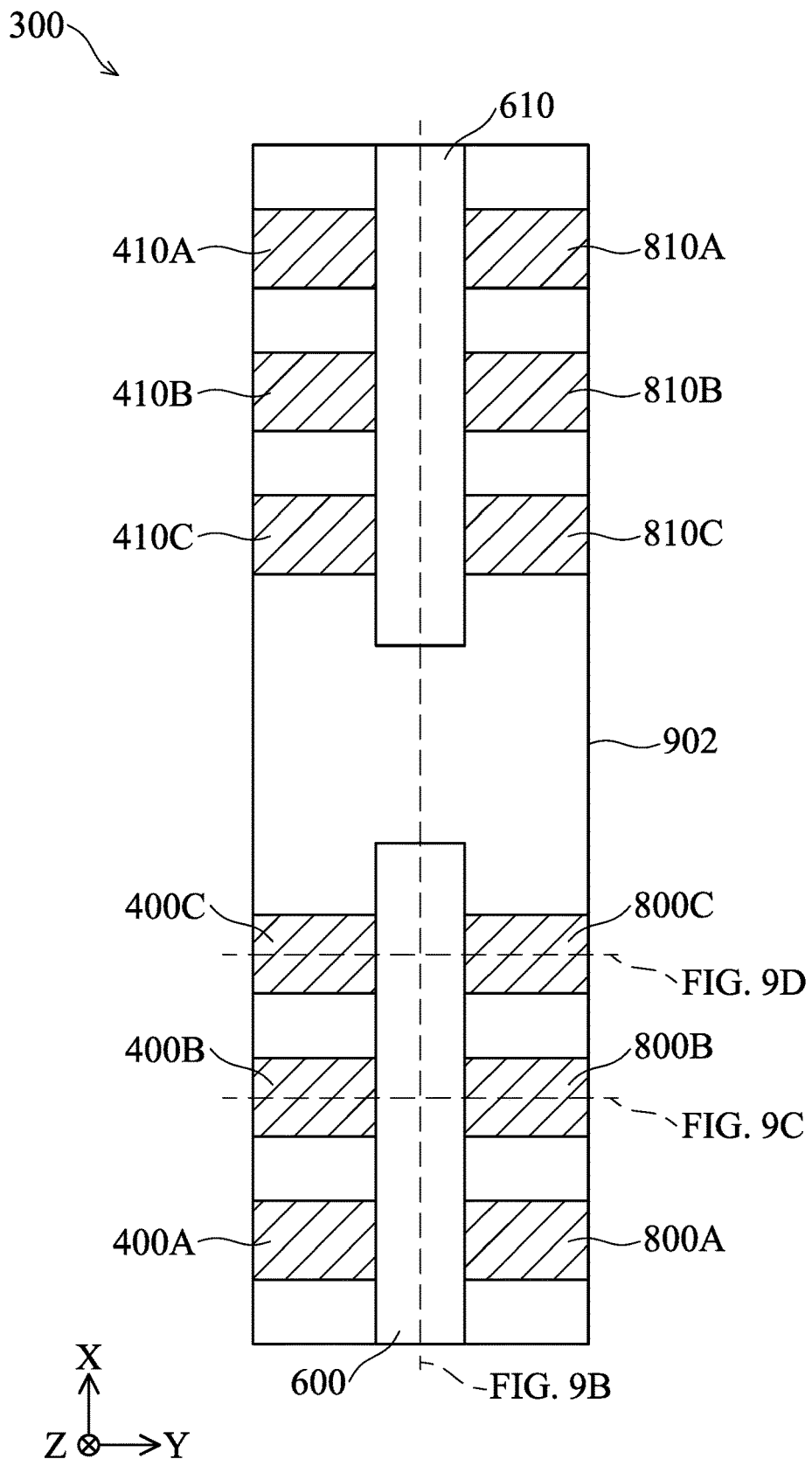
Figure 9B:
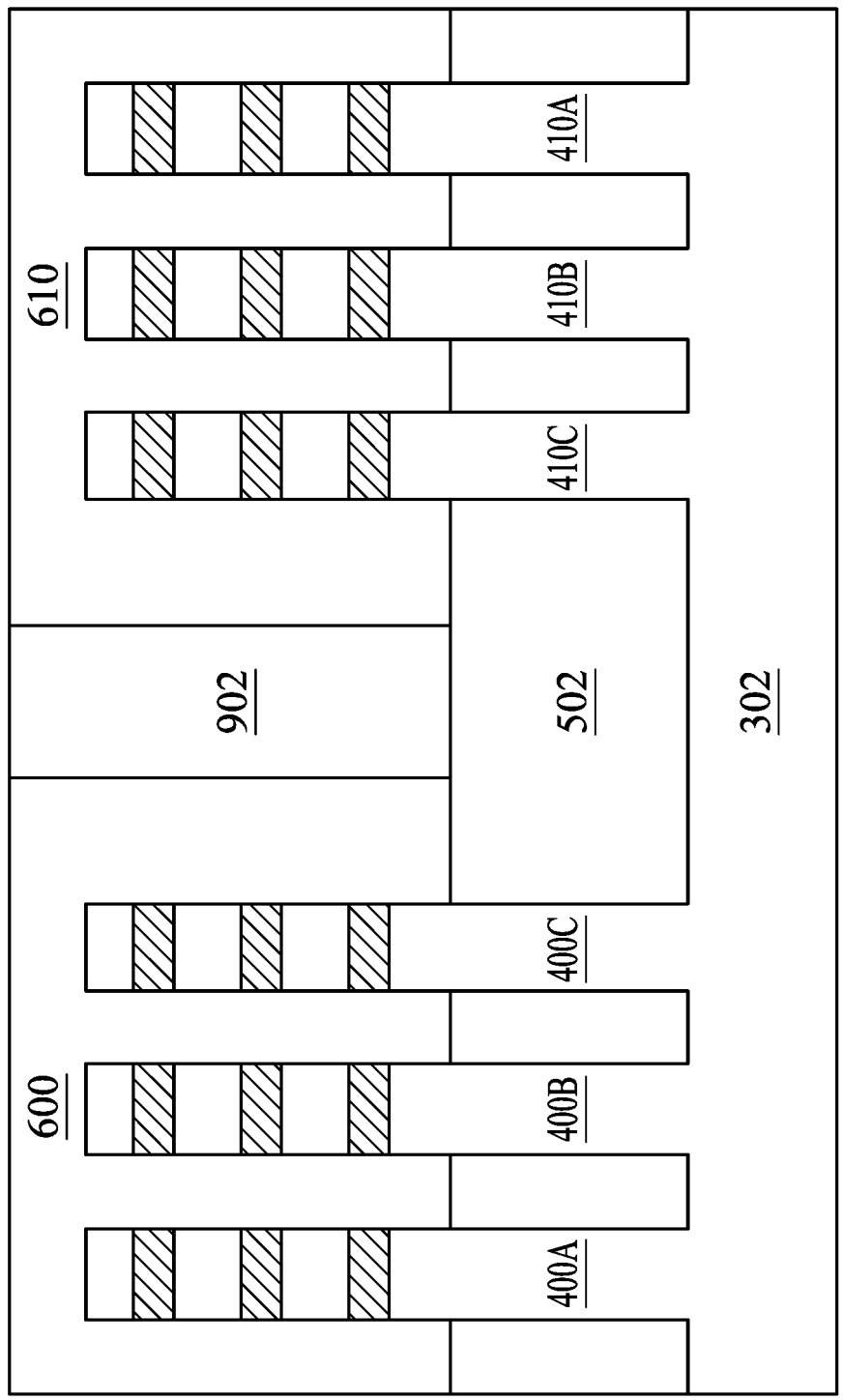
Figure 9C:
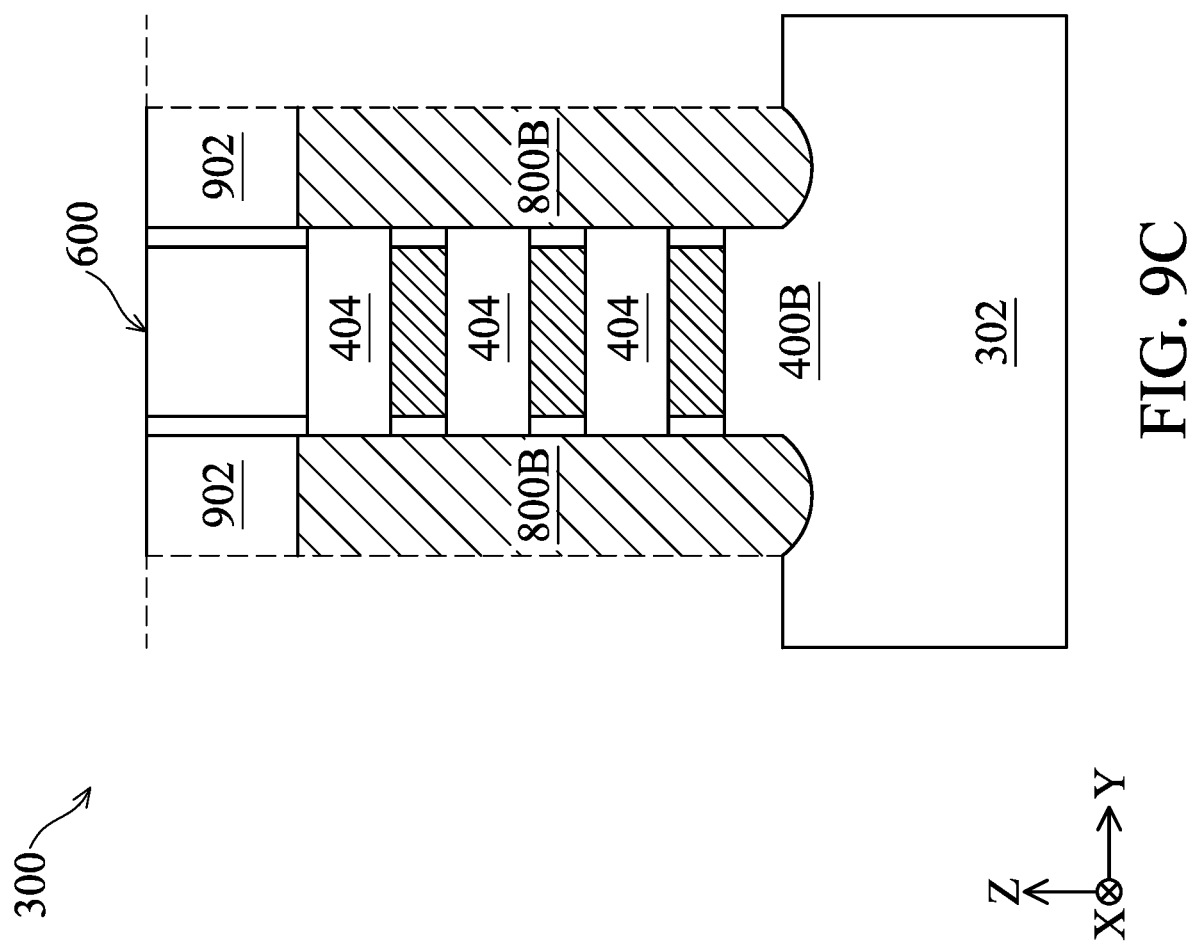

Corresponding to operation 214 of FIG. 2, FIG. 9A is a top view of the GAA FET device 300 including an interlayer dielectric (ILD) 902, at one of the various stages of fabrication. FIGS. 9B, 9C, and 9D are corresponding cross-sectional view of the GAA FET device 300. The cross-sectional view of FIG. 9B is cut in a direction along the lengthwise direction of an active/dummy gate structure of the GAA FET device 300 (e.g., cross-section B-B indicated in FIG. 1); the cross-sectional view of FIG. 9C is cut in a direction along the lengthwise direction of a non-edge fin structure of the GAA FET device 300 (e.g., cross-section A-A indicated in FIG. 1); and the cross-sectional view of FIG. 9D is cut in a direction along the lengthwise direction of an edge fin structure of the GAA FET device 300 (e.g., cross-section A-A indicated in FIG. 1). As representative examples, FIG. 9C is cut along a lengthwise direction of the fin structure 400B; and FIG. 9D is cut along a lengthwise direction of the fin structure 400C.

Upon forming the source/drain structures 800A-C and 810A-C, the ILD 902 can be formed by depositing a dielectric material in bulk over the workpiece, and polishing the bulk oxide back (e.g., using CMP) to the level of the dummy gate structures 600 and 610, as illustrated in FIGS. 9B-D. Specifically, the ILD 902 may overlay the source/drain structures formed in the non-edge and edge fin structures (see, e.g., FIGS. 11C-D). The dielectric material of ILD 902 includes silicon oxide, phosphosilicate glass (PSG), borosilicate glass (BSG), boron-doped phosphosilicate Glass (BPSG), undoped silicate glass (USG), or combinations thereof.

Figure 10A:
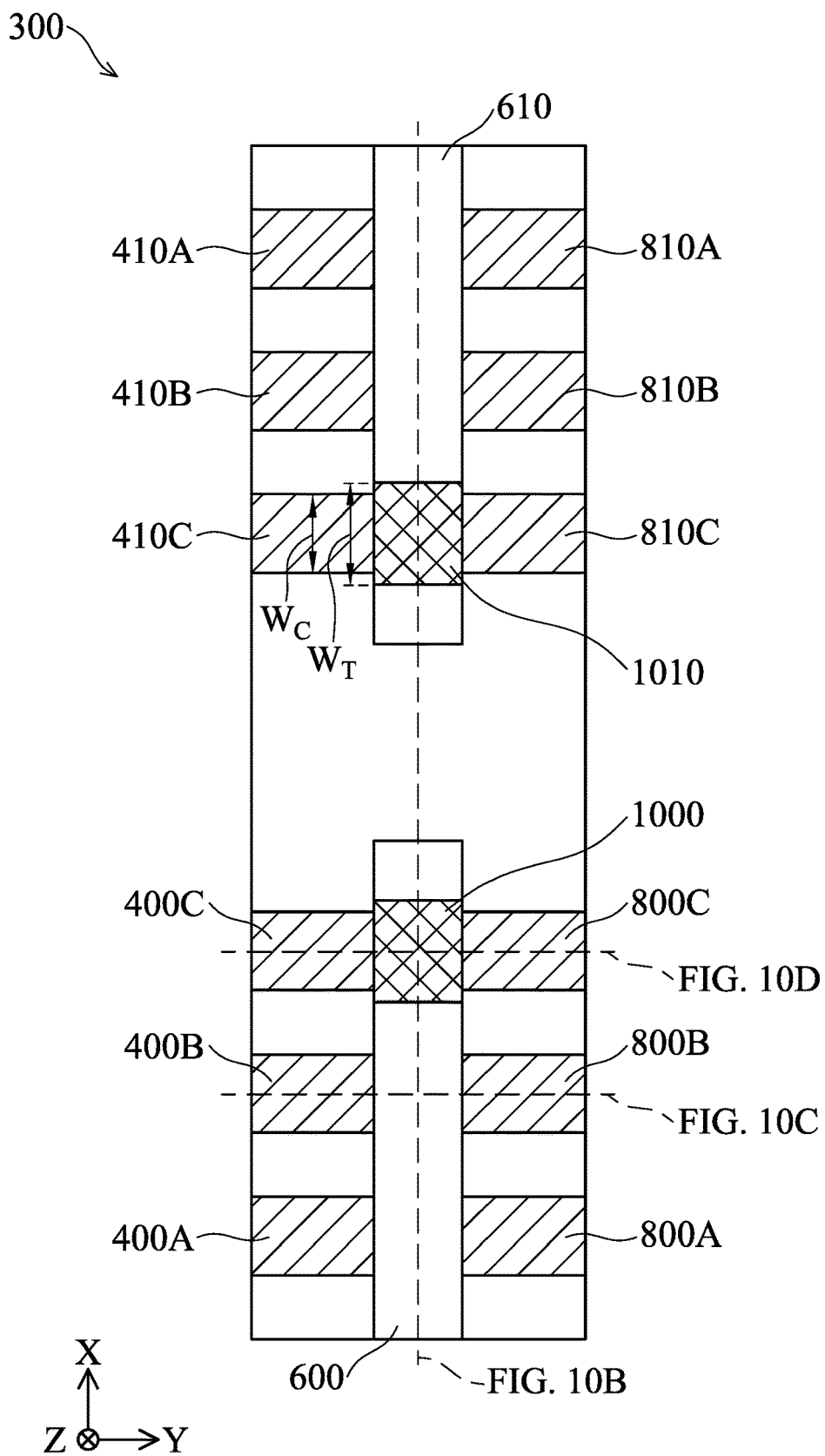
Figure 10B:
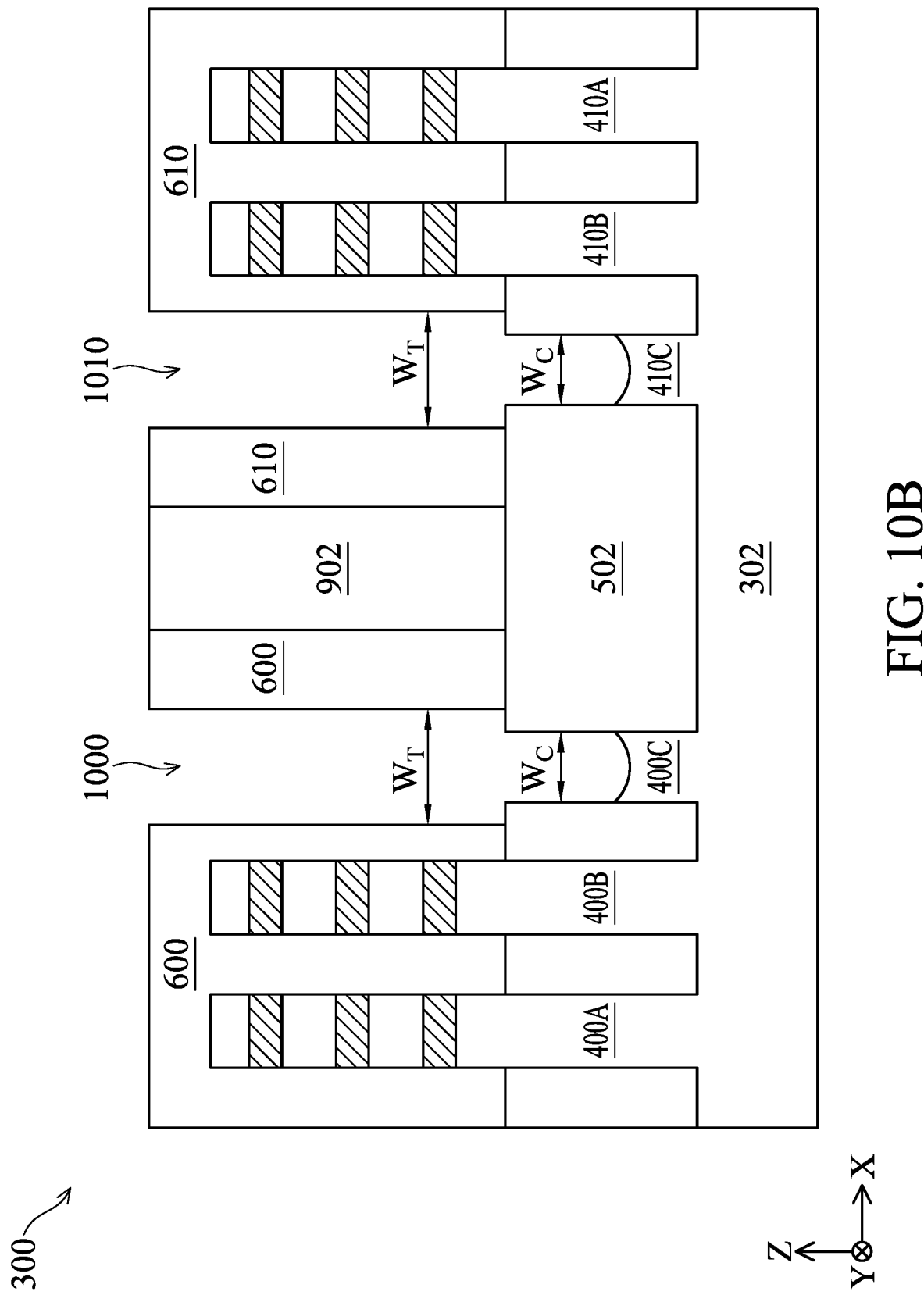
Figure 10C:
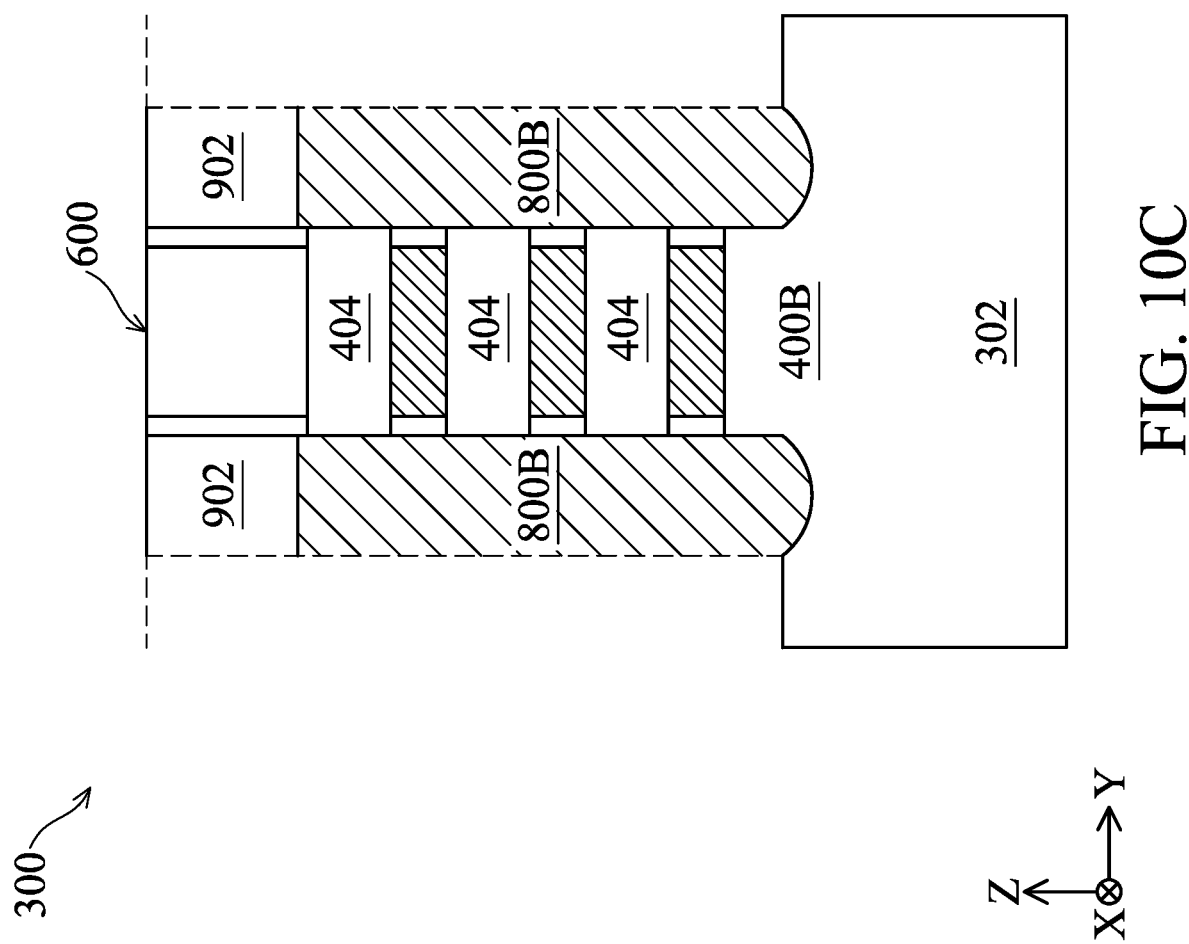

Corresponding to operation 216 of FIG. 2, FIG. 10A is a top view of the GAA FET device 300 including trenches 1000 and 1100, at one of the various stages of fabrication. FIGS. 10B, 10C, and 10D are corresponding cross-sectional view of the GAA FET device 300. The cross-sectional view of FIG. 10B is cut in a direction along the lengthwise direction of an active/dummy gate structure of the GAA FET device 300 (e.g., cross-section B-B indicated in FIG. 1); the cross-sectional view of FIG. 10C is cut in a direction along the lengthwise direction of a non-edge fin structure of the GAA FET device 300 (e.g., cross-section A-A indicated in FIG. 1); and the cross-sectional view of FIG. 10D is cut in a direction along the lengthwise direction of an edge fin structure of the GAA FET device 300 (e.g., cross-section A-A indicated in FIG. 1). As representative examples, FIG. 10C is cut along a lengthwise direction of the fin structure 400B; and FIG. 10D is cut along a lengthwise direction of the fin structure 400C.

To form the trench 1000, a portion of the edge fin structure 400C and a portion of the dummy gate structure 600 disposed thereon are removed (e.g., etched). Similarly, to form the trench 1010, a portion of the edge fin structure 410C and a portion of the dummy gate structure 610 disposed thereon are removed (e.g., etched). The trenches 1000 and 1010 may be concurrently formed. Specifically, the portions of the dummy gate structures 600 and 610 may first be removed to expose the edge fin structures 400C and 410C (e.g., the respective remaining portions), and then the semiconductor layers 402 and 404 of the edge fin structure 400C and the semiconductor layers 402 and 404 of the edge fin structure 410C are removed. The etching of the dummy gate structures and edge fin structures may include reactive ion etch (RIE), neutral beam etch (NBE), the like, or combinations thereof. The etching may be anisotropic.

As illustrated in the cross-sectional view of FIG. 10B, in addition to removing the semiconductor layers 402 and 404 of the edge fin structures 400C and 410C (and the portions of the dummy gate structures 600 and 610 disposed thereon, respectively), portions of the edge fin structures 400C and 410C that are under the top surface of the isolation structure 502 can be removed. As such, upper portions of the trenches 1000 and 1010 may have a width, $W_T$, extending along the X direction, and lower portions of the trenches 1000 and 1010 may have a width, extending along the X direction, equal to the width ($W_C$) of the fin structures. $W_T$ can be in the range of about 5 nm to about 120 nm. Referring again to FIG. 10A, the width $W_T$ may be greater than the width ($W_C$) of the fin structures, without any of its sides (e.g., inner sidewalls) aligned with the side of the edge fin structure (or the source/drain structure formed therein) along the Y direction. In some other embodiments, the width $W_T$ may be equal to the width $W_C$. In yet some other embodiments, while the $W_T$ is still greater than the width $W_C$, one side of the trench 1000 or 1010 can be aligned with the side of the edge fin structure (or the source/drain structure formed therein) along the Y direction.

In some embodiments, the trenches 1000/1010 can extend into the substrate 302 by a certain depth, $d_1$, as illustrated in FIG. 10D. The depth $d_1$ may be measured from the bottom surface of the source/drain structures (e.g., 800C) to a bottom surface of the trenches 1000/1010. Referring again to FIG. 10B, the trenches 1000/1010 may extend into the substrate 302 to have a bottom surface lower than a bottom surface of the isolation structure 502, in some other embodiments. Alternatively stated, the depth $d_1$ may be greater than a height of the isolation structure 502.

As better appreciated in the cross-sectional view of FIG. 10D, while removing the portion of the dummy gate structure 600 (and the portion of the dummy gate structure 610), the gate spacer 602 may function as a mask, which may remain after forming the trench 1000. While removing the semiconductor layers 402 and 404 in the edge fin structure 400C (and in the edge fin structure 410C), the inner spacer 710 and end portions of each semiconductor layer 404 that are vertically aligned with the inner spacer 710 may also remain.

Figure 10E:
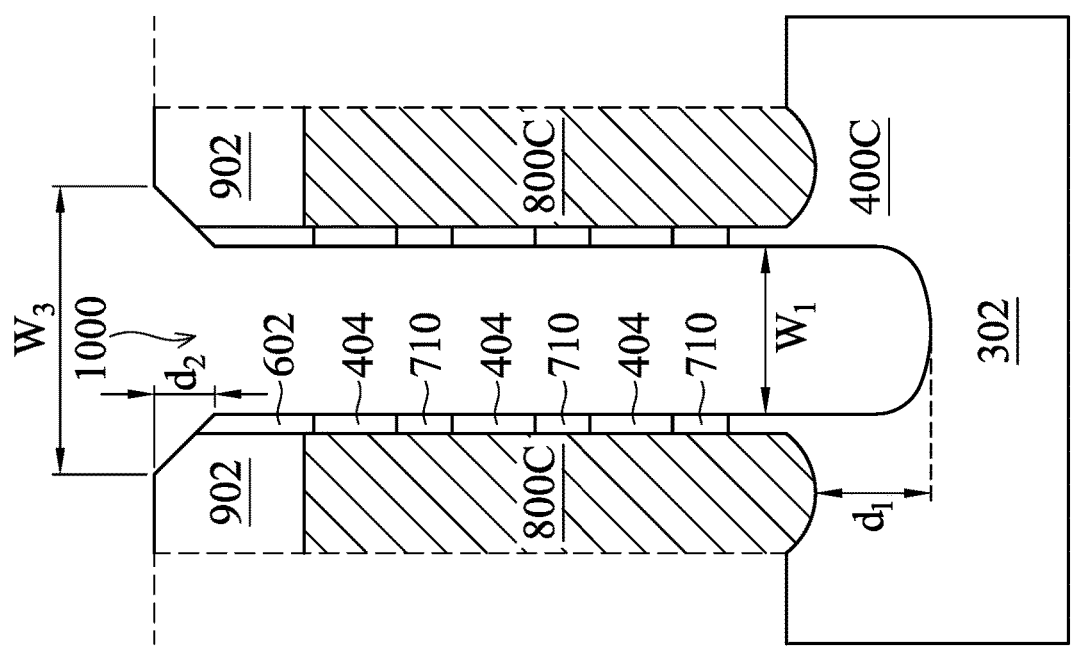

In some embodiments, the trench 1000 may have a width, extending along the Y direction, that is about equal to the width ($W_1$) of the dummy gate structure 600, as illustrated in FIG. 10D. Similarly, the trench 1010 may have a width, extending along the Y direction, that is about equal to the width ($W_2$) of the dummy gate structure 610. In some other embodiments, when forming the trenches 1000/1010, portions of the gate spacer and portions of the ILD 902 may be etched such that the trench may have multiple widths along the Y direction, e.g., as illustrated in FIG. 10E. For example, upper corner portions of the gate spacer 602 and upper corner portions of the ILD 902 may be etched. Thus, the trench 1000 can include a tapered portion that has a varying width, along the Y direction, that changes from $W_3$ to $W_1$. The tapered portion of the trench 1000 can extend toward the substrate 302 by a depth, $d_2$.

Figure 10F:
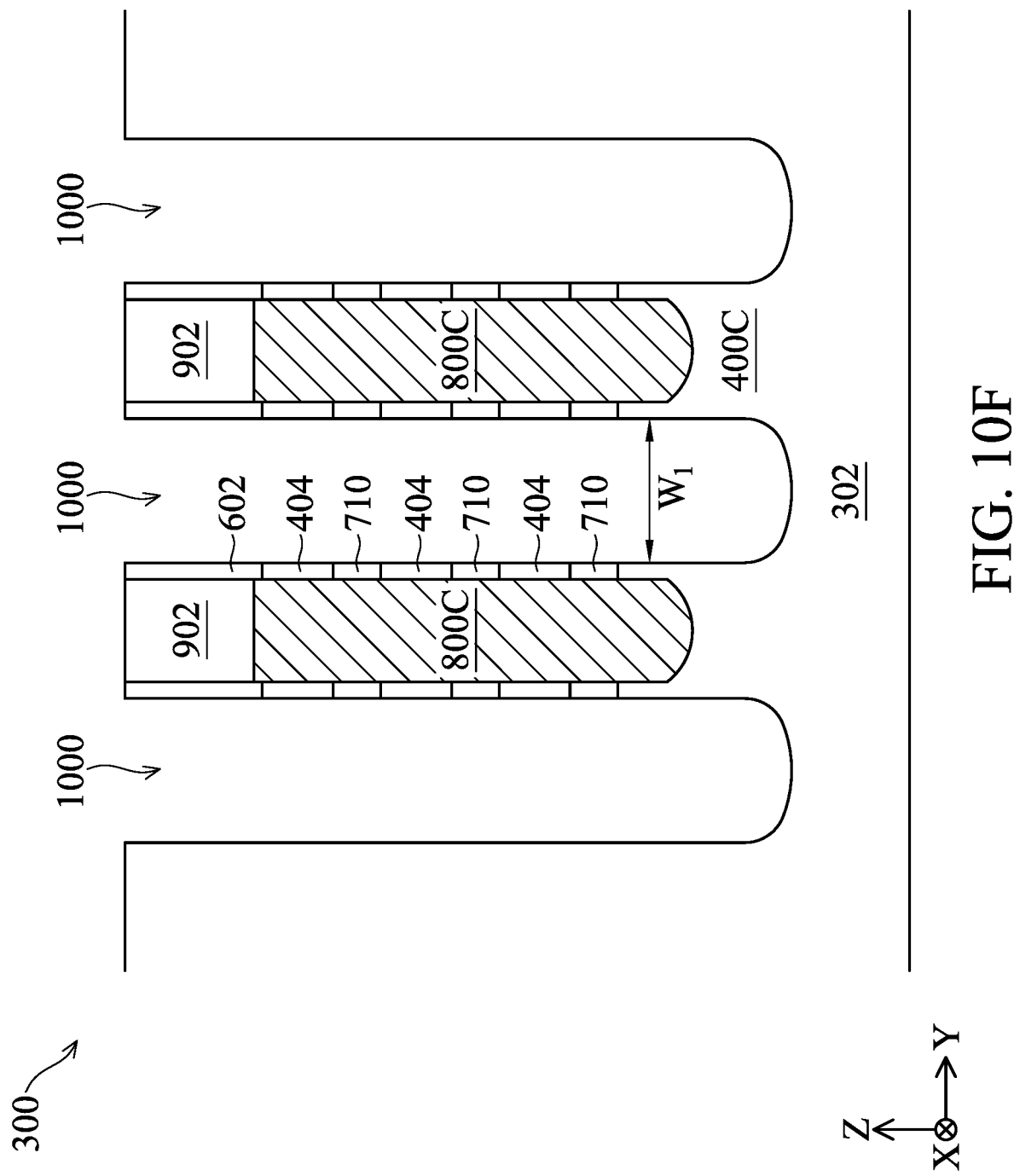
Figure 10G:
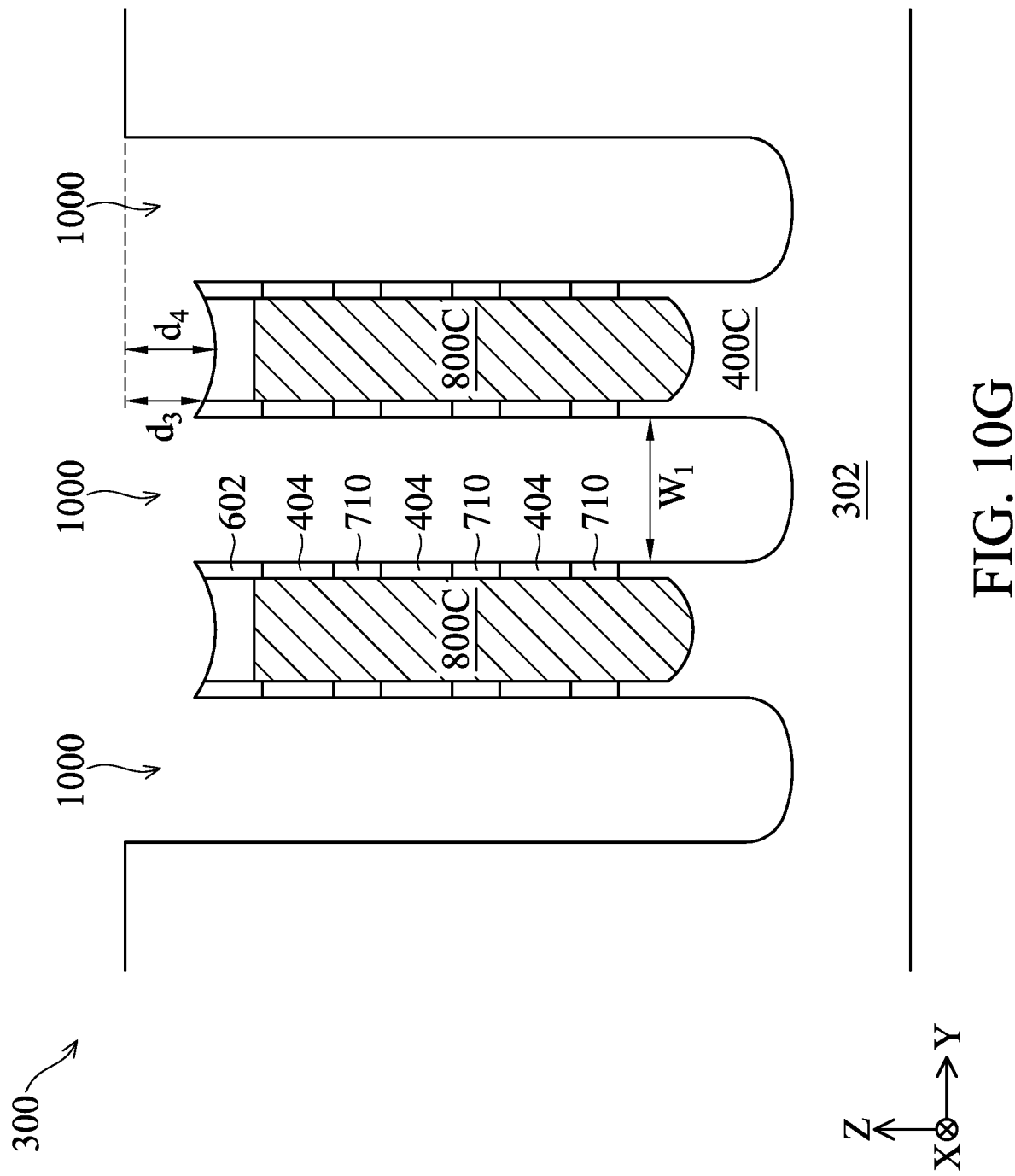

The trench formed in an edge fin structure may be repeated along the edge fin structure. For example, as illustrated in FIG. 10F, a number of the trenches 1000 can be formed in the edge fin structure 400C. Each of the trenches 1000 may be spaced from each other by a respective source/drain structure 800C. Alternatively or additionally, when forming multiple trenches along the same fin structure, upper portions of the gate spacer 602 and upper portions of the ILD 902 may be etched, as illustrated in FIG. 10G. Each of the etched portions of the gate spacer 602 and the ILD 902 may extend toward the substrate 302 by depths, $d_3$ and $d_4$, respectively. $d_3$ and $d_4$ may each range from about 0 nm to about 50 nm.

Figure 11A:
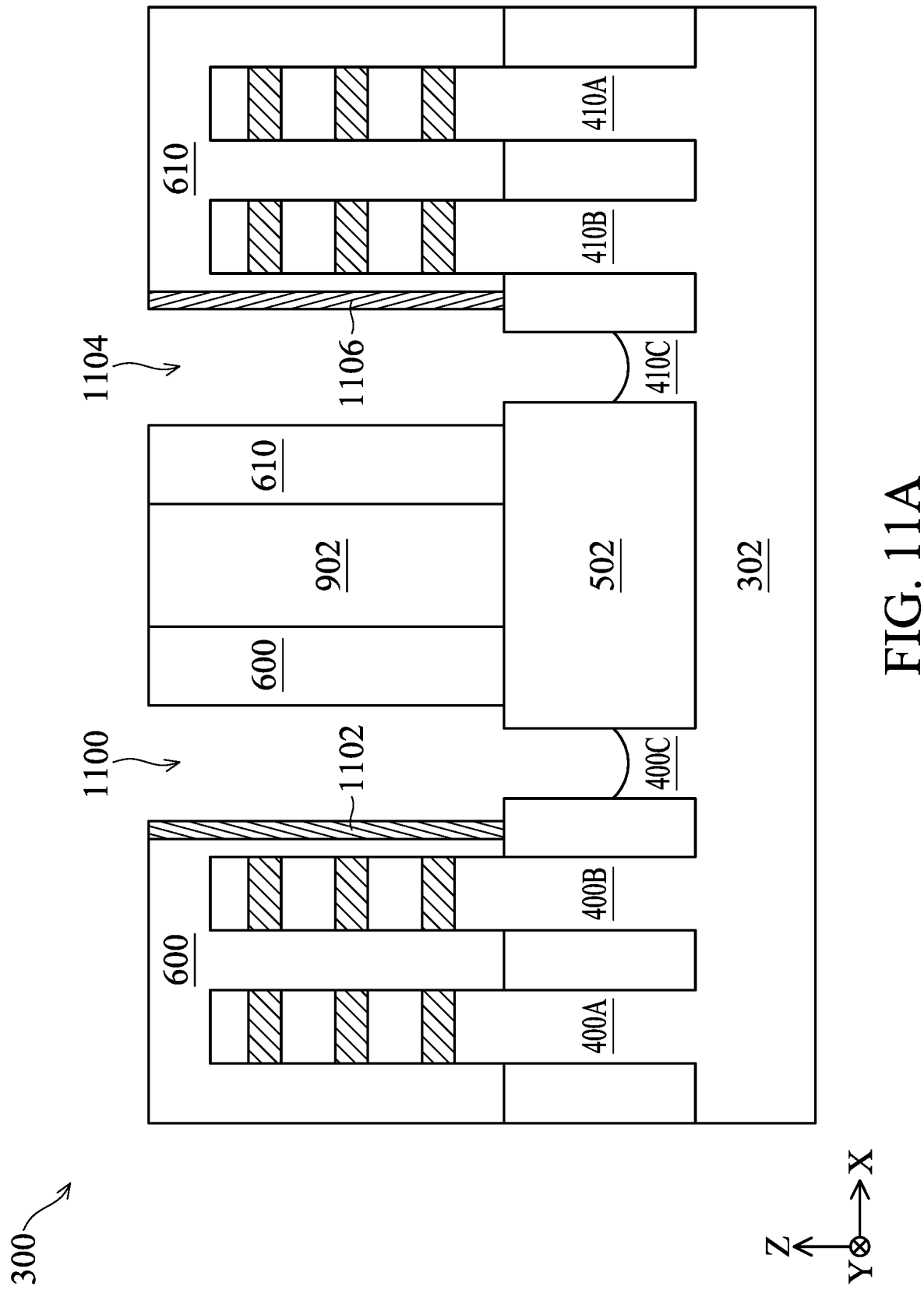

FIGS. 11A, 11B, 11C, 11D, 11E, 11F, and 11G respectively illustrate various other examples of trenches that replace the respective portions of the edge fin structures of the GAA FET device 300, in accordance with various embodiments. Referring first to FIG. 11A, the GAA FET device 300 includes trenches 1100 and 1104 that replace respective portions (e.g., the semiconductor layers 402 and 404) of the edge fin structures 400C and 410C, respectively. The trench 1100 is formed between the remaining portion of the dummy gate structure 600 on one side of the ILD 902 and a dummy fin structure 1102; and the trench 1104 is formed between the remaining portion of the dummy gate structure 610 on the other side of the ILD 902 and a dummy fin structure 1106. Steps of forming the dummy fin structures 1102 and 1106 may be similar to the formation of the dummy fin structure 510 (as described with respect to FIGS. 5B-D). For example, the dummy fin structures 1102 and 1106 may be formed prior to the formation of the dummy gate structures 600 and 610. By forming such a dummy fin structure between the edge fin structure and the non-edge fin structure, the non-edge fin structure can be further protected by the dummy fin structure when etching the edge fin structure.

Figure 11B:
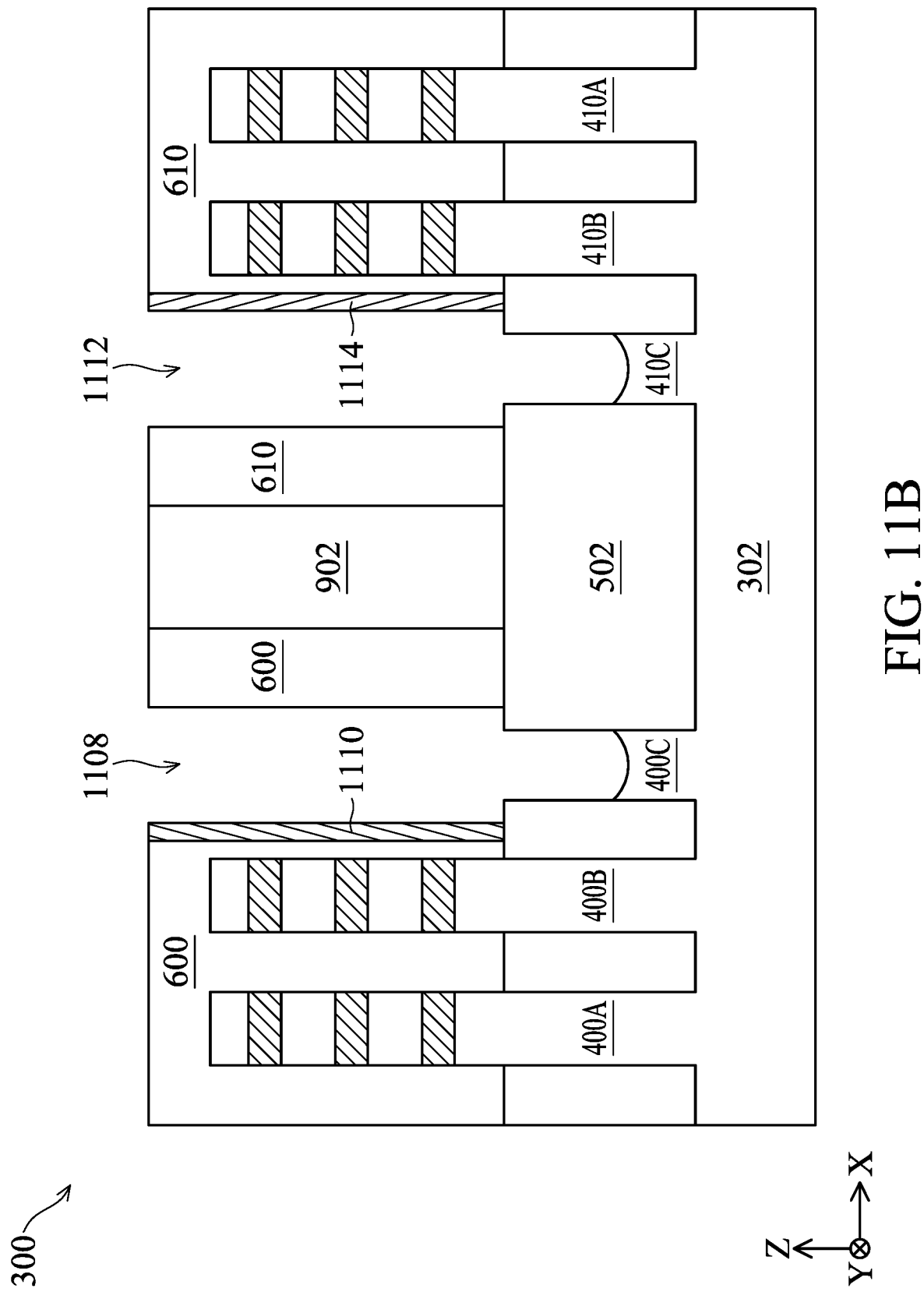

Referring to FIG. 11B, the GAA FET device 300 includes trenches 1108 and 1112 that replace respective portions (e.g., the semiconductor layers 402 and 404) of the edge fin structures 400C and 410C, respectively. The trench 1108 is formed between the remaining portion of the dummy gate structure 600 on one side of the ILD 902 and a dielectric structure 1110; and the trench 1112 is formed between the remaining portion of the dummy gate structure 610 on the other side of the ILD 902 and a dielectric structure 1114. The dielectric structures 1110 and 1114 may be formed subsequently to the formation of the dummy gate structures 600 and 610. For example, upon forming the dummy gate structures 600 and 610, a portion of the dummy gate structure 600 disposed between the edge fin structure 400C and the non-edge fin structure 400B and a portion of the dummy gate structure 610 disposed between the edge fin structure 410C and the non-edge fin structure 410B may be concurrently removed, and then filled with a dielectric material. By forming such a dielectric structure between the edge fin structure and the non-edge fin structure, the non-edge fin structure can be further protected by the dielectric structure when etching the edge fin structure.

Figure 11C:
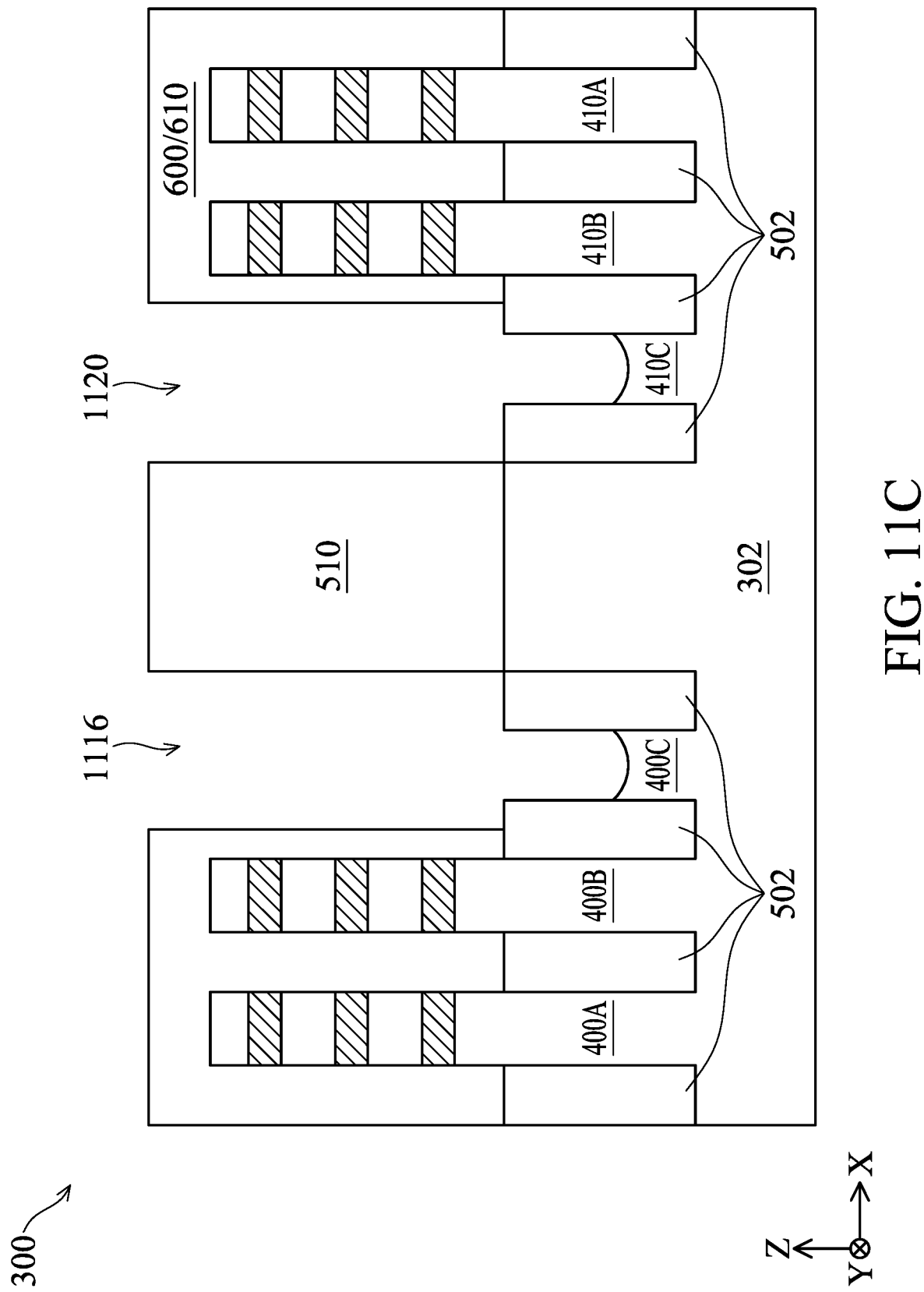

Referring to FIG. 11C, the dummy gate structures 600 and 610 may be integrally formed as a single piece, e.g., the single dummy gate structure 600/610 of FIG. 6E. Further, prior to forming the single dummy gate structure 600/610, the dummy fin structure 510 may be formed between the edge fin structures 400C and 410C. In such embodiments, the GAA FET device 300 can include trenches 1116 and 1120. Formation of the trenches 1116 and 1120 is similar to forming the above-discussed trenches. Thus, formation of the trenches 1116 and 1120 are not repeated here. However, it should be noted that sides (inner sidewalls) of each of the trenches 1116 and 1120 are defined by the dummy fin structure 510 and the etched single dummy gate structure 600/610. For example, the inner sidewalls of the trench 1116 are defined by one of the inner sidewalls of the single dummy gate structure 600/610 and one of the sidewalls of the dummy fin structure 510, respectively. Similarly, the inner sidewalls of the trench 1120 are defined by the other of the inner sidewalls of the single dummy fin structure 600/610 and the other of the sidewalls of the dummy fin structure 510, respectively.

Figure 11D:
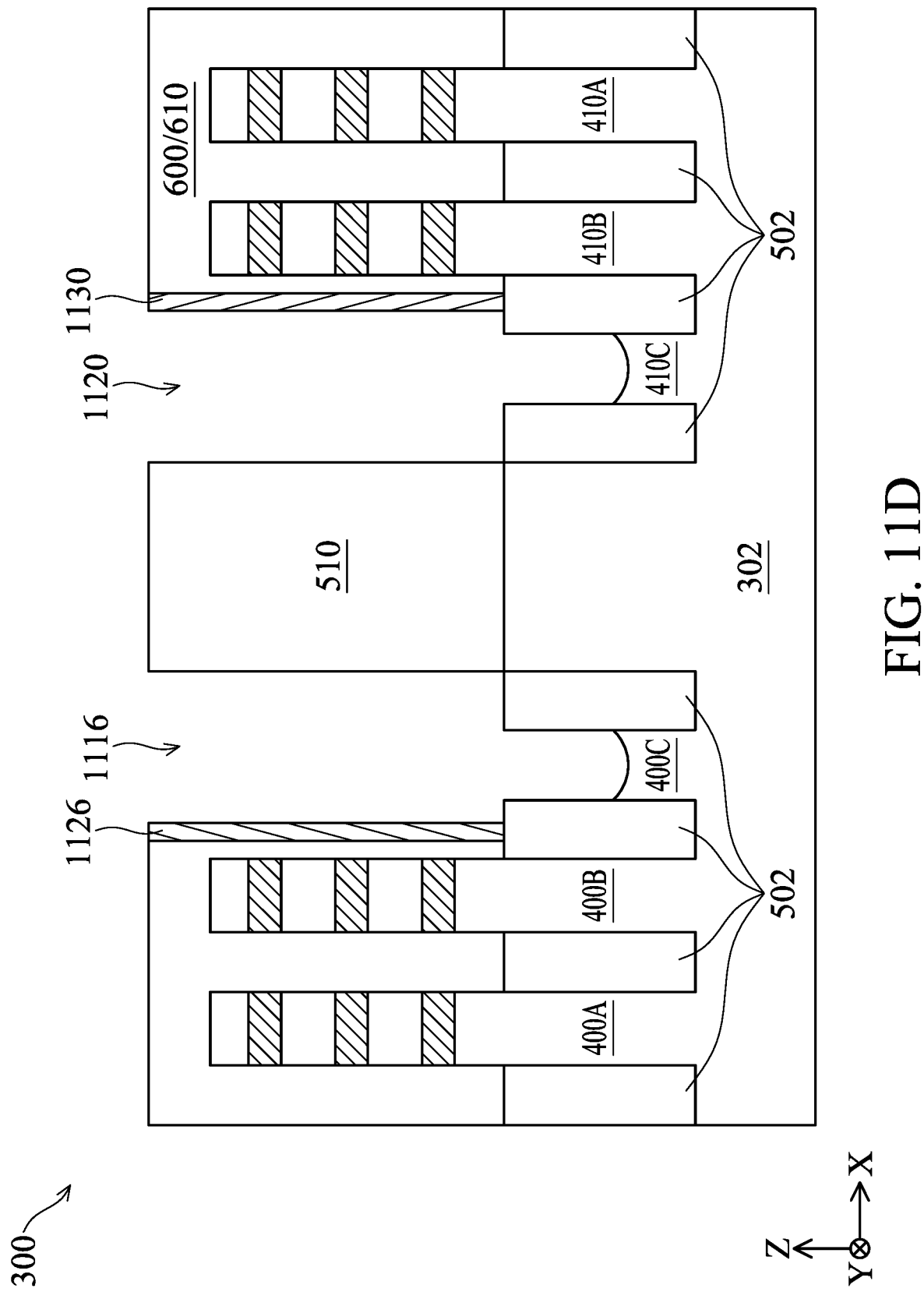

In some other embodiments, the inner sidewalls of each of the trenches 1116 and 1120 may be defined by the respective sidewalls of two adjacent dummy fin structures, as illustrated in FIG. 11D. For example, the inner sidewalls of the trench 1116 are defined by one of the sidewalls of a dummy fin structure 1126 and one of the sidewalls of the dummy fin structure 510, respectively. Similarly, the inner sidewalls of the trench 1120 are defined by one of the sidewalls of a dummy fin structure 1130 and one of the sidewalls of the dummy fin structure 510, respectively. The dummy fin structures 1126 and 1130 may be formed prior to the formation of the single dummy gate structure 600/610. By forming such a dummy fin structure between the edge fin structure and the non-edge fin structure, the non-edge fin structure can be further protected by the dummy fin structure when etching the edge fin structure.

Figure 11E:
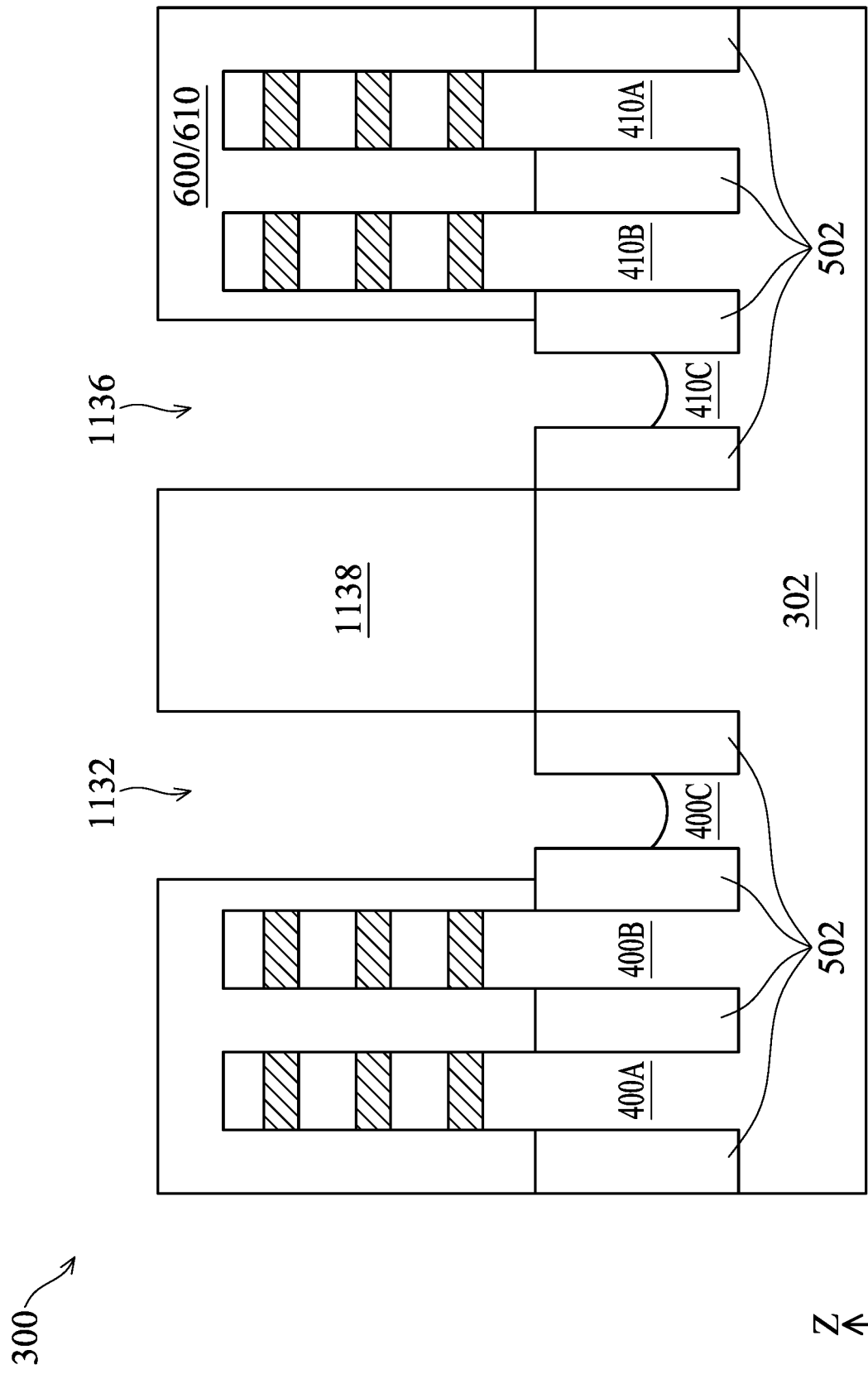

Referring to FIG. 11E, the GAA FET device 300 includes trenches 1132 and 1136 that are formed similarly to the above-described trenches. However, it should be understood that the trench 1132 is formed between a first remaining portion of the single dummy gate structure 600/610 and a dielectric structure 1138; and the trench 1136 is formed between a second remaining portion of the single dummy gate structure 600/610 and the dielectric structure 1138. The dielectric structure 1138 may be formed subsequently to the formation of the single dummy gate structure 600/610 and prior to etching the edge fin structures 400C and 410C. For example, upon forming the single dummy gate structure 600/610, a portion of the single dummy gate structure 600/610 disposed between the edge fin structure 400C and the edge fin structure 410C is removed, and then filled with a dielectric material. Consequently, the inner sidewalls of the trench 1132 are defined by one of the inner sidewalls of the single dummy gate structure 600/610 and one of the sidewalls of the dielectric structure 1138, respectively. Similarly, the inner sidewalls of the trench 1136 are defined by the other of the inner sidewalls of the single dummy fin structure 600/610 and the other of the sidewalls of the dielectric structure 1138, respectively.

Figure 11F:
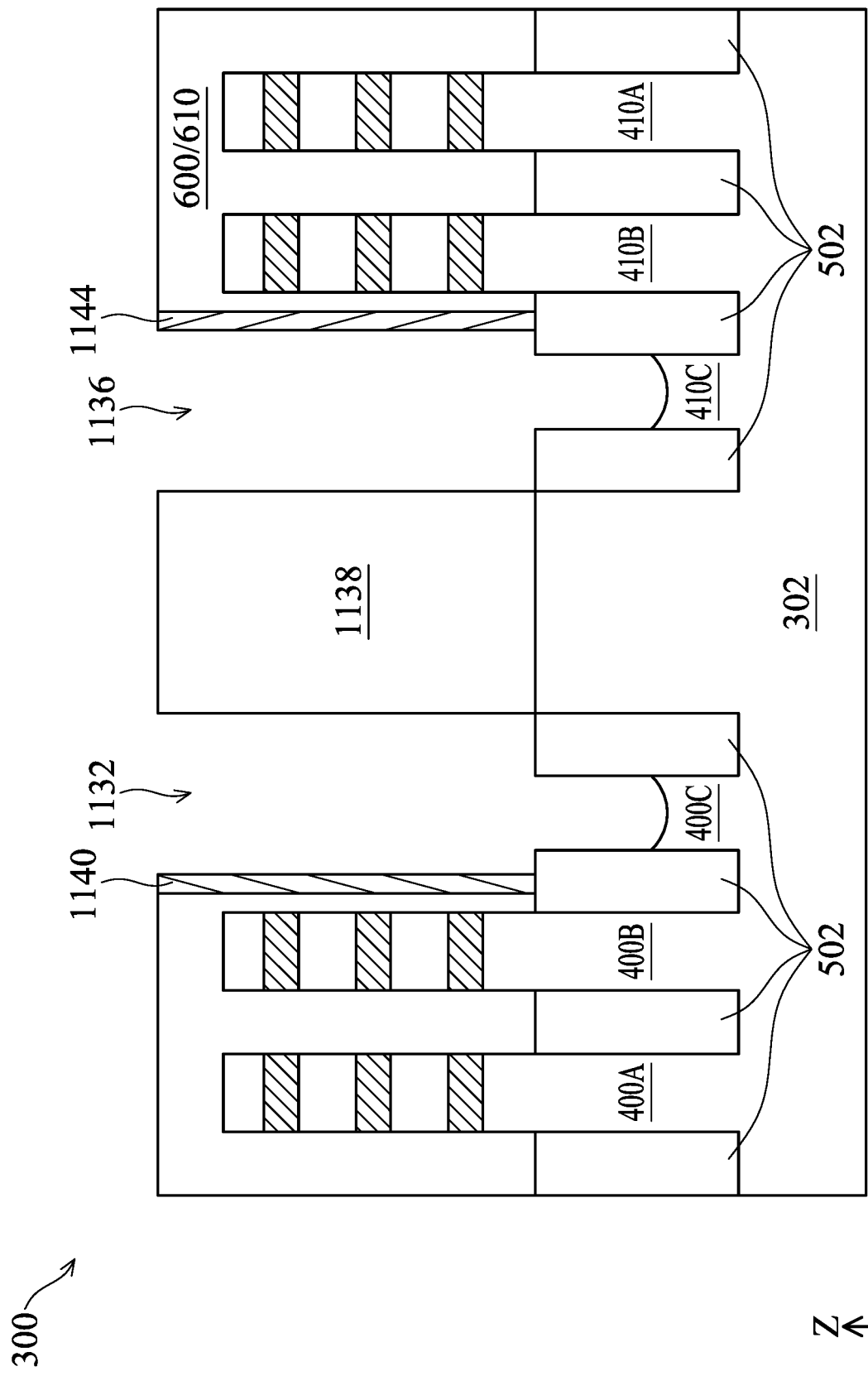

In some other embodiments, the inner sidewalls of each of the trenches 1132 and 1136 may be defined by the sidewall of a respective dummy fin structure and one of the sidewalls of the dielectric structure 1138, as illustrated in FIG. 11F. For example, the inner sidewalls of the trench 1132 are defined by one of the sidewalls of a dummy fin structure 1140 and one of the sidewalls of the dielectric structure 1138, respectively. Similarly, the inner sidewalls of the trench 1136 are defined by one of the sidewalls of a dummy fin structure 1144 and the other of the sidewalls of the dielectric structure 1138, respectively. The dummy fin structures 1140 and 1144 may be formed prior to the formation of the single dummy gate structure 600/610. By forming such a dummy fin structure between the edge fin structure and the non-edge fin structure, the non-edge fin structure can be further protected by the dummy fin structure when etching the edge fin structure.

Figure 11G:
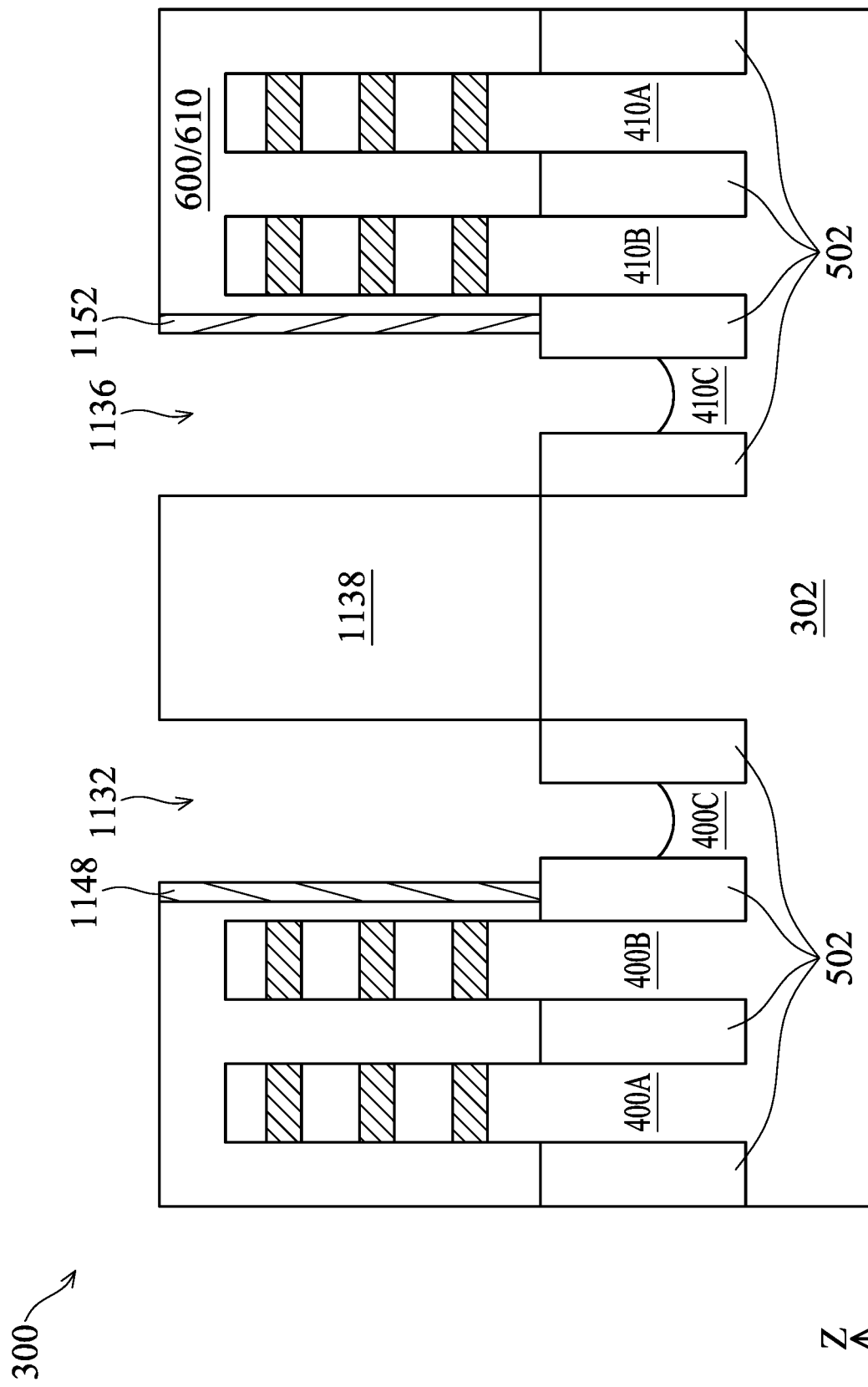

In some other embodiments, the inner sidewalls of each of the trenches 1132 and 1136 may be defined by the sidewall of a respective dielectric structure and one of the sidewalls of the dielectric structure 1138, as illustrated in FIG. 11G. For example, the inner sidewalls of the trench 1132 are defined by one of the sidewalls of a dielectric structure 1148 and one of the sidewalls of the dielectric structure 1138, respectively. Similarly, the inner sidewalls of the trench 1136 are defined by one of the sidewalls of a dielectric structure 1152 and the other of the sidewalls of the dielectric structure 1138, respectively. The dielectric structures 1148 and 1152 may be formed subsequently to the formation of the single dummy gate structure 600/610. For example, upon forming the single dummy gate structure 600/610, a portion of the single dummy gate structure 600/610 disposed between the edge fin structure 400C and the non-edge fin structure 400B and a portion of the single dummy gate structure 600/610 disposed between the edge fin structure 410C and the non-edge fin structure 410B may be concurrently removed, and then filled with a dielectric material. In some embodiments, the dielectric structures 1138, 1148, and 1152 may be concurrently formed. By forming such a dielectric structure between the edge fin structure and the non-edge fin structure, the non-edge fin structure can be further protected by the dielectric structure when etching the edge fin structure.

Figure 12:
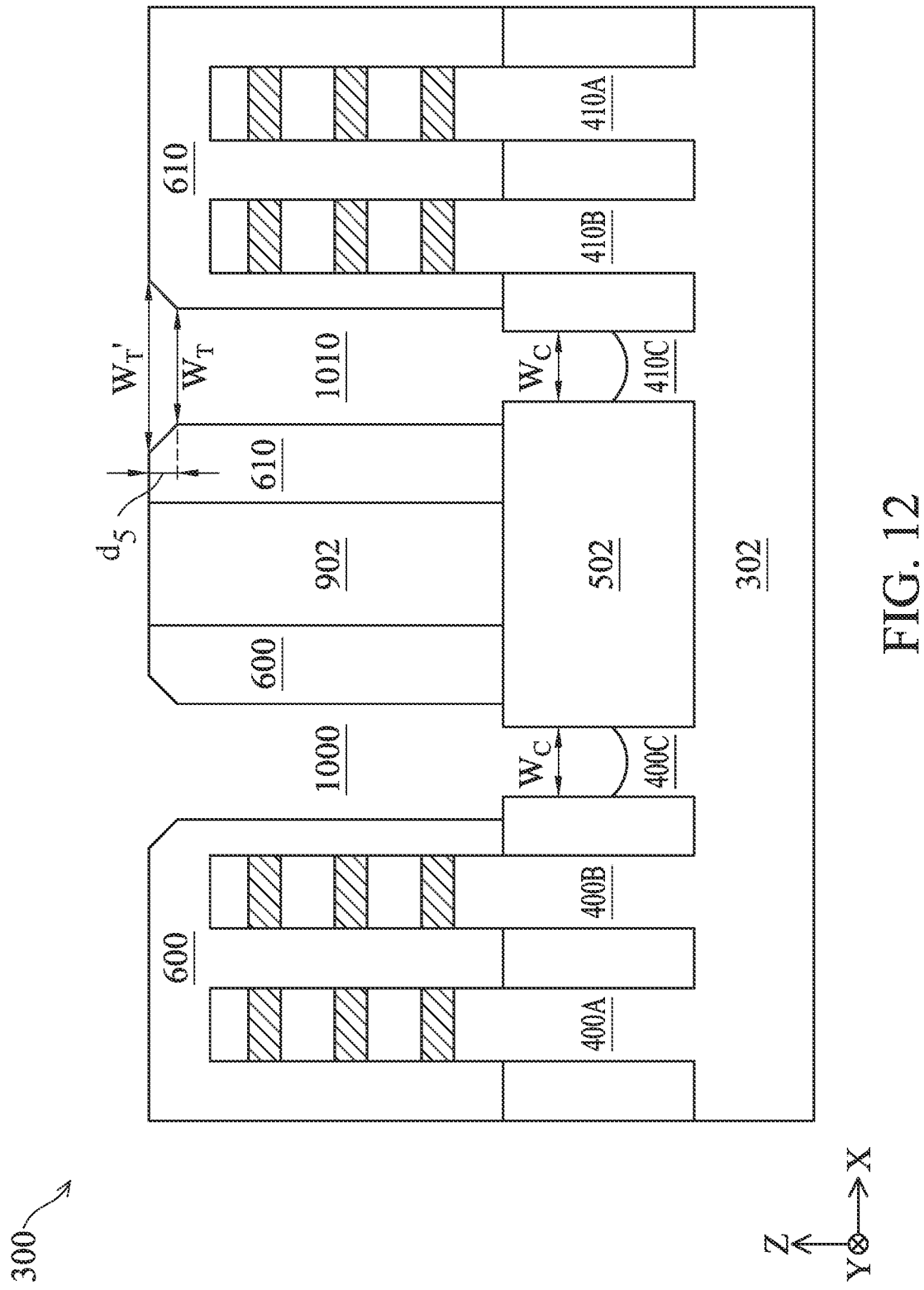

Alternatively or additionally, when forming the trenches that remove the edge fin structures, each of the trenches may be formed to have a tapered portion that has a varying width. Referring to FIG. 12 where the trenches 1000 and 1010 are formed between remaining portions of the dummy gate structure 600 and remaining portions of the dummy gate structure 610, respectively (similar to FIG. 10B), each of the trenches 1000 and 1010 has a tapered portion, with a varying width that changes from $W_T'$ to $W_T$, and extends toward the substrate 302 by a depth, $d_5$. $d_5$ can range from about 0 nm to about 50 nm. It should be appreciated that FIG. 12 is illustrated as a representative example showing that the trenches (formed by etching the edge fin structures) can each have a tapered portion along the X direction. In such an example, the tapered portion of the trench 1000 may have one side present at an upper corner portion of a first remaining portion of the dummy gate structure 600, and the other side present at an upper corner portion of a second remaining portion of the dummy gate structure 600 that extends along the sidewall of the ILD 902. In another example where a dummy fin structure is formed between the edge and non-edge fin structures (e.g., FIG. 11A), the trench 1100 may have one side present at an upper corner portion of the dummy fin structure 1102, and the other side present at an upper corner portion of a remaining portion of the dummy gate structure 600 that extends along the sidewall of the ILD 902. In the above example where no dummy gate structure 600 remains along the sidewall of the ILD 902, the trench 1100 may have one side present at an upper corner portion of the dummy fin structure 1102, and the other side present at an upper corner portion of the ILD 902.

Figure 13A:
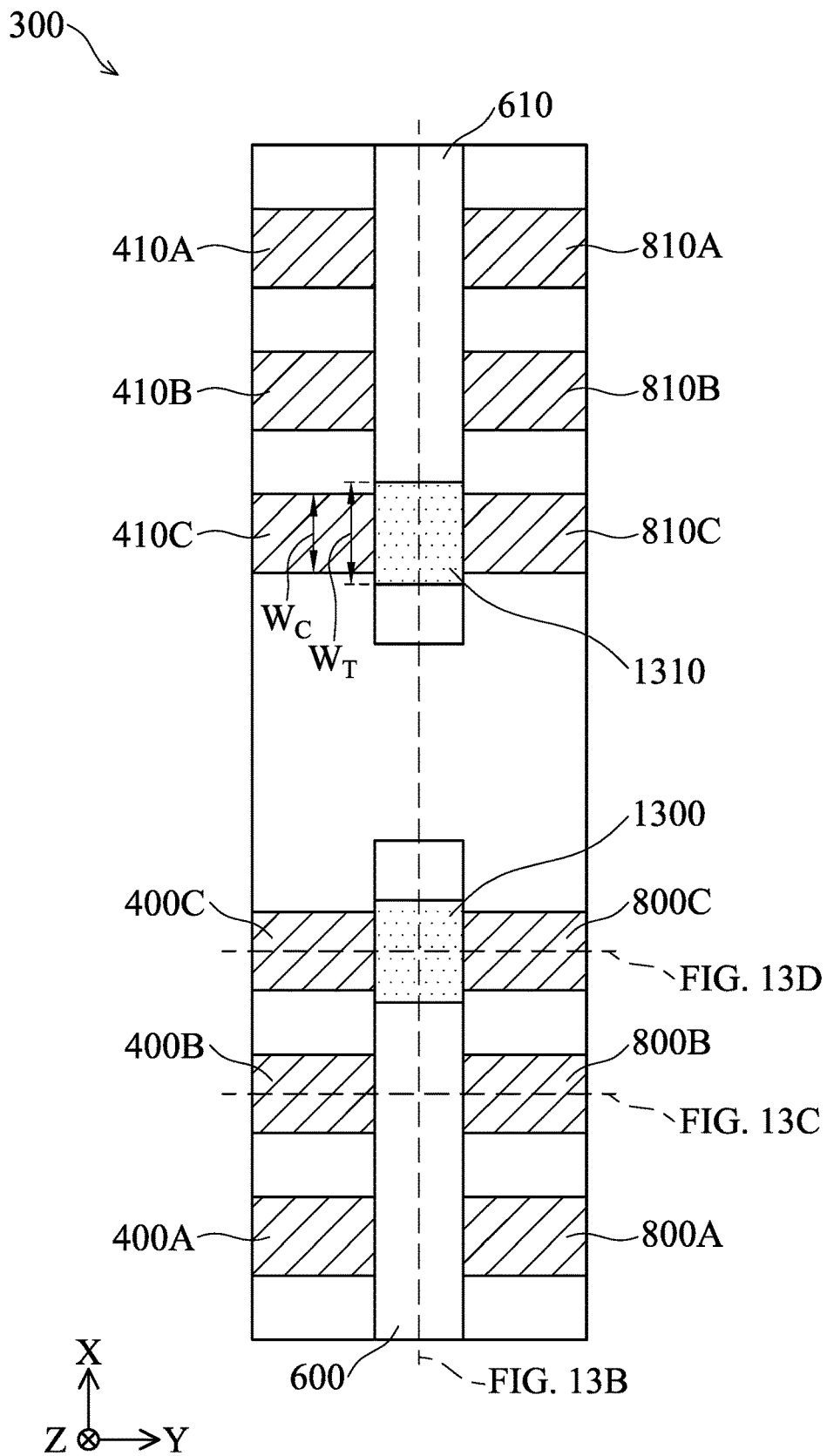
Figure 13B:
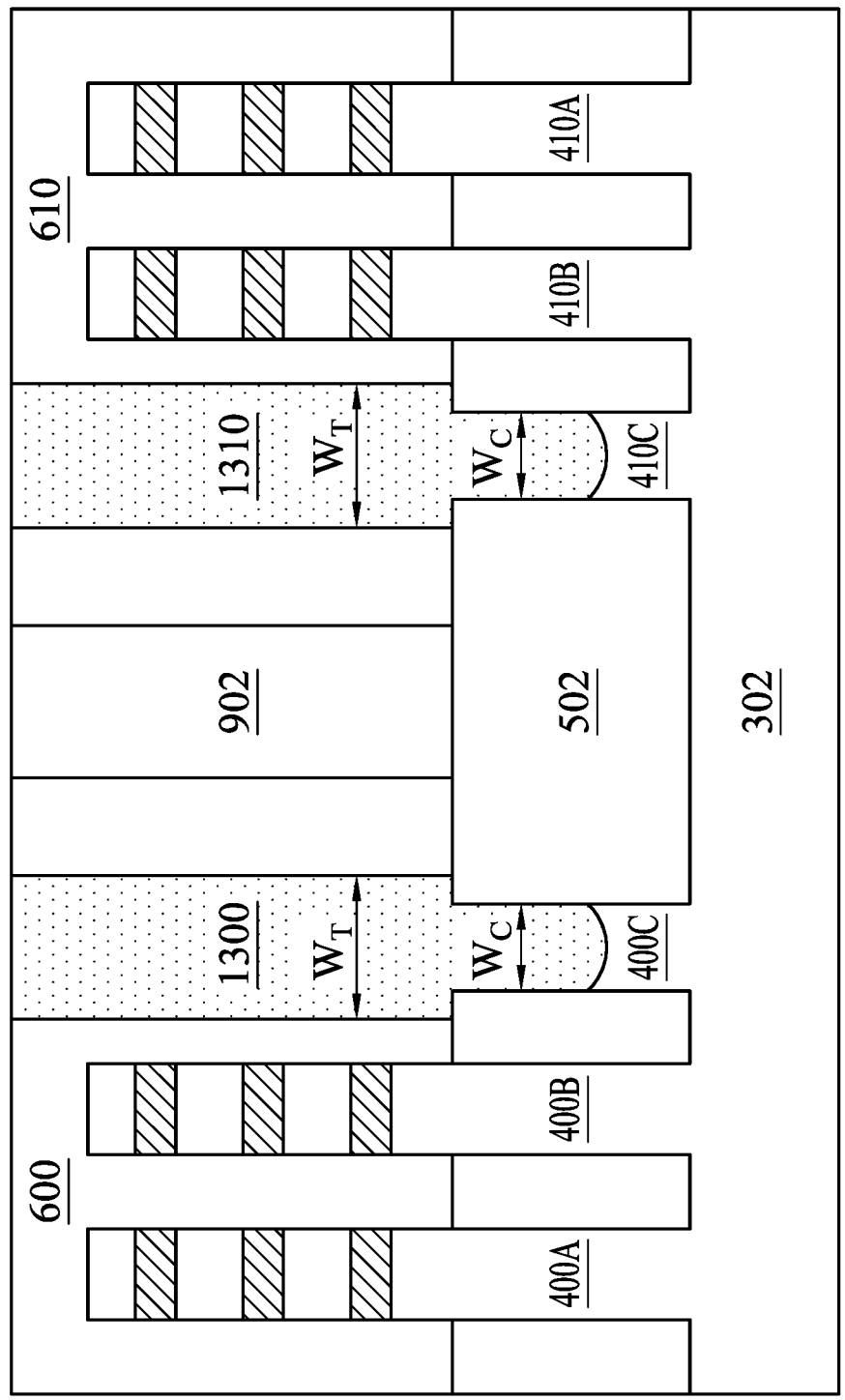
Figure 13C:
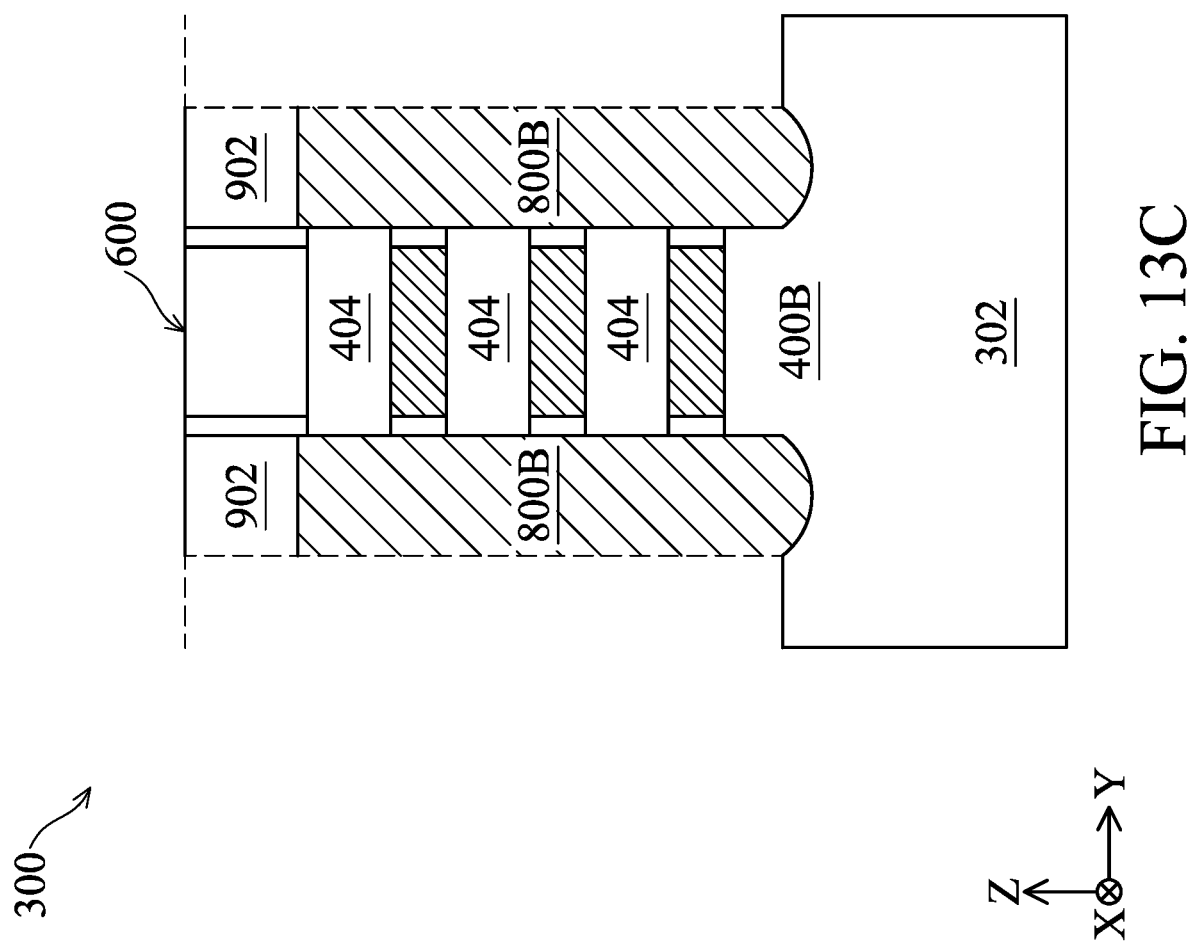
Figure 13D:
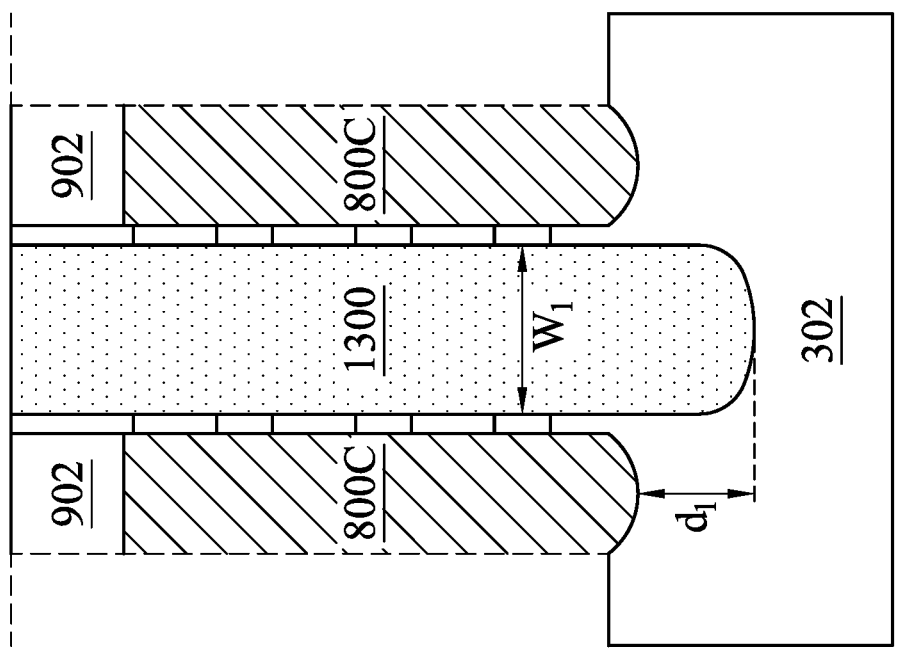

Corresponding to operation 218 of FIG. 2, FIG. 13A is a top view of the GAA FET device 300 including dielectric trenches 1300 and 1310, at one of the various stages of fabrication. FIGS. 13B, 13C, and 13D are corresponding cross-sectional view of the GAA FET device 300. The cross-sectional view of FIG. 13B is cut in a direction along the lengthwise direction of an active/dummy gate structure of the GAA FET device 300 (e.g., cross-section B-B indicated in FIG. 1); the cross-sectional view of FIG. 13C is cut in a direction along the lengthwise direction of a non-edge fin structure of the GAA FET device 300 (e.g., cross-section A-A indicated in FIG. 1); and the cross-sectional view of FIG. 13D is cut in a direction along the lengthwise direction of an edge fin structure of the GAA FET device 300 (e.g., cross-section A-A indicated in FIG. 1). As representative examples, FIG. 13C is cut along a lengthwise direction of the fin structure 400B; and FIG. 13D is cut along a lengthwise direction of the fin structure 400C.

As discussed above, the trenches (formed by etching the edge fin structures) can be configured in various embodiments. For purposes of clarity of illustration, the following discussions, which include filling the trenches with a dielectric material to form dielectric trenches, will be focused on the trenches 1000 and 1010, as discussed with respect to FIG. 10B. Any of other trenches (e.g., 1100 and 1104 in FIG. 11A, 1108 and 1112 in FIG. 11B, 1116 and 1120 in FIGS. 11C-D, 1132 and 1136 in FIGS. 11E-G, 1000 and 1010 in FIG. 12) can be filled with the similar dielectric material to form the dielectric trenches, as disclosed herein.

The dielectric trenches 1300 and 1310 may be formed by filling the trenches 1000 and 1010 with a dielectric material, respectively. The dielectric material can include one or more silicon-based dielectric materials such as, for example, silicon oxide, silicon nitride, silicon oxynitride, silicon carbide, silicon carbonitride, silicon oxycarbonitride, silicon oxycarbide, multilayers thereof, or combinations thereof, and may be deposited. In some other embodiments, the dielectric material can include one or more metal-based materials such as, for example, cobalt, tungsten, hafnium oxide, aluminum oxide, or combinations thereof, and may be deposited.

In some embodiments, the dielectric trenches 1300 and 1310 may inherit the dimensions and profiles of the trenches 1000 and 1010, respectively. For example, the dielectric trenches 1300/1310 can include an upper portion having a first width, extending along the X direction, that is about equal to $W_T$, and a lower portion having a second width, extending along the X direction, that is about equal to $W_C$. As shown in FIGS. 13A-B, $W_T$ is greater than $W_C$. However, $W_C$ may be equal to $W_T$, while remaining within the scope of the present disclosure. In another example in FIG. 13D, the dielectric trench 1300 can have a width, extending along the Y direction, that is about equal to $W_1$. Although not shown, it should be understood that the dielectric trench 1310 can have a width, extending along the Y direction, that is about equal to $W_2$.

By forming such dielectric trenches 1300 and 1310, the edge fin structures (e.g., 400C, 410C) can be inactivated, while the non-edge fin structures (e.g., 400A-B, 410A-B) can remain coupled to respective source/drain structures (i.e., remain activated). As illustrated in FIG. 13C, the semiconductor layers 404 of the non-edge fin structure 400B, which collectively function as a channel, are coupled to the source/drain structures 800B. The channel can conduct current flowing from one to the other of the source/drain structures 800B. As illustrated in FIG. 13D, although the source/drain structures 800C remain, the semiconductor layers 404 of the edge fin structure 400B (together with the semiconductor layers 402) are replaced with the dielectric trench 1300. As such, no current can flow from one to the other of the source/drain structures 800C. By having the edge fin structure, which is inactivated, adjacent a non-edge fin structure, which remains activated, the non-edge fin structure can experience less iso-dense loading effect. As such, a profile of the dummy gate structure can be precisely defined. Further, by "delaying" a timing to inactive the edge fin structure, the profile of the dummy gate structure can be well reserved. Thus, a metal gate structure, which will inherit the profile of the dummy gate structure, can be well formed. Accordingly, overall performance of the GAA FET device 300 can be significantly enhanced.

Figure 14A:
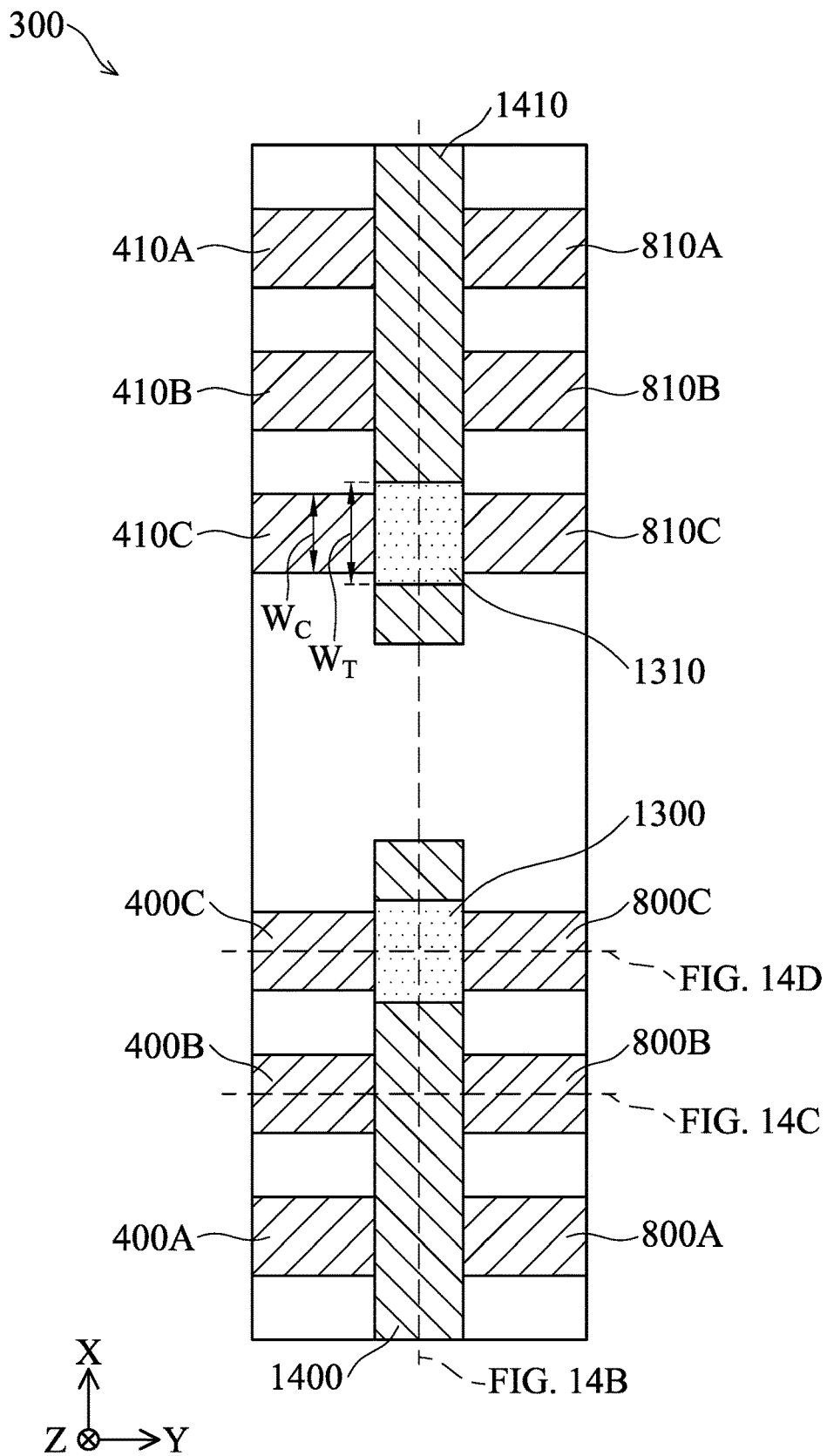
Figure 14B:
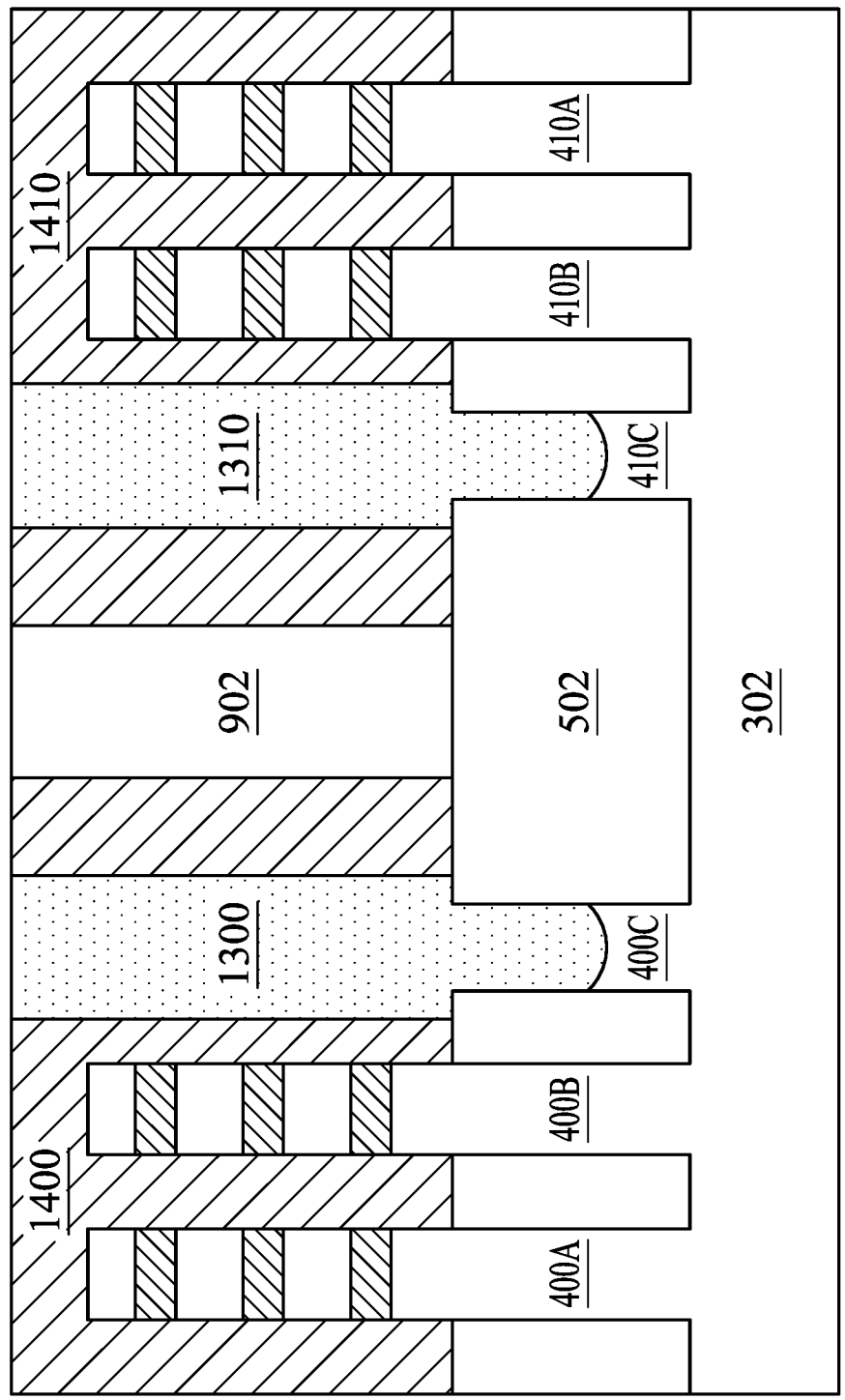
Figure 14C:
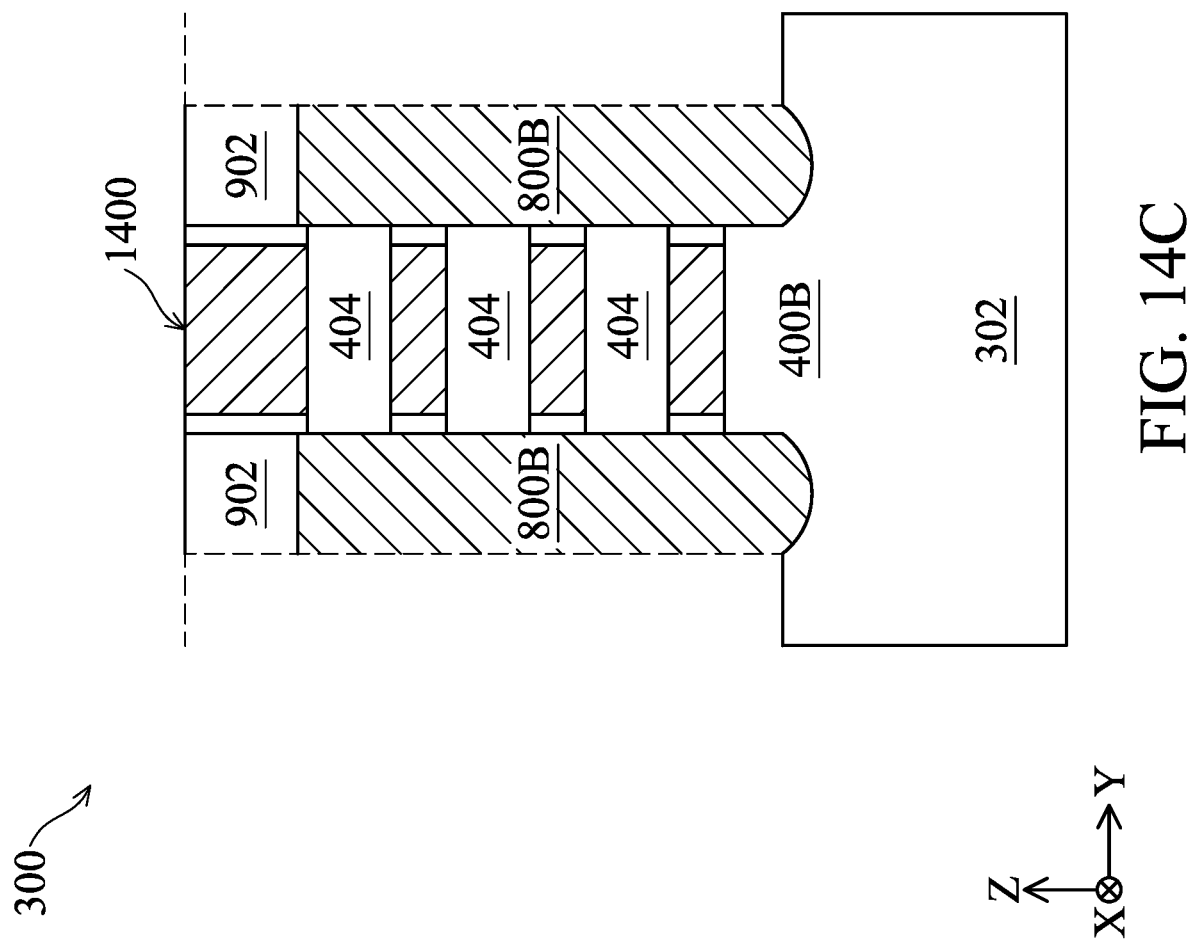
Figure 14D:
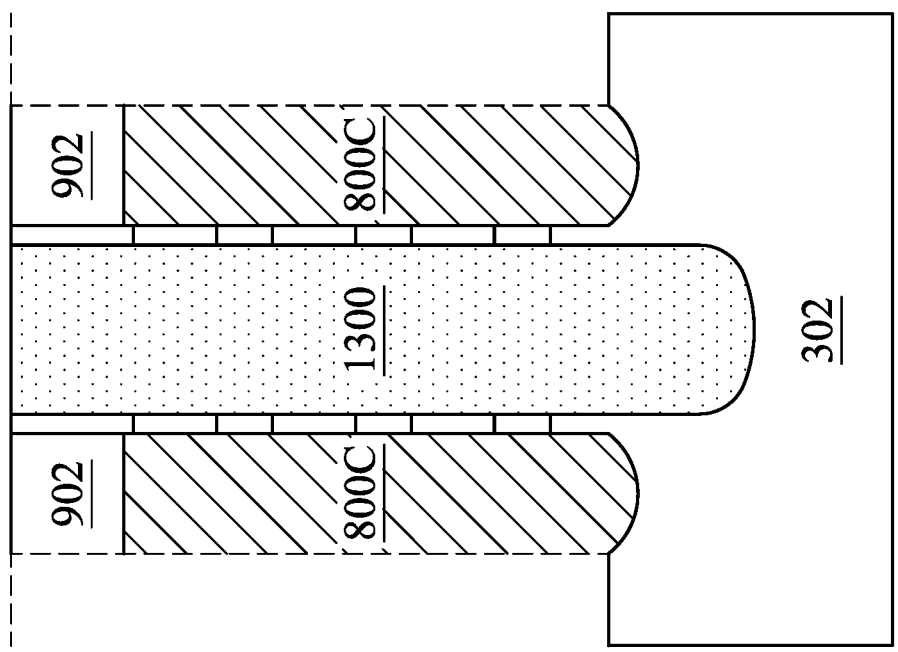

Corresponding to operation 220 of FIG. 2, FIG. 14A is a top view of the GAA FET device 300 including active gate structures 1400 and 1410, at one of the various stages of fabrication. FIGS. 14B, 14C, and 14D are corresponding cross-sectional view of the GAA FET device 300. The cross-sectional view of FIG. 14B is cut in a direction along the lengthwise direction of an active/dummy gate structure of the GAA FET device 300 (e.g., cross-section B-B indicated in FIG. 1); the cross-sectional view of FIG. 14C is cut in a direction along the lengthwise direction of a non-edge fin structure of the GAA FET device 300 (e.g., cross-section A-A indicated in FIG. 1); and the cross-sectional view of FIG. 14D is cut in a direction along the lengthwise direction of an edge fin structure of the GAA FET device 300 (e.g., cross-section A-A indicated in FIG. 1). As representative examples, FIG. 14C is cut along a lengthwise direction of the fin structure 400B; and FIG. 14D is cut along a lengthwise direction of the fin structure 400C.

To form the active gate structures 1400 and 1410, the dummy gate structures 600-610 and the semiconductor layers 402 of the edge and non-edge fin structures can be removed respectively or concurrently, while leaving the semiconductor layers 404 substantially intact. After the removal of the dummy gate structures 600-610, a gate trench, exposing respective sidewalls of each of the semiconductor layers 404 that face the X direction, may be formed. After the removal of the semiconductor layers 402 to further extend the gate trench, respective bottom surface and/or top surface of each of the semiconductor layers 404 may be exposed. Consequently, a full circumference of each of the semiconductor layers 404 can be exposed. Next, the active gate structures 1400 and 1410 are formed to wrap around each of the semiconductor layers 404.

The active gate structure 1400 and 1410 each include a gate dielectric and a gate metal, in some embodiments. The gate dielectric can wrap around each of the semiconductor layers 404 (e.g., the top and bottom surfaces and sidewalls facing the X direction). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the semiconductor layers 404.

The gate metal can wrap around each of the semiconductor layers 404 with the gate dielectric disposed therebetween. Specifically, the gate metal can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 404, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

In one aspect of the present disclosure, a semiconductor device is disclosed. The semiconductor device includes a first fin structure including a first plurality of semiconductor layers vertically spaced from one another. The semiconductor device includes a second fin structure including a second plurality of semiconductor layers vertically spaced from one another, wherein the first and second fin structures both extend along a first lateral direction. The semiconductor device includes a first dielectric structure, wherein the second fin structure is separated from the first fin structure along a second lateral direction perpendicular to the first lateral direction, with a first distance. The semiconductor device includes a first gate structure that extends along the second lateral direction and wraps around each of the first plurality of semiconductor layers and each of the second plurality of semiconductor layers. Ends of each of the first plurality of semiconductor layers are coupled with respective source/drain structures, ends of each of the second plurality of semiconductor layers are coupled with respective source/drain structures, and ends of the first dielectric structure are coupled with respective source/drain structures.

In another aspect of the present disclosure, a semiconductor device is disclosed. The semiconductor device includes a substrate. The semiconductor device includes a first fin structure, a second fin structure, a third fin structure, and a fourth fin structure formed over the substrate. The first through fourth fin structures all extend along a first lateral direction. The first fin structure and second fin structures are spaced from each other along a second lateral direction perpendicular to the first lateral direction with a first distance, and the third fin structure and fourth fin structures are spaced from each other along the second lateral direction with the first distance. The semiconductor device includes a first dielectric structure and a second dielectric structure. The first dielectric structure is separated from the second fin structure along the second lateral direction with the first distance. The second dielectric structure is separated from the third fin structure along the second lateral direction with the first distance. The first and second dielectric structures are separated from each other along the second lateral direction with a second distance that is greater than the first distance. The semiconductor device includes first source/drain structures coupled to the first fin structure. The semiconductor device includes second source/drain structures coupled to the second fin structure. The semiconductor device includes third source/drain structures coupled to the first dielectric structure. The semiconductor device includes fourth source/drain structures coupled to the third fin structure. The semiconductor device includes fifth source/drain structures coupled to the fourth fin structure. The semiconductor device includes sixth source/drain structures coupled to the second dielectric structure.

In yet another aspect of the present disclosure, a method for fabricating a semiconductor device is disclosed. The method includes forming a first fin structure, a second fin structure, a third fin structure, a fourth fin structure, a fifth fin structure, and a sixth fin structure formed over a substrate, wherein the first through sixth fin structures all extend along a first lateral direction, wherein the second fin structure is separated from each of the first and third fin structures along a second lateral direction with a first distance, the fifth fin structure is separated from each of the fourth and sixth fin structures along the second lateral direction with the first distance, and the third fin structure is separated from the fourth fin structure along the second lateral direction with a second distance, and wherein the second distance is greater than the first distance. The method includes forming a first dummy gate structure overlaying a respective portion of each of the first through third fin structures, and forming a second dummy gate structure overlaying a respective portion of each of the fourth through sixth fin structures. The method includes forming a first pair of source/drain structures, a second pair of source/drain structures, a third pair of source/drain structures, a fourth pair of source/drain structures, a fifth pair of source/drain structures, and a sixth pair of source/drain structures that are coupled to the first, second, third, fourth, fifth, and sixth fin structures, respectively. The method includes replacing the third fin structure and a portion of the first dummy gate structure overlaying the third fin structure with a first dielectric structure, and replacing the fourth fin structure and a portion of the second dummy gate structure overlaying the fourth fin structure with a second dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first fin structure including a first plurality of semiconductor layers vertically spaced from one another and disposed over a substrate;
   a second fin structure including a second plurality of semiconductor layers vertically spaced from one another and disposed over the substrate, wherein the first and second fin structures both extend along a first lateral direction;
   a first dielectric trench formed as a single, continuous material, extending into the substrate and along the first lateral direction, and disposed in parallel with the first and second fin structures, wherein the second fin structure is separated from the first fin structure along a second lateral direction perpendicular to the first lateral direction, by a first distance; and a first gate structure that extends along the second lateral direction and wraps around each of the first plurality of semiconductor layers and each of the second plurality of semiconductor layers;

wherein ends of each of the first plurality of semiconductor layers in the first lateral direction are directly connected to respective first source/drain structures, ends of each of the second plurality of semiconductor layers in the first lateral direction are directly connected to respective second source/drain structures, and ends of the first dielectric trench in the first lateral direction are coupled to and aligned with respective third source/drain structures.

2. The semiconductor device of claim 1, wherein a sidewall of the first gate structure is in direct contact with a sidewall of the first dielectric trench.

3. The semiconductor device of claim 1, further comprising:

a second dielectric trench extending into the substrate, wherein the second dielectric trench is separated from the first dielectric trench along the second lateral direction by a second distance that is greater than the first distance;

a third fin structure including a third plurality of semiconductor layers vertically spaced from one another;

a fourth fin structure including a fourth plurality of semiconductor layers vertically spaced from one another, wherein the third fin structure is separated from the fourth fin structure along the second lateral direction by the first distance; and a second gate structure that extends along the second lateral direction and wraps around each of the third plurality of semiconductor layers and each of the fourth plurality of semiconductor layers;

wherein ends of each of the third plurality of semiconductor layers in the first lateral direction are directly connected to respective fourth source/drain structures, ends of each of the fourth plurality of semiconductor layers in the first lateral direction are directly connected to respective fifth source/drain structures, and ends of the second dielectric trench in the first lateral direction are coupled to and aligned with respective sixth source/drain structures.

4. The semiconductor device of claim 3, wherein the second distance is between about 10 nanometers to about 3000 nanometers, and the first distance is between about 5 nanometers to about 300 nanometers.

5. The semiconductor device of claim 3, wherein a sidewall of the second gate structure is in direct contact with a sidewall of the second dielectric trench.

6. The semiconductor device of claim 3, further comprising an interlayer dielectric disposed between the first and second dielectric trenches along the second lateral direction.

7. The semiconductor device of claim 3, wherein the second gate structure is offset from the first gate structure along the first lateral direction.

8. The semiconductor device of claim 3, wherein the first gate structure has a first width along the first lateral direction and the second gate structure has a second width along the first lateral direction, and wherein the first width is different from the second width.

9. The semiconductor device of claim 3, wherein the first gate structure and the second gate structure are continuously formed as a single piece, but disconnected by the first and second dielectric trenches.

10. A semiconductor device, comprising:
a substrate;
a first fin structure, a second fin structure, a third fin structure, and a fourth fin structure formed over the substrate, wherein the first through fourth fin structures all extend along a first lateral direction, wherein the first fin structure and second fin structures are spaced from each other along a second lateral direction perpendicular to the first lateral direction by a first distance, and the third and fourth fin structures are spaced from each other along the second lateral direction by the first distance;

a first dielectric trench formed as a single, continuous material extending into the substrate and a second dielectric trench formed as a single, continuous material extending into the substrate, wherein the first dielectric trench is separated from the second fin structure along the second lateral direction by the first distance, wherein the second dielectric trench is separated from the third fin structure along the second lateral direction by the first distance, wherein the first and second dielectric trenches are separated from each other along the second lateral direction by a second distance that is greater than the first distance, and wherein the first dielectric trench and the second dielectric trench separate the first and second fin structures and the third and fourth fin structures from each other;

first source/drain structures directly connected to ends of the first fin structure in the first lateral direction, respectively;

second source/drain structures directly connected to ends of the second fin structure in the first lateral direction, respectively;

third source/drain structures coupled to and aligned with ends of the first dielectric trench in the first lateral direction, respectively;

fourth source/drain structures directly connected to ends of the third fin structure in the first lateral direction, respectively;

fifth source/drain structures directly connected to ends of the fourth fin structure in the first lateral direction, respectively; and sixth source/drain structures coupled to and aligned with ends of the second dielectric trench in the first lateral direction, respectively.

11. The semiconductor device of claim 10, wherein the first distance is between about 5 nanometers to about 300 nanometers.

12. The semiconductor device of claim 10, wherein the second distance is between about 10 nanometers to about 3000 nanometers.

13. The semiconductor device of claim 10, wherein each of the first through fourth fin structures includes a plurality of semiconductor layers that are vertically spaced from one another.

14. The semiconductor device of claim 10, further comprising:

a first gate structure that extends along the second lateral direction and is disposed over the first and second fin structures, wherein the first gate structure further includes a portion opposite the first dielectric trench from the first and second fin structures; and a second gate structure that extends along the second lateral direction and is disposed over the third and fourth fin structures, wherein the second gate structure further includes a portion opposite the second dielectric trench from the third and fourth fin structures.

15. The semiconductor device of claim 14, wherein the second gate structure is offset from the first gate structure along the first lateral direction.

16. The semiconductor device of claim 14, wherein the first gate structure has a first width along the first lateral direction and the second gate structure has a second width along the first lateral direction, and wherein the first width is different from the second width.

17. The semiconductor device of claim 14, wherein the first gate structure and the second gate structure are continuously formed as a single piece, but disconnected by the first and second dielectric trenches.

18. A semiconductor device, comprising:
a substrate;
a first group comprising a first fin structure, a second fin structure, and a first dielectric trench formed as a single, continuous material over the substrate, wherein the first dielectric trench extends into the substrate;
a second group comprising a third fin structure, a fourth fin structure, and a second dielectric trench formed as a single, continuous material over the substrate, wherein the second dielectric trench extends into the substrate, and the first through fourth fin structures and the first and second dielectric trenches all extend along a first lateral direction;
a first gate structure extending along a second lateral direction perpendicular to the first lateral direction and is disposed over the first and second fin structures;
a second gate structure extending along the second lateral direction and is disposed over the third and fourth fin structures;
first source/drain structures directly connected to ends of the first fin structure in the first lateral direction, respectively;
second source/drain structures directly connected to ends of the second fin structure in the first lateral direction, respectively;
third source/drain structures coupled to and aligned with ends of the first dielectric trench in the first lateral direction, respectively;
fourth source/drain structures directly connected to ends of the third fin structure in the first lateral direction, respectively;
fifth source/drain structures directly connected to ends of the fourth fin structure in the first lateral direction, respectively; and
sixth source/drain structures coupled to and aligned with ends of the second dielectric trench in the first lateral direction, respectively.

19. The semiconductor device of claim 18, wherein the first gate structure further includes a portion opposite the first dielectric trench from the first and second fin structures along the second lateral direction, and the second gate structure further includes a portion opposite the second dielectric trench from the third and fourth fin structures along the second lateral direction.

20. The semiconductor device of claim 18, wherein each of the first through fourth fin structures includes a plurality of semiconductor layers that are vertically spaced from one another.

* * * * *